US010381541B2

(12) United States Patent
Das et al.

(10) Patent No.: US 10,381,541 B2
(45) Date of Patent: Aug. 13, 2019

(54) CRYOGENIC ELECTRONIC PACKAGES AND METHODS FOR FABRICATING CRYOGENIC ELECTRONIC PACKAGES

(71) Applicant: Massachusetts Institute of Technology, Cambridge, MA (US)

(72) Inventors: Rabindra N. Das, Lexington, MA (US); Eric A. Dauler, Acton, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 15/684,337

(22) Filed: Aug. 23, 2017

(65) Prior Publication Data

US 2018/0102469 A1 Apr. 12, 2018

Related U.S. Application Data

(60) Provisional application No. 62/406,510, filed on Oct. 11, 2016.

(51) Int. Cl.
*H01L 39/06* (2006.01)
*H01L 39/24* (2006.01)
(Continued)

(52) U.S. Cl.
CPC ........ *H01L 39/06* (2013.01); *H01L 23/49811* (2013.01); *H01L 23/49827* (2013.01); *H01L 23/49888* (2013.01); *H01L 24/06* (2013.01); *H01L 24/14* (2013.01); *H01L 24/97* (2013.01); *H01L 25/0652* (2013.01);
(Continued)

(58) Field of Classification Search
None
See application file for complete search history.

(56) References Cited

U.S. PATENT DOCUMENTS 4,316,200 A 2/1982 Ames et al.
4,612,083 A 9/1986 Yasumoto et al.
(Continued)

FOREIGN PATENT DOCUMENTS

WO WO 2016/025451 A1 2/2016
WO WO 2016/025478 A1 2/2016
(Continued)

OTHER PUBLICATIONS

Office Action dated Oct. 20, 2017 for U.S. Appl. No. 15/327,249; 30 pages.
(Continued)

*Primary Examiner* — Andres Munoz
(74) *Attorney, Agent, or Firm* — Daly, Crowley, Mofford & Durkee, LLP

(57) ABSTRACT

A cryogenic electronic package includes a first superconducting multi-chip module (SMCM), a superconducting interposer, a second SMCM and a superconducting semiconductor structure. The interposer is disposed over and coupled to the first SMCM, the second SMCM is disposed over and coupled to the interposer, and the superconducting semiconductor structure is disposed over and coupled to the second SMCM. The second SMCM and the superconducting semiconductor structure are electrically coupled to the first SMCM through the interposer. A method of fabricating a cryogenic electronic package is also provided.

19 Claims, 11 Drawing Sheets

(51) Int. Cl.
*H01L 39/22* (2006.01)
*H01L 23/00* (2006.01)
*H01P 7/08* (2006.01)
*H01L 39/02* (2006.01)
*H01L 23/498* (2006.01)
*H01L 25/065* (2006.01)
*H01L 25/00* (2006.01)
*H01L 39/04* (2006.01)
*H01L 39/12* (2006.01)
*H01L 27/18* (2006.01)
*G06N 10/00* (2019.01)
*H01L 23/538* (2006.01)
*H01L 25/16* (2006.01)

(52) U.S. Cl.
CPC ............ *H01L 25/50* (2013.01); *H01L 39/025* (2013.01); *H01L 39/045* (2013.01); *H01L 39/12* (2013.01); *H01L 39/223* (2013.01); *H01L 39/2416* (2013.01); *H01L 39/2493* (2013.01); *H01P 7/086* (2013.01); *G06N 10/00* (2019.01); *H01L 23/5386* (2013.01); *H01L 24/13* (2013.01); *H01L 24/16* (2013.01); *H01L 24/32* (2013.01); *H01L 24/48* (2013.01); *H01L 24/73* (2013.01); *H01L 24/83* (2013.01); *H01L 25/167* (2013.01); *H01L 27/18* (2013.01); *H01L 2224/10* (2013.01); *H01L 2224/13109* (2013.01); *H01L 2224/16145* (2013.01); *H01L 2224/32225* (2013.01); *H01L 2224/48091* (2013.01); *H01L 2224/48106* (2013.01); *H01L 2224/48225* (2013.01); *H01L 2224/73207* (2013.01); *H01L 2224/73265* (2013.01); *H01L 2225/0651* (2013.01); *H01L 2225/06513* (2013.01); *H01L 2225/06548* (2013.01); *H01L 2225/06589* (2013.01); *H01L 2924/13055* (2013.01)

(56) References Cited

U.S. PATENT DOCUMENTS

| | | | |
|---|---|---|---|
| 5,057,877 A | 10/1991 | Briley et al. | |
| 5,156,997 A | 10/1992 | Kumar et al. | |
| 5,179,070 A | 1/1993 | Harada et al. | |
| 5,371,328 A | 12/1994 | Gutierrez et al. | |
| 5,650,353 A | 7/1997 | Yoshizawa et al. | |
| 5,773,875 A | 6/1998 | Chan | |
| 6,108,214 A | 8/2000 | Fuse | |
| 6,297,551 B1 | 10/2001 | Dudderar et al. | |
| 6,324,755 B1 | 12/2001 | Borkowski et al. | |
| 6,346,469 B1 | 2/2002 | Greer | |
| 6,355,501 B1 | 3/2002 | Fung et al. | |
| 6,396,371 B2 | 5/2002 | Streeter et al. | |
| 6,436,740 B1 | 8/2002 | Jen et al. | |
| 6,485,565 B1 | 11/2002 | Springer | |
| 6,678,167 B1 | 1/2004 | Degani et al. | |
| 6,819,000 B2 | 11/2004 | Magerlein et al. | |
| 6,825,534 B2 | 11/2004 | Chen et al. | |
| 6,838,774 B2 | 1/2005 | Patti | |
| 7,427,803 B2 | 9/2008 | Chao et al. | |
| 7,589,390 B2 | 9/2009 | Yao | |
| 7,624,088 B2 | 11/2009 | Johnson et al. | |
| 7,932,515 B2 | 4/2011 | Bunyk | |
| 7,939,926 B2 | 5/2011 | Kaskoun et al. | |
| 7,993,971 B2 | 8/2011 | Chatterjee et al. | |
| 8,097,490 B1* | 1/2012 | Pagaila ................ H01L 21/561 438/106 |
| 8,159,825 B1* | 4/2012 | Dotsenko ................ H03K 5/13 361/760 |
| 8,202,785 B2 | 6/2012 | Castex et al. | |
| 8,354,746 B2 | 1/2013 | Huang et al. | |
| 8,466,036 B2 | 6/2013 | Brindle et al. | |
| 8,487,444 B2 | 7/2013 | Law et al. | |
| 8,492,911 B2 | 7/2013 | Bachman et al. | |
| 8,519,543 B1 | 8/2013 | Song et al. | |
| 8,546,188 B2 | 10/2013 | Liu et al. | |
| 8,564,955 B2 | 10/2013 | Schmidt et al. | |
| 8,736,068 B2 | 5/2014 | Bartley et al. | |
| 8,754,321 B2 | 6/2014 | Schroeder et al. | |
| 8,828,860 B2 | 9/2014 | Gruber et al. | |
| 8,912,048 B2* | 12/2014 | Kim ..................... H01L 21/78 438/113 |
| 8,928,128 B2 | 1/2015 | Karikalan et al. | |
| 8,954,125 B2 | 2/2015 | Gonzalez et al. | |
| 9,076,658 B1 | 7/2015 | Brown et al. | |
| 9,171,792 B2 | 10/2015 | Sun et al. | |
| 9,666,559 B2* | 5/2017 | Wang ................... H01L 25/0655 |
| 9,836,699 B1* | 12/2017 | Rigetti ................... H01L 39/223 |
| 2001/0016383 A1 | 8/2001 | Chen et al. | |
| 2002/0094661 A1 | 7/2002 | Enquist et al. | |
| 2003/0067073 A1 | 4/2003 | Akram et al. | |
| 2004/0124538 A1 | 7/2004 | Reif et al. | |
| 2004/0188845 A1 | 9/2004 | Iguchi et al. | |
| 2004/0223380 A1* | 11/2004 | Hato ..................... H01L 27/18 365/200 |
| 2006/0191640 A1 | 8/2006 | Johnson | |
| 2007/0087544 A1 | 4/2007 | Chang et al. | |
| 2007/0119812 A1 | 5/2007 | Kerdiles et al. | |
| 2007/0207592 A1 | 9/2007 | Lu et al. | |
| 2008/0093747 A1 | 4/2008 | Enquist et al. | |
| 2008/0122115 A1 | 5/2008 | Popa et al. | |
| 2008/0169559 A1 | 7/2008 | Yang | |
| 2008/0230916 A1 | 9/2008 | Saito et al. | |
| 2008/0290790 A1 | 11/2008 | Jin | |
| 2008/0316714 A1 | 12/2008 | Eichelberger et al. | |
| 2009/0078966 A1 | 3/2009 | Asai et al. | |
| 2009/0173936 A1 | 7/2009 | Bunyk | |
| 2009/0186446 A1 | 7/2009 | Kwon et al. | |
| 2009/0233436 A1 | 9/2009 | Kim et al. | |
| 2009/0267238 A1* | 10/2009 | Joseph ............... H01L 23/49833 257/777 |
| 2010/0001399 A1 | 1/2010 | Topacio | |
| 2010/0026447 A1 | 2/2010 | Keefe et al. | |
| 2010/0122762 A1 | 5/2010 | George | |
| 2010/0130016 A1 | 5/2010 | DeVilliers | |
| 2010/0148371 A1 | 6/2010 | Kaskoun et al. | |
| 2010/0171093 A1 | 7/2010 | Kabir | |
| 2011/0049675 A1 | 3/2011 | Nagai et al. | |
| 2011/0089561 A1* | 4/2011 | Kurita ................. H01L 21/561 257/737 |
| 2011/0140271 A1 | 6/2011 | Daubenspeck et al. | |
| 2011/0189820 A1 | 8/2011 | Sasaki et al. | |
| 2011/0204505 A1 | 8/2011 | Pagaila et al. | |
| 2011/0237069 A1 | 9/2011 | Miyazaki | |
| 2011/0248396 A1 | 10/2011 | Liu et al. | |
| 2012/0032340 A1 | 2/2012 | Choi et al. | |
| 2012/0074585 A1* | 3/2012 | Koo ..................... H01L 21/486 257/774 |
| 2012/0217642 A1 | 8/2012 | Sun et al. | |
| 2012/0228011 A1 | 9/2012 | Chang et al. | |
| 2012/0231621 A1 | 9/2012 | Chang et al. | |
| 2012/0252189 A1 | 10/2012 | Sadaka et al. | |
| 2012/0292602 A1 | 11/2012 | Guo et al. | |
| 2013/0029848 A1 | 1/2013 | Gonzalez et al. | |
| 2013/0093104 A1 | 4/2013 | Wu et al. | |
| 2013/0099235 A1 | 4/2013 | Han | |
| 2013/0147036 A1 | 6/2013 | Choi et al. | |
| 2013/0153888 A1 | 6/2013 | Inoue et al. | |
| 2013/0187265 A1 | 7/2013 | Shih et al. | |
| 2013/0244417 A1 | 9/2013 | Markunas et al. | |
| 2014/0001604 A1 | 1/2014 | Sadaka | |
| 2014/0065771 A1 | 3/2014 | Gruber et al. | |
| 2014/0113828 A1 | 4/2014 | Gilbert et al. | |
| 2014/0246763 A1* | 9/2014 | Bunyk ................... H01L 27/18 257/663 |
| 2014/0264890 A1 | 9/2014 | Breuer et al. | |
| 2015/0041977 A1 | 2/2015 | Daubenspeck et al. | |
| 2015/0054151 A1 | 2/2015 | Choi et al. | |
| 2015/0054167 A1 | 2/2015 | Pendse | |
| 2015/0054175 A1 | 2/2015 | Meinhold et al. | |
| 2015/0348874 A1 | 12/2015 | Tsai et al. | |

(56) References Cited

U.S. PATENT DOCUMENTS

| | | | |
|---|---|---|---|
| 2016/0364653 A1 | 12/2016 | Chow et al. | |
| 2017/0040296 A1* | 2/2017 | Das | H01L 23/481 |
| 2017/0092621 A1* | 3/2017 | Das | H01L 23/481 |
| 2017/0098627 A1 | 4/2017 | Das et al. | |
| 2017/0125383 A1* | 5/2017 | Liu | H03K 17/145 |
| 2017/0133336 A1 | 5/2017 | Oliver et al. | |
| 2017/0162507 A1 | 6/2017 | Das et al. | |
| 2017/0162550 A1* | 6/2017 | Das | H01L 23/481 |
| 2017/0194248 A1 | 7/2017 | Das | |
| 2017/0200700 A1 | 7/2017 | Das et al. | |

FOREIGN PATENT DOCUMENTS

| | | |
|---|---|---|
| WO | WO 2016/073049 A1 | 5/2016 |
| WO | WO 2017/015432 A1 | 1/2017 |
| WO | WO 2017/079394 A1 | 5/2017 |
| WO | WO 2017/079417 A1 | 5/2017 |
| WO | WO 2017/079424 A1 | 5/2017 |
| WO | WO 2017/131831 A2 | 8/2017 |

OTHER PUBLICATIONS

Final Office Action dated Dec. 6, 2017 for U.S. Appl. No. 15/342,444; 18 pages.
Final Office Action dated Dec. 20, 2017 for U.S. Appl. No. 15/271,755; 25 pages.
Restriction Requirement dated Oct. 23, 2017 for U.S. Appl. No. 15/342,517; 6 pages.
Response to Non-Final Office Action dated Apr. 23, 2018 for U.S. Appl. No. 15/342,478, filed Aug. 23, 2018; 18 Pages.
U.S. Appl. No. 15/342,478, filed Nov. 3, 2016, Oliver, et al.
U.S. Appl. No. 15/342,517, filed Nov. 3, 2016, Oliver, et al.
U.S. Appl. No. 15/342,589, filed Nov. 3, 2016, Oliver, et al.
Burns, et al.; "3D Circuit Integration Technology for Multiproject Fabrication;" MIT Lincoln Laboratory Presentation; Apr. 7, 2000; 15 pages.
Courtland; "Google Aims for Quantum Computing Supremacy;" Spectrum.IEEE.Org; North America; Jun. 2017; 2 pages.
Ohya, et al.; "Room Temperature Deposition of Sputtered TiN Films for Superconducting Coplanar Waveguide Resonators;" IOP Publishing—Superconductor Science and Technology; vol. 27; Mar. 26, 2014; 10 pages.
Tarniowy, et al.; "The Effect of Thermal Treatment on the Structure, Optical and Electrical Properties of Amorphous Titanium Nitride Thin Films;" Thin Solid Films 311; 1997; 8 pages.
Notice of Allowance for U.S. Appl. No. 15/327,235 dated Jun. 30, 2017; 17 pages.
Restriction Requirement dated May 16, 2017 for U.S. Appl. No. 15/327,249; 6 pages.
Response to Restriction Requirement dated May 16, 2017 for U.S. Appl. No. 15/327,249, filed Jun. 27, 2017; 1 page.
Restriction Requirement dated Jun. 8, 2017 for U.S. Appl. No. 15/271,755; 1 page.
Response to Restriction Requirement dated Jun. 8, 2017 for U.S. Appl. No. 15/271,755, filed Jun. 19, 2017; 1 page.
Office Action dated Jul. 7, 2017 for U.S. Appl. No. 15/271,755; 26 pages.
Office Action dated Mar. 3, 2017 for U.S. Appl. No. 14/694,540; 16 pages.
Response to Office Action dated Mar. 3, 2017 for U.S. Appl. No. 14/694,540, filed Jun. 1, 2017; 24 pages.
Notice of Allowance for U.S. Appl. No. 14/694,540 dated Jul. 31, 2017; 9 pages.
Office Action dated Mar. 24, 2017 for U.S. Appl. No. 15/303,800; 39 pages.
Response to Office Action dated Mar. 24, 2017 for U.S. Appl. No. 15/303,800, filed Jun. 26, 2017; 22 pages.
Notice of Allowance for U.S. Appl. No. 15/312,063 dated Aug. 2, 2017; 17 pages.
Restriction Requirement dated Apr. 28, 2017 for U.S. Appl. No. 15/342,444; 9 pages.
Response to Restriction Requirement and Preliminary Amendment dated Apr. 28, 2017 for U.S. Appl. No. 15/342,444, filed May 19, 2017; 6 pages.
Office Action dated Jan. 11, 2018 for U.S. Appl. No. 15/327,239; 33 pages.
PCT International Preliminary Report on Patentability dated Feb. 1, 2018 for PCT Appl. No. PCT/US2016/043266; 11 pages.
Response to Final Office Action dated Dec. 6, 2017 for U.S. Appl. No. 15/342,444; Response filed Mar. 2, 2018; 16 pages.
Response to Restriction Requirement dated Oct. 23, 2017 for U.S. Appl. No. 15/342,517, filed Dec. 22, 2017; 1 pages.
Restriction Requirement dated Jan. 3, 2018 for U.S. Appl. No. 15/342,478; 6 pages.
Response to Restriction Requirement dated Jan. 3, 2018 for U.S. Appl. No. 15/342,478, filed Mar. 2, 2018; 6 pages.
Advisory Action dated Mar. 20, 2018 for U.S. Appl. No. 15/342,444; 3 pages.
U.S. Non-Final Office Action dated Mar. 21, 2018 for U.S. Appl. No. 15/342,589; 25 pages.
Final Office Action dated Oct. 23, 2018 for U.S. Appl. No. 15/342,478; 21 pages.
Non-Final Office Action dated Nov. 8, 2018 for U.S. Appl. No. 16/327,239; 26 pages.
Notice of Allowance dated Oct. 3, 2018 for U.S. Appl. No. 15/342,517; 13 pages.
Notice of Allowance dated Nov. 8, 2018 for U.S. Appl. No. 15/684,393; 8 pages.
Response to Office Action dated Aug. 9, 2018 for U.S. Appl. No. 15/271,755, filed Sep. 28, 2018; 16 pages.
Notice of Allowance dated Jul. 9, 2018 for U.S. Appl. No. 15/327,249; 15 Pages.
Notice of Allowance dated Jul. 18, 2018 for U.S. Appl. No. 15/342,444; 11 Pages.
Office Action dated Aug. 9, 2018 for U.S. Appl. No. 15/271,755; 29 Pages.
Response to Office Action dated Apr. 19, 2018 for U.S. Appl. No. 15/342,517, filed Jul. 17, 2018; 14 Pages.
U.S. Non-Final Office Action dated Apr. 23, 2018 for U.S. Appl. No. 15/342,478; 11 Pages.
U.S. Non-Final Office Action dated Apr. 19, 2018 for U.S. Appl. No. 15/342,517; 8 Pages.
Response to U.S. Non-Final Office Action dated Jan. 11, 2018 for U.S. Appl. No. 15/327,239; Response filed Apr. 9, 2018; 25 Pages.
Response to U.S. Non-Final Office Action dated Oct. 20, 2017 for U.S. Appl. No. 15/327,249; Response filed Apr. 19, 2018; 19 Pages.
Response to U.S. Final Office Action dated Dec. 20, 2017 for U.S. Appl. No. 15/271,755; Response filed Apr. 23, 2018; 23 Pages.
U.S. Final Office Action dated May 9, 2018 for U.S. Appl. No. 15/327,239; 25 Pages.
Response to U.S. Final Office Action dated Dec. 6, 2017 for U.S. Appl. No. 15/342,444; Response filed May 4, 2018; 18 Pages.
U.S. Non-Final Office Action dated May 11, 2018 for U.S. Appl. No. 15/684,393; 15 Pages.
PCT International Preliminary Report dated May 17, 2018 for International Application No. PCT/US2016/060296; 7 Pages.
PCT International Preliminary Report dated May 17, 2018 for International Application No. PCT/US2016/060343; 9 Pages.
PCT International Preliminary Report dated May 17, 2018 for International Application No. PCT/US2016/060263; 8 Pages.
PCT International Preliminary Report dated May 17, 2018 for International Application No. PCT/US2016/060309; 8 Pages.
Office Action dated Jan. 8, 2019 for U.S. Appl. No. 15/684,269; 23 pages.
Amendment filed on Apr. 8, 2019 for U.S. Appl. No. 15/684,269; 17 pages.
Response to Office Action filed on Jan. 23, 2019 for U.S. Appl. No. 15/342,478; 9 pages.
Notice of Allowance dated May 10, 2019 for U.S. Appl. No. 15/342,478; 13 pages.
Appeal Brief filed on Mar. 28, 2019 for U.S. Appl. No. 15/327,239; 41 pages.

(56) References Cited

OTHER PUBLICATIONS

Notice of Allowance dated Oct. 12, 2017 for U.S. Appl. No. 15/303,800; 16 pages.
Restriction Requirement for U.S. Appl. No. 15/271,755 dated Jun. 8, 2017; 6 pages.
Response to Jul. 7, 2017 Office Action for U.S. Appl. No. 15/271,755, filed Oct. 10, 2017; 33 pages.
Office Action dated Aug. 11, 2017 for U.S. Appl. No. 15/342,444; 22 pages.
Response to Aug. 11, 2017 Office Action for U.S. Appl. No. 15/342,444, filed Sep. 15, 2017; 20 pages.

* cited by examiner

CRYOGENIC ELECTRONIC PACKAGES AND METHODS FOR FABRICATING CRYOGENIC ELECTRONIC PACKAGES

CROSS REFERENCE TO RELATED APPLICATIONS

This application claims the benefit of and priority to U.S. Provisional Application No. 62/406,510 filed on Oct. 11, 2016 under 35 U.S.C. § 119(e) which application is hereby incorporated herein by reference in its entirety.

GOVERNMENT RIGHTS

This invention was made with Government support under Contract No. FA8721-05-C-0002 awarded by the U.S. Air Force. The Government has certain rights in the invention.

FIELD

This disclosure relates generally to electronic packages, and more particularly, to cryogenic electronic packages and methods for fabricating cryogenic electronic packages.

BACKGROUND

As is known, there is trend toward miniaturization of electronic products such as mobile phones, tablets, digital cameras, and the like. There is also a demand for development of electronic products which have an increased number of functionalities and have increased electronic capabilities (e.g., increased speed, memory, and operational life). These trends have resulted in a demand for integrated circuits which enable these and other increased capabilities (e.g., increased density, computing power and extended operational life). As is known, integrated circuits may be fabricated using a variety of technologies, including complementary metal-oxide-semiconductor (CMOS) technology.

As CMOS technology reaches the end of Moore's Law scaling and power consumption of integrated circuits fabricated using such technology continues to increase, there is a need to develop "beyond-CMOS" device technologies (e.g., to achieve high-performance exascale computing). As is known, CMOS technology may be used in fabricating processors, for example, and processors are often constructed on a chip using integrated circuit techniques. As is also known, CMOS processors are typically used logic elements in current high performance computing applications. As is additionally known, a significant amount of the power consumption of the CMOS processors is due to moving information between logic elements (e.g., CMOS processors) rather than actual logic operations performed by the processors.

As is known, superconducting technology and superconducting semiconductor structures (e.g., integrated circuits) fabricated using such technology are a leading candidate technology for high performance computing applications (e.g., due to the energy efficiency of superconducting technology). Although many studies have been conducted on superconducting semiconductor structures and their use in high performance computing applications, a major technical challenge is integrating the superconducting semiconductor structures and other components of high performance computing circuits into a cryogenic chamber. This is typically due to the large number of individual chips and associated hardware often required to build high performance computing circuits, and limited cryogenic space of the cryogenic chamber used to cool or refrigerate the circuits.

SUMMARY

Described herein are concepts, systems, circuits and techniques related to cryogenic electronic packages and methods for fabricating cryogenic electronic packages. The described cryogenic electronic packages and methods allow for fabrication of cryogenic electronic packages including two or more superconducting multi-chip modules (SMCMs) and one or more superconducting semiconductor structures. Additionally, the described cryogenic electronic packages and methods allow for a maximum number of superconducting semiconductor structures to fit in a given space (e.g., a cryogenic space in a cryogenic chamber). The foregoing provides for the ability to design circuitry (e.g., high performance computing circuitry) to fit in a given cryogenic space (e.g., a conventional cryogenic space), rather than adjusting or designing the space (e.g., cryogenic space) to fit the circuitry.

In one aspect of the concepts described herein, a cryogenic electronic package according to the disclosure includes a first superconducting multi-chip module (SMCM) having first and second opposing surfaces. The cryogenic electronic package also includes a first superconducting interposer having first and second opposing surfaces. The first surface of the first interposer is disposed over and coupled to the second surface of the first SMCM.

The cryogenic electronic package additionally includes a second SMCM having first and second opposing surfaces. The first surface of the second SMCM is disposed over and coupled to the second surface of the first interposer. The cryogenic electronic package further includes a first superconducting semiconductor structure (e.g., a superconducting integrated circuit (IC)) having first and second opposing surfaces. The first surface of the first superconducting semiconductor structure is disposed over and coupled to the second surface of the second SMCM. Additionally, the second SMCM and the first superconducting semiconductor structure are electrically coupled to the first SMCM through the first interposer.

The cryogenic electronic package may also include one or more of the following features individually or in combination with other features. One or more first interconnect structures may be disposed between the second surface of the first SMCM and the first surface of the first interposer. The first interconnect structures may be coupled to form one or more electrical connections between the first interposer and the first SMCM. One or more second interconnect structures may be disposed between the second surface of the second SMCM and the first surface of the first superconducting semiconductor structure. The second interconnect structures may be coupled to form one or more electrical connections between the first superconducting semiconductor structure and the second SMCM. The first interconnect structures may have first dimensions and a first pad pitch, and the second interconnect structures have second dimensions and a second pad pitch. The second dimensions of the second interconnect structures may be substantially less than the first dimensions of the first interconnect structures. Additionally, the second pad pitch of the second interconnect structures may be substantially less than the first pad pitch of the first interconnect structures.

Each of the first and second interconnect structures may include a plurality of interconnect sections. At least one of the interconnect sections may include a superconducting and/or a partially superconducting material (e.g., Niobium (Nb)). The plurality of interconnect sections may include three interconnect sections. At least two of the interconnect sections may include a plurality of conductive layers. Each of the conductive layers may include a respective metal or alloy material or combination of materials that is different from other ones of the conductive layers. Each of the conductive layers may have a respective melting point that is different from other ones of the conductive layers.

The first SMCM may include one or more interconnect pads disposed or otherwise provided on at least the second surface of the first SMCM. The first interposer may include one or more interconnect pads disposed or otherwise provided on at least the first surface of the first interposer. The first interconnect structures may be electrically coupled to respective ones of the interconnect pads of the first SMCM and the first interposer. At least one of the interconnect pads of the first SMCM and the first interposer may include a superconducting and/or a partially superconducting material.

The first interposer may include one or more through via structures (e.g., through silicon via (TSV) structures). Each of the through via structures may include a first pad interconnect, a second pad interconnect and a through via. The first and second pad interconnects may extend from selected portions of the first surface of the first interposer to selected portions of the second surface of the first interposer. The through via (e.g., an etched via) may be disposed or otherwise provided in a cavity or opening formed between the first and second pad interconnects. The through via structures may be electrically coupled to respective ones of the interconnect pads of the first interposer. The through via structures may include conventional (non-superconducting) and/or superconducting and/or partially superconducting metals.

The second SMCM may include one or more interconnect pads disposed on at least the second surface of the second SMCM. The first superconducting semiconductor structure may include one or more interconnect pads disposed on at least the first surface of the first superconducting semiconductor structure. The second interconnect structures may be electrically coupled to respective ones of the interconnect pads of the second SMCM and the first superconducting semiconductor structure. At least one of the interconnect pads of the second SMCM and the first superconducting semiconductor structure may include a superconducting and/or a partially superconducting material.

A first adhesive layer (e.g., a rework layer) may be disposed between the second surface of the first interposer and the first surface of the second SMCM. The first adhesive layer may be coupled to form one or more electrical connections between the second SMCM and the first interposer. The cryogenic electronic package may include one or more wire and/or ribbon and/or spring bonding structures. At least one of the bonding structures may have a first portion electrically coupled to the second surface of the first interposer, and a second opposing portion electrically coupled to the second surface of the second SMCM. The bonding structures may form one or more electrical connections between the second SMCM and the first interposer.

The cryogenic electronic package may include a second superconducting interposer having first and second opposing surfaces. The first surface of the second interposer may be disposed over and coupled to the second surface of the first SMCM. The cryogenic electronic package may include a third SMCM having first and second opposing surfaces. The first surface of the third SMCM may be disposed over and coupled to the second surface of the second interposer. The cryogenic electronic package may include a second superconducting semiconductor structure having first and second opposing surfaces. The first surface of the second superconducting semiconductor structure may be disposed over and coupled to the second surface of the third SMCM. The third SMCM and the second superconducting semiconductor may be electrically coupled to the first SMCM through the second interposer. The cryogenic electronic package may create a maximum (or an increased) possible superconducting path between the first and second superconducting semiconductor structures when the first and second superconducting semiconductor structures are electrically coupled with each other through the second SMCM, the first interposer, the first SMCM, the second interposer and the third SMCM.

The cryogenic electronic package may include a third SMCM having first and second opposing surfaces. The first surface of the third SMCM may be disposed over and coupled to the second surface of the first interposer. The cryogenic electronic package may include a second superconducting semiconductor structure having first and second opposing surfaces. The first surface of the second superconducting semiconductor structure may be disposed over and coupled to the second surface of the third SMCM. The third SMCM and the second superconducting semiconductor may be electrically coupled to the first SMCM through the first interposer. The cryogenic electronic package may create a maximum (or an increased) possible superconducting path between the first and second superconducting semiconductor structures when the first and second superconducting semiconductor structures are electrically coupled with each other through the second SMCM, the first interposer, the third SMCM and/or the second SMCM, the first interposer, the first SMCM, the first interposer and the third SMCM.

The cryogenic electronic package may include a via joining layer (e.g., an oxide bonding layer) disposed between the second surface of the first SMCM and the first surface of the first interposer. The via joining layer may have first and second opposing surfaces and include a plurality of conductive structures extending between selected portions of the first and second surfaces. The conductive structures (e.g., vias) may be coupled to form one or more electrical connections between the first SMCM and the first interposer. The conductive structures may include one or more thermally conductive vias. The second SMCM may further include a complementary metal-oxide-semiconductor (CMOS) and/or optical and/or photonics chip or IC.

The cryogenic electronic package may include a substrate (e.g., a conventional non-superconducting circuitized substrate, or a superconducting substrate) having first and second opposing surfaces. The cryogenic electronic package may include an adhesive material or layer (e.g., an electrically conducting or insulating adhesive layer or material) disposed between the second surface of the substrate and the first surface of the first SMCM. The adhesive layer (e.g., a rework layer) may be coupled to form one or more electrical connections between the substrate and the first SMCM. A superconducting substrate and one or more superconducting chips may be bonded to form a SMCM (e.g., the first SMCM and/or the second SMCM).

In another aspect of the concepts described herein, a method of fabricating a cryogenic electronic package includes fabricating a first portion of the cryogenic electronic package through a first process. The first process includes providing a first superconducting multi-chip module (SMCM) having first and second opposing surfaces. The first process also includes providing a superconducting interposer having first and second opposing surfaces. The first process additionally includes coupling the first surface of the interposer to the second surface of the first SMCM.

The method of fabricating a cryogenic electronic package also includes fabricating a second portion of the cryogenic electronic package through a second process. The second process includes providing a second SMCM having first and second opposing surfaces. The second process also includes providing a superconducting semiconductor structure (e.g., a superconducting IC) having first and second opposing surfaces. The second process additionally includes coupling the first surface of the superconducting semiconductor structure to the second surface of the second SMCM. The method of fabricating a cryogenic electronic package additionally includes coupling the second portion of the cryogenic electronic package to the first portion of the cryogenic electronic package.

The method of fabricating a cryogenic electronic package may also include one or more of the following features individually or in combination with other features. Coupling the second portion of the cryogenic electronic package to the first portion of the cryogenic electronic package may include disposing an adhesive layer (e.g., a rework layer) between the first surface of the second SMCM and the second surface of the interposer. Coupling the second portion of the cryogenic electronic package to the first portion of the cryogenic electronic package may also include coupling the first surface of the second SMCM to the second surface of the interposer using the adhesive layer. The first and second processes used to fabricate the first and second portions of the cryogenic electronic package may be performed substantially simultaneously (i.e., in parallel).

The method of fabricating a cryogenic electronic package may include fabricating a third portion of the cryogenic electronic package through a third process. The third process may include providing a substrate (e.g., a conventional non-superconducting circuitized substrate) having first and second opposing surfaces. The third process may also include coupling the third portion of the cryogenic electronic package to the first portion of the cryogenic electronic package.

Coupling the third portion of the cryogenic electronic package to the first portion of the cryogenic electronic package may include disposing an adhesive layer between the first surface of the first SMCM and the second surface of the substrate. Coupling the third portion of the cryogenic electronic package to the first portion of the cryogenic electronic package may also include coupling the first surface of the first SMCM to the second surface of the substrate using the adhesive layer. The first, second and third processes used to fabricate the first, second and third portions of the cryogenic electronic package may be performed substantially simultaneously (i.e., in parallel).

In one aspect of the disclosure, the above and below described interconnect structures (e.g., first and/or second interconnect structures) used in cryogenic electronic packages according to the disclosure may provide for an increased number of superconducting semiconductor structures in the cryogenic electronic packages compared, for example, to conventional interconnect structures. For example, interconnect structures according to the disclosure may have a finer pitch than conventional interconnect structures, and provide for an increased possible wiring density compared to conventional interconnect structures. As one example, conventional interconnect structures may have a pitch of between about 150 micron and about 250 micron (e.g., for coupling organic and/or ceramic substrates), while interconnect structures according to the disclosure may have a pitch of between about 12 micron and about 15 micron (or a larger pitch). As another example, interconnect structures according to the disclosure may have a pitch of between about 25 micron and about 50 micron (and a variety of other pitches which are less than those of the conventional interconnect structures).

In embodiments, the interconnect structures include one or more microbumps (e.g., scalable microbumps). The microbumps may include Indium, Niobium and/or another superconducting or partially superconducting material, which material(s) may be the same as or similar to the material(s) of one or more portions of the semiconductor structure(s) to which the microbumps are to be coupled. Indium based bumps or microbumps may, for example, be used due to their cryogenic stability and ductility, high electrical (Tc=about 3.4 Kelvin (K)) and thermal conductivity, and their ability to transmit SFQ pulses at high frequencies.

The indium bumps may be deposited, evaporated or otherwise formed on respective interconnect pads (and/or under bump metal (UBM) pads) of a semiconductor structure (e.g., a first SMCM) in a cryogenic electronic package to which the indium bumps are to be coupled, for example, using a negative resist lithography process. Additionally, the indium bumps may be coupled to one or more other semiconductor structures (e.g., a first interposer), and be used to couple two or more semiconductor structures together, through one or more bonding processes (e.g., thermocompression bonding processes). In embodiments, the indium bumps may provide: (1) adhesion between the semiconductor structures (e.g., between a first SMCM and a first interposer), (2) a relatively low-resistance electrical interconnect between the semiconductor structures, and (3) minimum or reduced spacing between the semiconductor structures for low or reduced parasitic resistance.

An example advantage of the microbumps (indium or otherwise) is an ability to bond or otherwise couple two or more semiconductor structures (e.g., multi-layer semiconductor structures) having different dimensions onto a surface (e.g., a same surface) of another semiconductor structure (e.g., a relatively large superconducting substrate). In embodiments, the semiconductor structures can be coupled individually (i.e., one at a time) or substantially in parallel (i.e., more than one at a time).

As an example case study, a cryogenic electronic package including a plurality of superconducting semiconductor structures (e.g., about 10-50 superconducting chips) and an SMCM (e.g., an SMCM having surface dimensions of about 30 mm×30 mm) was fabricated. The superconducting semiconductor structures were coupled to the SMCM through interconnect structures taking the form of microbumps. The microbumps were fabricated using about 15 micron microbump technology. The structural and electrical integrity of the interconnect structures were evaluated after coupling the superconducting semiconductor structures to the SMCM. It was found that the superconducting semiconductor structures and the SMCM were operating as expected and maintained typical Josephson junction characteristics at temperatures of or below about 4.2K.

With the above and below described arrangements, there is potential for testing each semiconductor structure (e.g., SMCM, interposer, superconducting semiconductor structure) of cryogenic electronic packages in superconducting systems according to the disclosure before and after assembly (e.g., final assembly) of the cryogenic electronic packages. In embodiments, only known good semiconductor structures (e.g., as determined through testing of the semiconductor structures) are used in the final assembly of the cryogenic electronic packages. Additionally, in embodiments it is possible to replace individual semiconductor structures of the cryogenic electronic packages after final assembly (e.g., upon component failure). The foregoing is particularly well suited in high-end cryogenic electronic package products and devices where components, dies, and packaging are expensive and repair or rework is economically viable, for example, modules for Quantum and classical computers. Package-in-package (PiP) techniques may, for example, be suitable for fabricating the high-end cryogenic electronic package products and device since a damaged, non-functional part of cryogenic electronic packages of the devices can be selectively removed, replaced and/or upgraded without compromising overall electrical performance of the cryogenic electronic package.

In embodiments, cryogenic electronic packages according to the disclosure may have a smaller or reduced pitch compared to conventional cryogenic electronic packages. In one embodiment, the smaller or reduced pitch of the cryogenic electronic packages may be due to the interconnect structures used in the cryogenic electronic packages according to the disclosure having smaller or reduced dimensions, and smaller or reduced pitches, compared to the interconnect structures used in conventional cryogenic electronic packages. As discussed above, the interconnect structures are used to couple semiconductor structures (e.g., SMCMs and/or superconducting semiconductor structures) of the cryogenic electronic packages. In embodiments, the interconnect structures used in cryogenic electronic packages according to the disclosure are scalable. For example, first selected ones of the interconnect structures may have a first package pitch (e.g., an about 35 micron pitch) and second selected ones of the interconnect structures may have a second package pitch (e.g., an about 15 micron pitch) that is substantially less than the first package pitch.

Additionally, semiconductor structures of cryogenic electronic packages according to the disclosure can have embedded resistors and capacitors, for example, to substantially reduce or eliminate the need for surface mounted capacitors and resistors in the cryogenic electronic packages. The foregoing may enable further miniaturization of circuits, systems and assemblies including cryogenic electronic packages according to the disclosure.

In one aspect of the disclosure, cryogenic electronic packages according to the disclosure may require a reduced amount of cryogenic cooling than cryogenic systems including conventional cryogenic electronic packages (e.g., due to cryogenic electronic packages according to the disclosure occupying less space than conventional cryogenic electronic packages). For example, in embodiments in which cryogenic systems including cryogenic electronic packages according to the disclosure operate in cryogenic refrigerants (e.g., liquid Helium) and use liquid cooling, the cryogenic systems may not need separate thermal management systems, as may be required for cryogenic systems including conventional cryogenic electronic packages. In one aspect of the disclosure, such illustrates that cryogenic electronic packages and interconnect structures according to disclosure are suitable (and desirable) for use in high performance computing circuits and other superconducting circuits and systems.

Additionally, in one aspect of the disclosure, cryogenic electronic packages according to the disclosure provide scalable cryogenic three-dimensional (3D) integration approaches for developing superconducting computing architectures. As is known, computing circuits typically include processors, universal serial bus (USB) controllers, power management circuits, radio frequency (RF) devices, etc. As is also known, it is typically very difficult to make a computer that fits within a cryogenic chamber because of the large number of individual chips and associated hardware required to build high performance computing circuits. Our 3D integration approaches give the ability to design computing circuitry to fit a cryogenic space (e.g., a cryogenic space in a cryogenic chamber), rather than adjusting the cryogenic space to fit the computing circuits. In particular, approaches to minimize the use of physical space (e.g., cryogenic space), and increase functionality are described.

In one embodiment, the described approaches removes components (sometimes many components) to save space, increases integration density, and maximizes superconducting path(s) and other considerations, while still having all the functional components to be considered a computer. It has been found that such configuration offers many advantages. For example, in one embodiment microbumps are fabricated on a superconducting MCM (SMCM) allowing assemblers of the SMCM to select the best possible superconducting die and components from various suppliers. Additionally, there is potential for testing of each superconducting SMCM before and after final assembly to a circuit card. In embodiments, only known good SMCMs and circuit cards are used in the final assembly. With such approaches, it is possible to replace individual superconducting SMCMs. The described approaches may be particularly well suited to high-end products where components, dies, and packaging are expensive and repair or rework is economically viable. Part of the package, if necessary, can be replaced or repaired, or even upgraded without compromising overall electrical performance. Thus, the described approaches are economical for exascale electronics, since a damaged, non-functional part of the package can be selectively removed and replaced.

In embodiments, cryogenic electronic packages according to the disclosure include multiple superconducting multi-chip modules (SMCMs) coupled with each other and with room temperature semiconductor components (e.g., circuitized substrates).

In one aspect of the concepts described herein, a cryogenic electronic package includes a circuitized substrate and an SMCM that includes at least one superconducting component. The at least one superconducting component of the SMCM is electrically coupled to the circuitized substrate through an interposer disposed between the circuitized substrate and SMCM.

In another aspect of the concepts described herein, a cryogenic electronic package includes a circuitized substrate, a first SMCM and a second SMCM. The first and second SMCMs each include at least one superconducting component. The at least one superconducting component of the first SMCM is electrically coupled to the at least one superconducting component of the second SMCM through an interposer disposed between the substrate and the first and second SMCMs.

In a further aspect of the concepts described herein, a cryogenic electronic package includes a circuitized substrate, a first SMCM and a second SMCM. The second SMCM includes at least one superconducting component which is electrically coupled to the first SMCM through a superconducting interposer disposed between the first SMCM and the second SMCM. The at least one superconducting component is also electrically coupled to the substrate through an interposer disposed between substrate and first SMCM.

In another aspect of the concepts described herein, a cryogenic electronic package includes a circuitized substrate, a first SMCM, a second SMCM and a third SMCM. The second and third SMCMs each include at least one superconducting component. The at least one superconducting component of the third SMCM is electrically coupled with the at least one superconducting component of the second SMCM through a superconducting interposer disposed between the first SMCM and the second and third SMCMs. Additionally, the at least one superconducting component of the third SMCM and the at least one superconducting component of the second SMCM are electrically coupled to the substrate through the interposer and first SMCM disposed between substrate and the second and third SMCMs.

In a further aspect of the concepts described herein, a cryogenic electronic package includes one or more circuitized substrates, a first SMCM, a second SMCM and a third SMCM. The first SMCM and the second SMCM are electrically coupled through a first superconducting interposer disposed between the first SMCM and the second SMCM. Additionally, the first SMCM and the third SMCM are electrically coupled through a second superconducting interposer disposed between the first SMCM and the third SMCM. The second and third SMCMs each include at least one superconducting component. The at least one superconducting component of the second SMCM is electrically coupled with the at least one superconducting component of the third SMCM through a coupling path including the second SMCM, first superconducting interposer, first SMCM, second superconducting interposer, and third SMCM. The at least one superconducting component of the second SMCM is also electrically coupled to the substrate through a third interposer and the second SMCM which is disposed between the substrate and the second and third SMCMs.

In another aspect of the concepts described herein, a cryogenic electronic package includes a superconducting carrier having a superconducting trace, a first conventional and/or superconducting metal UBM, and one or more superconducting bumps disposed on the first UBM. The first UBM is coupled with a second conventional metal UBM of a superconducting integrated circuit. The superconducting integrated circuit includes a first superconducting circuit having first and second opposing surfaces and a conventional metal disposed on the second surface of the first superconducting circuit. The superconducting integrated circuit also includes at least one Josephson Junction (JJ). An electrode (e.g., a bottom electrode) of the JJ is disposed on the second surface of the first superconducting circuit.

The second UBM of the superconducting integrated circuit has first and second opposing surfaces. The first surface of the second UBM is disposed on the second surface of the first superconducting circuit. Additionally, the second surface of the second UBM is coupled with one or more of the superconducting bumps of the superconducting carrier (and the first UBM of the superconducting carrier).

In one embodiment in which the first UBM of the superconducting carrier is a conventional metal UBM, the conventional metal includes Pt and the first superconducting circuit to which the first UBM is coupled includes Al and/or Nb. In another embodiment in which the first UBM is a conventional metal UBM, the first UBM includes Ti—Pt—Au (i.e., conventional metals) and the first superconducting circuit includes Al and/or Nb and/or TiN. In one embodiment, the superconducting bumps to which the first UBM and the second UBM are coupled include In and/or Sn—In and/or Pb and/or Sn—Pb.

It is believed that the above and below described cryogenic electronic packages, and methods of fabricating such cryogenic electronic packages, constitute significant advancements in the art.

BRIEF DESCRIPTION OF THE DRAWINGS

Features and advantages of the concepts, systems, circuits and techniques disclosed herein will be apparent from the following description of the embodiments taken in conjunction with the accompanying drawings in which.

DETAILED DESCRIPTION

Figure 1:
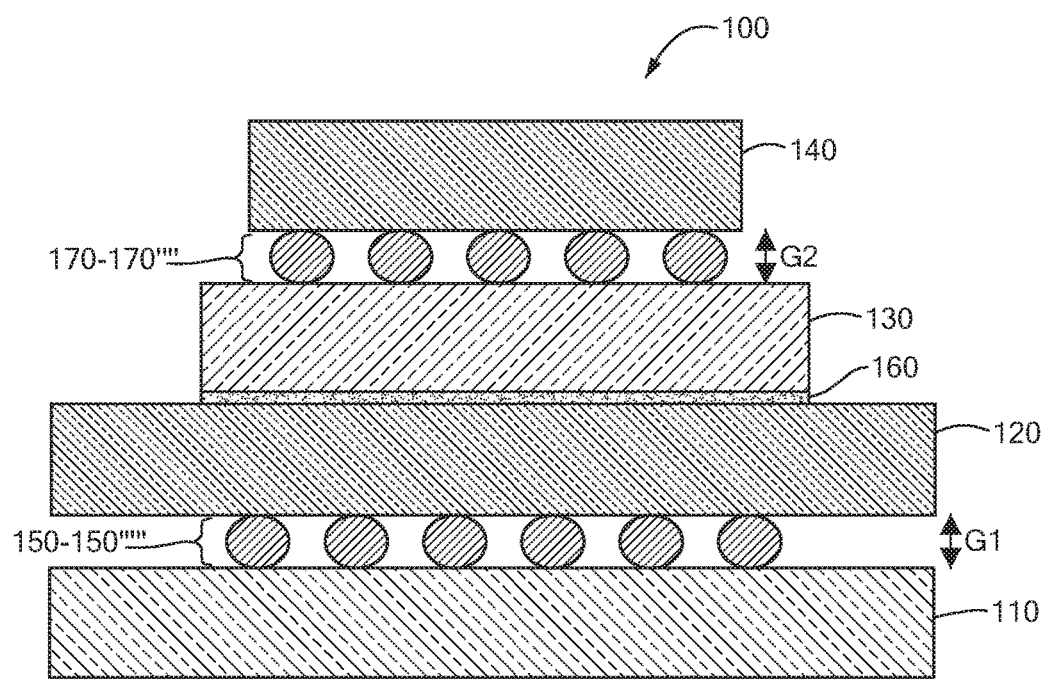
FIG. 1 is a block diagram of an example cryogenic electronic package in accordance with an embodiment of the disclosure.

The features and other details of the concepts, systems, and techniques sought to be protected herein will now be more particularly described. It will be understood that any specific embodiments described herein are shown by way of illustration and not as limitations of the disclosure and the concepts described herein. Features of the subject matter described herein can be employed in various embodiments without departing from the scope of the concepts sought to be protected. Embodiments of the present disclosure and associated advantages may be best understood by referring to the drawings, where like numerals are used for like and corresponding parts throughout the various views. It should, of course, be appreciated that elements shown in the figures are not necessarily drawn to scale. For example, the dimensions of some elements may be exaggerated relative to other elements for clarity.

Definitions

For convenience, certain introductory concepts and terms used in the specification are collected here.

As used herein, a "high Q metal" or "high Q material" (or so-called "high Q metals" or "high Q materials") refers to materials in the 20-400 nm film form capable of producing a high quality factor and are defined as materials in a resonator and/or a superconducting resonator which produce a quality factor in the range of about a few thousands to several millions in the low power and/or single photon region. Illustrative materials include, but are not limited to: niobium (Nb), niobium nitride (NbN), titanium-niobium-nitride (TiNbN), titanium nitride (TiN), aluminum (Al), and rhenium (Re), diamond, graphene, etc.

The phrase "quality factor" can be used to describe how long stored energy remains in a resonator. It should be appreciated that there is a difference between a total quality factor and an internal quality factor Qi. Internal quality factor Qi is an intrinsic characteristic of a resonator. A total or loaded quality factor QL, on the other hand, also depends upon other properties, including, but not limited to, coupling to an environment (i.e., an environment external to the resonator) and a feedline. A coupling quality factor (Qc) describes how strong (or closely) the resonator is coupled to the feedline.

As used herein, the term "resonator" refers to a device or system that exhibits resonance at some frequencies. A resonator may be described by two characteristics: (1) a resonance frequency; and (2) a quality factor. Superconducting resonators play a significant role in qubit design, interqubit coupling, quantum information storage, and quantum-state dispersive readout because of their low signal-to-noise ratio and low power dissipation. In addition, as part of the concepts sought to be protected herein, it has been recognized that because superconducting qubits may be fabricated using the same materials and processes as resonators described herein, the study of the loss mechanisms limiting the qualify factor Q in these resonators may prove to be a useful and relatively simple tool for understanding the fabrication-dependent limits to qubit coherence times. Superconducting resonator is provided as any type of microwave resonator, including distributed—e.g., a coplanar waveguide (CPW) resonator, stripline resonator, microstrip resonator, coplanar strip resonator, puck resonator, and related structures,—and lumped element resonators comprising lumped capacitive and inductive elements coupled in parallel and/or in series, the capacitor formed by patterning a conductive layer deposited on a surface of a substrate.

A bit is the most basic unit of classical logic and can occupy one of two discrete states, 0 or 1. A quantum bit, or "qubit," on the other hand, can be an arbitrary superposition of the eighteen states |0> and |1>. A quantum computer is comprised of logic gates that operate on an ensemble of quantum bits.

Where n classical bits can only exist in one of the 2n possible states, a quantum processor with n qubits can be placed in a complex superposition state of any weighted combinations of all 2n permutations, containing an exponentially larger state space than a conventional processor.

"Superconducting qubits" are manifested as (e.g. an integrated circuit) electronic circuits comprising lithographically defined Josephson junctions, inductors, capacitors, transmission lines and interconnects. When cooled to dilution refrigerator temperatures, these circuits behave as quantum mechanical "artificial atoms," exhibiting quantized states of electronic charge, magnetic flux, or junction phase depending on the design parameters of the constituent circuit elements. The Josephson junction behaves as a non-linear dissipationless inductor.

Superconducting qubits are engineered to have discrete and harmonic spectra—an "artificial atom" fabricated using standard lithographic techniques.

"Superconducting artificial atoms" are electronic circuits comprising lithographically defined Josephson tunnel junctions, inductors (L), capacitors (C), and interconnects. Conceptually, they begin as linear LC resonant circuits (i.e., simple harmonic oscillators), which are then made anharmonic to varying degrees by adding a nonlinear inductive element, the Josephson junction (JJ). When cooled to dilution refrigerator temperatures (~20 millikelvin), these superconducting circuits behave as quantum mechanical oscillators (e.g., "artificial atoms") exhibiting quantized states of electronic charge, magnetic flux, or junction phase depending on the design parameters of the constituent circuit elements.

Three fundamental superconducting qubit modalities are: charge, flux, and phase. Each includes one or more Josephson junctions. The qubit comprises the two-lowest states and is addressed at a unique frequency, $f_{01}$ Qubit modalities represented include charge, quantronium, flux, capacitively shunted flux, 2D transmon, fluxonium, and 3D transmon qubits.

The term "superconducting qubit" generally refers to the ground and first-excited state of a superconducting artificial atom. Due to the anharmonicity imparted by the Josephson junction, the ground and first-excited states may be uniquely addressed at a frequency, $f_{01}$, without significantly perturbing the higher-excited states of the artificial atom. These two-lowest states thereby form an effective two-level system (i.e., a pseudo-"spin-1/2" system), and it is this degree of freedom that is used as the qubit, a quantum bit of information. Qubit participates in quantum annealing cycle and settle into one of two possible final states (0,1). Qubit used real valued constant (weight) which influences qubit's tendency to collapse into two possible final states. A "superconducting device," as defined herein, includes at least one of a superconducting trace, a superconducting interconnect, a partially superconducting interconnect, a Josephson junction, a superconducting qubit and a superconducting resonator during operation.

The term "coupler" as used herein refers to a physical device that allows one qubit to influence another qubit. An Inductor and/or a Josephson junction can be a part of coupler. A coupler may be characterized by a real valued constant (strength) that indicates controls or influence exerted by one qubit on another.

As quantum mechanical objects, superconducting qubits can be coherently controlled, placed into quantum superposition states, exhibit quantum interference effects, and become entangled with one another. The time scale over which a superconducting qubit maintains this type of quantum mechanical behavior, and thereby remains viable for quantum information applications, is generally called the "coherence time." The rate at which the qubit loses coherence is related to its interactions with the uncontrolled degrees of freedom in its environment.

The term "interposer" as used herein, refers to and includes a structure capable of electrically interconnecting and/or magnetically and/or inductively and/or capacitively coupling arrays of superconducting and/or non-superconducting conductors on two opposing circuitized substrates. An interposer may include superconductive and/or partially superconductive or conventional (non-superconducting) elements such as micro-bumps, solder paste or conductive paste, as well as conductive and/or superconductive thru-holes. Such an interposer, as defined herein, includes at least one dielectric layer (and may include many) and at least two external superconductive circuit layers (and possibly one or more internal superconductive circuit layers), with the layers each possibly including selective and/or a density array of contact locations. Examples of dielectric materials suitable for the at least one dielectric layer of the interposer include such materials as high resistive silicon, silicon oxide coated silicon, silicon nitride coated silicon, selective silicon oxide coated silicon, selective silicon nitride coated silicon, selective or entire low loss organic (e.g., BCB) coated silicon and combinations thereof. In one example, an interposer comprises a circuitized substrate. The circuitized substrate may be provided as a superconducting organic circuitized substrate and/or a conventional metal(s) organic circuitized substrate.

Example materials which may be used to provide conductive and/or superconductive thru-holes include, but are not limited to niobium (Nb), niobium nitride (NbN), titanium-niobium-nitride (TiNbN), titanium nitride (TiN), aluminum (Al), rhenium (Re), tungsten, silicide, diamond or any other possible superconducting metal and/or superconducting nitride and combinations thereof. In one example, conductive and/or superconductive thru-holes as defined herein include at least single and/or multilayer Titanium nitride where part of the Titanium nitride can be used as a silicon and titanium etch barrier. It is further possible to use titanium nitride single and/or multilayer materials with multiple composition and/or concentration gradient where at least one composition and/or concentration is superconducting during device operation.

A "substrate," as defined herein, refers to a chip carrier for flip-chip and/or wire bonding and/or 3D circuits. A substrate can be an active and/or a passive integrated circuit based carrier. Additionally, the substrate can be an active and/or passive TSV structure and/or an MCM and/or a single chip module-based chip carrier. The chip carrier can be Si based, organic based, ceramic based, Sapphire based or a combination thereof.

The term "superconducting multi-chip module (SMCM)" as used herein includes at least one dielectric layer (and may include many) and one or more superconductive circuit layers (and possibly one or more internal superconductive circuit layers) deposited or otherwise provided on a base substrate (e.g. Si or high resistive Si). Such superconductive circuit layers of the SMCM may be deposited, for example, using thin film technology. The SMCM may also include one or more superconductive vias and/or superconducting pads. In one embodiment, the superconducting pads may include one or more under bump metals. Examples of dielectric materials suitable for the at least one dielectric layer of the SMCM include, but are not limited to, such materials as silicon (Si), high resistive silicon, silicon oxide as dielectric on Si, silicon nitride as dielectric on Si, selective silicon oxide on silicon, selective silicon nitride on silicon, selective or entire low loss organic (e.g., BCB) coated silicon and combinations thereof.

In one example, SMCM circuits are fabricated on silicon wafers having a diameter of about 200 mm. The SMCMs may be fabricated using a niobium (Nb) based integrated-circuit fabrication process for integrating superconducting chips, for example. In one embodiment, the process includes fabricating the SMCMs using a plurality of Nb metal layers (e.g., four Nb metal layers) of interconnects which are separated or otherwise spaced apart from each other by a Plasma-enhanced chemical vapor deposition (PECVD) silicon dioxide dielectric, for example. Additionally, in one embodiment the process utilizes I-line photolithography (e.g., about 365 nm) and planarization with chemical-mechanical polishing (CMP) for feature sizes down to about 0.6 µm, for example. In one embodiment, the maximum carrier chip size for the process may be about 50 mm×about 50 mm. In embodiments, wafer size and the process may limit the size of SMCM. For example, a wafer having a diameter of about 200 mm can be used to produce an SMCM having dimensions of about 50 mm×about 50 mm. Additionally, a wafer having a diameter of about 300 mm can be used to produce an SMCM having dimensions larger than about 50 mm×about 50 mm. Similarly, for an organic SMCM, the size of the SMCM will generally be larger than about 50 mm×about 50 mm.

In one embodiment, an SMCM includes four (or more) superconducting Nb layers and one or more Gold (Au)/Platinum (Pt)/Titanium (Ti) under bump metal (UBM) layers. Additionally, in one embodiment superconducting vias are fabricated between the metal layers of the UBM. In one example process, vias are etched into a PECVD silicon dioxide ($SiO_2$) dielectric of an SMCM. Additionally, in one example process, the vias are filled with a niobium metal of a subsequent superconducting layer of the SMCM. Indium bumps may be formed on top of the UBM(s) using an evaporation and lift-off process, for example.

Examples of materials which may be used to provide superconductive circuits, vias and pads include materials as niobium (Nb), niobium nitride (NbN), titanium-niobium-nitride (TiNbN), titanium nitride (TiN), aluminum (Al), rhenium (Re), or any other possible superconducting metal and/or superconducting nitride and combination. A substrate may have a Josephson junction and/or an embedded Josephson junction. It is further possible to use integrated and/or embedded capacitors, inductors, resistors. Patterned NbN can act as inductor. Capacitor may be planer, parallel plate, interdigitate and combinations thereof. Examples of materials from which resistors may be provided include, but are not limited to: platinum, molybdenum, molybdenum nitride and combinations thereof. The substrate can further have dielectric bridges, crossovers, air bridges and combinations. The term "superconducting multi-chip module (SMCM)" may be used when at least part of the circuits are superconducting during operation and used superconducting and/or conventional via between superconducting circuits for interconnects.

Superconducting multi-chip module (SMCM) can have conventional UBM conductor for heterogeneous integration as well as to protect the superconducting pad. We defined "superconducting multi-chip module (SMCM)" when at least part of the circuit is superconducting during operation. Superconducting multi-chip module (SMCM) can have active element such as various size Josephson junctions and passive elements such as inductors, resistors, transformers, and transmission lines. In one example, Superconducting multi-chip module (SMCM) is a niobium-based integrated-circuit fabrication process appropriate for integrating superconducting chips. It is based on four Nb metal layers separated by PECVD silicon oxide dielectric. It utilizes I-line (365 nm) photolithography and planarization with chemical-mechanical polishing (CMP) for feature sizes down to 0.8 micron. There are four superconducting Nb layer and used Ti—Pt—Au as under bump metal layer.

Superconducting vias are created between metal layers. In a typical process, vias are etched into PECVD $SiO_2$ dielectric and filled with niobium metal of the subsequent superconducting layer. Superconducting multi-chip module (SMCM) may be used to assemble multiple superconducting and/or conventional chips. Similarly, superconducting single-chip module (SSCM) may be used to assemble a single superconducting or conventional chip. The term "superconducting module" or "superconducting substrate" includes both superconducting multi-chip module (SMCM) and superconducting single-chip module (SSCM). We use the term "conventional module" or "conventional substrate"

which includes both multi-chip module (MCM) and single-chip module (SCM). Both superconducting and conventional module able to attach superconducting and/or conventional conducting chips.

"Cryogenic electronic packaging" is defined herein as integration and packaging of electronic components for cryogenic (77° K and below) applications. It is possible cryogenic electronic package can be used for room temperature electronics as well. For example, interface electronics which need to interface between cryo and room temperature electronics may be able to operate at both temperature zones. It also possible that cryogenic electronic package can be used for specific temperature operation (e.g., 4-10° K, below 100° mK). For example, superconducting niobium electronics generally operates below 8° K and below, whereas superconducting Aluminum electronics generally operates below 500° mK.

The term "under bump metal (UBM)" (or "under bump metallization (UBM)") as used herein refers to structures which include materials which provide a relatively low resistance electrical connection to the superconducting pad. A UBM may adhere to the underlying superconducting pad and to passivation layers of surrounding superconducting circuits, hermetically sealing the superconducting circuits from the environment. In some cases, a UBM may provide a strong barrier to prevent the diffusion of other bump metals into the superconducting circuits.

A top layer of a UBM is preferably readily wettable by the bump metals, for solder reflow. In one embodiment a UBM uses multiple different metal layers, such as an adhesion layer, a diffusion barrier layer, a solderable layer, and an oxidation barrier layer. It is further possible that the UBM layers are compatible metals which in combination have low internal mechanical stresses. Example of materials from which a UBM may be provided include, but are not limited to: 20 nm Ti-50 nmPt-150 nmAu, 10 nmTi-50 nm Au, 5 nm Ti-5 nm Pt-5 nm Au-1000 nm Indium, 5 nm Ti-5 nm Pt-5 nm Au-1000 nm Sn, 50 nm Pt-100 nm Au, 5 nm Ti-500 nm In, 20 nm Ti-1000 nm In, Ni—Au, Ni—Pd—Au, Pd—Au, Ti—TiN, Ti—TiN—Ti—Au, Ti—TiN—Ti—In, Ti—TiN—Ti—Sn, Ti—Sn—In etc.

The term "superconducting interconnect" or "partially superconducting interconnect" as used herein refers to structures including at least one superconducting bump and at least one UBM to create electrical and/or mechanical connection between two superconducting circuits. We defined "superconducting interconnect" when superconducting bump and superconducting UBM create superconducting interconnect between two superconducting circuits during operation. We also defined "superconducting interconnect" when superconducting bump and conventional UBM conductor create superconducting interconnect between two superconducting circuits during operation. Here, a conventional UBM conductor becomes superconducting due to proximity effect.

Example compositions of superconducting interconnects include, but are not limited to: (10-400) nm Al-(3-20) nm Ti-(5-40) nm Au-(1-5)μm In-(5-40) nm Au-(5-20) nm Ti-(10-400) nm Al. In such examples, Al is used as a superconducting pad and Ti—Au or Ti—Au-thin (≤1000 nm) Indium can act as a UBM. It is possible for Au thickness in the interconnect part to be consumed by Indium and rest of the Au will superconducting based on proximity.

Additional example compositions of superconducting interconnects include: (10-400) nm Al-(3-20) nm Ti-(1-5) μm In-(5-20) nm Ti-(10-400) nm Al, (10-400) nm Al-(1-5) μm In-(10-400) nm Al, (10-400) nm Al-(3-20) nm Ti-(5-40) nm Au-(1-5)μm In-(1-5)μm Sn-(5-40) nm Au-(5-20) nm Ti-(10-400) nmAl, and (10-400) nm Nb-(3-20) nm Ti-(5-40) nm Au-(1-5)μm In-(5-40) nm Au-(5-20) nm Ti-(10-400) nm Nb.

Further example compositions of superconducting interconnects include: (10-400) nm Nb-(3-20) nm Ti-(1-5)μm In-(5-20) nm Ti-(10-400) nm Al, (10-400) nm Nb-(1-5)μm In-(10-400) nm Nb, (10-400) nm Al-(3-20) nm Ti-(5-40) nm Au-(1-5)μm In-(1-5)μm Sn-(5-40) nm Au-(5-20) nm Ti-(10-400) nm Al, and (10-400) nm Al-(3-20) nm Ti-(5-200) nm TiN-(1-5)μm In-(5-200) nm TiN-(5-20) nm Ti-(10-400) nm Al, (10-400) nm Al-(3-20) nm Ti—(5-200) nm TiN-(5-40) nm Au-(1-5)μm In-(5-40 nm) Au-(5-200) nm TiN-(5-20) nm Ti-(10-400) nm Al. Additional example compositions of superconducting interconnects include: (10-400) nm Nb-(3-20) nm Ti-(5-200) nm TiN-(1-5)μm In-(5-200) nm TiN-(5-20) nm Ti-(10-400) nm Nb, (10-400) nm Nb-(3-20) nm Ti-(5-200) nm TiN-(5-40) nm Au-(1-5)μm In-(5-40 nm) Au-(5-200) nm TiN-(5-20) nm Ti-(10-400) nm Al, and combinations thereof.

A "partially superconducting interconnect" is defined herein to describe a conductor interconnect between two superconducting circuits during operation provided from a superconducting bump and a conventional UBM conductor. Here, conventional UBM conductors dominate interconnect conductance although part of the interconnect is superconducting due to presence of a superconducting bump. In one example, superconducting interconnects include Al-UBM-Indium-UBM-Al or Nb-UBM-In-UBM-Nb. Examples of initial interconnect composition prior to bonding with second superconducting substrate include, but are not limited to: Ti(5 nm)-Au(20 nm)-8 um In, Ti(5 nm)-Au(100 nm)-8 um In, Ti(5 nm)-Au(50 nm)-8 um In, Ti(5 nm)/Pt(20 nm)/Au(20 nm)+8 um In, Ti(5 nm)/Pt(20 nm)/Au(20 nm)+8 um In, Ti(5 nm)/Pt(50 nm)/Au(100 nm)+8 um In, Ti(5 nm)/Pt(50 nm)/Au(150 nm)+8 um In, 8 um Indium-1 um tin, 4.5 um Indium-4.5 μm tin, 6 um Silver bump with 2 um In, 5 nmTi-6 um Ag-5 nmTi-50 nmPt-100 nmAu-2 um In, Al—In, Pb—In, Pb—Ti—In, Pb—Sn—In, Pb—Sn—In—Au(10 nm). Nb—Pb—Sn—In, Nb—Pb—In, Nb—Ti(5 nm)-Pb(8 um)-In(2-5 um), 48Sn-52In etc. In one example, a total interconnect resistance for an Al based superconducting substrate may be calculated as: interface resistance of Al-UBM+ interface resistance of (UBM-In)+ interface resistance of (In-UBM)+ interface resistance of UBM-Al.

In this example, it is assumed that an Al pad is used for both superconducting integrated circuits and/or modules for creating superconducting and/or partially superconducting interconnects, assuming UBM resistance negligible in the range of nano ohm and Indium, aluminum superconducting during device operation. R(Al-UBM): contact resistance and R(UBM-In):interface resistance between bump and UBM. If Indium is used as a material from which to provide a UBM, then a Total Resistance (TR) may be computed as TR=2R (Al-UBM) assuming Indium to indium mixing much better and indium is superconducting. In this case, a contact resistance [R(Al-UBM)] will be superconducting due to proximity. So, keeping same materials as UBM as well as bump has many benefits other than adding multiple materials.

A Josephson junction is defined as two superconductors allowed interacting through a so-called "weak link," where the "weak link" may be provided from a thin insulating barrier, a conventional metal, or a narrow superconducting constriction—respectively referred to as an S-I-S, S-N-S, or S-C-S junction. A supercurrent flows/tunnels through this weak link, even in the absence of a voltage. The critical current of the junction is related to the superconducting gap of the electrode materials as well as the type and thickness of the insulating barrier. It is often characterized by a critical current density Jc and the area A of the junction such that Ic=Jc×A.

Josephson tunnel junctions are formed by two superconducting electrodes separated by a very thin (~1 nm) insulating barrier. In this configuration, the collective superconducting order of one electrode (parameterized by a phase $\varphi_1$) coherently connects with that of the other electrode ($\varphi_2$) via the elastic tunneling of Cooper pairs through the barrier. The resulting supercurrent, I, and junction voltage, V, are related to the superconducting phase difference, $\varphi=\varphi_1-\varphi_2$, across the junction A circuit quantum electrodynamics (circuit QED) may be used to address and measure a superconducting qubit. Circuit QED and superconducting qubits may be coupled to the electric field in a planar transmission line resonator. For cavity QED an atom in the cavity interacts with the trapped photons, and a measurement of the photons leaking out of the cavity allows one to probe the state of the atom.

In circuit QED, the cavity is replaced by a $\lambda/2$ transmission line resonator that interacts with the outside world via two capacitors, Cin and Cout. A superconducting qubit sits at a voltage anti-node in the resonator, where the capacitance between the qubit and the resonator sets the interaction strength. Measurements may determine a maximum number of photons leaking out of the resonator (RFout) when the impinging signal (RFin) is on or near resonance with the resonator-qubit system.

Superconducting quantum interference device (SQUID) may be provided from a superconducting loop interrupted by two Josephson junctions. The net critical current of the SQUID can be tuned by threading a magnetic flux through the loop. SQUID is a tunable Josephson junction, and this feature is used to make "tunable" superconducting qubits, i.e., qubits with a parameter related to the junction Ic that is tunable by the magnetic field that threads the SQUID loop.

As used herein, the term "Superconductive single-flux-quantum (SFQ) integrated circuit" is used to describe a circuit which operates at a cryogenic temperature of about 4 degrees Kelvin (K). The circuit is based on switching flux quanta in and out of superconducting loops containing Josephson junctions (JJs), for example. In embodiments, building circuits and logic gates exploiting SFQ operation involves combining loops and inductors for storing flux along with transformers and JJs for control and switching. In one relatively simple example SFQ circuit, a superconducting ring is interrupted by a single Josephson junction. Additionally, a transformer may couple an amount of magnetic flux into the superconducting ring which is proportional to an externally applied control current, for example. In embodiments in which the control current results in a loop current IL of the superconducting ring exceeding k, for example, a relatively short voltage pulse may result across the junction along with a 2*pi phase shift. Such corresponds to a single quantum of flux passing through the junction. In one embodiment, a characteristic switching time of the junction is about 1 picosecond (ps) and a switching energy of the junction is about $10^{-19}$ Joule (J).

Another example SFQ circuit includes a D flip-flop which has a storage loop formed by first and second junctions $J_1$ and $J_2$, and an inductor $L_2$. With a bias current applied to keep junction $J_1$ close to its critical current, an input 'CD' pulse entering through a junction $J_0$ may switch junction $J_1$ and inject an SFQ pulse into a storage loop of the circuit. The foregoing may result in an increase in a circulating current Is passing through junction $J_2$. Readout of the circuit (and portions thereof) may be performed with an incoming clock (CLK) pulse. In a presence of a stored pulse $I_S$, for example, an incoming CLK pulse may cause junction $J_2$ to switch, resulting in an output pulse at an output 'Q' of the circuit. With no stored pulse, the CLK pulse may be insufficient to switch junction $J_2$ and there may be no output pulse at output 'Q'.

In one embodiment, superconducting SFQ circuits are fabricated using a niobium-based superconducting integrated-circuit fabrication process for superconducting circuits. In one embodiment, the process includes fabricating the SFQ circuits using one or more Niobium (Nb)/(Aluminum-Aluminum Oxide) Al—AlO$_x$/Nb Josephson junction trilayers, for example, with a junction current $J_c$ of about 10 Killoamps (kA)/cm$^2$. The process may utilize about 248-nm photolithography and planarization with chemical-mechanical polishing (CMP) for wiring-layer feature sizes down to about 350 nm and Josephson junction diameters (and/or other dimensions) down to about 500 nm, for example. In embodiments, the SFQ circuits are fabricated using the process with Nb superconducting layers, molybdenum (Mo)-based resistance layers and Nb-based superconducting interconnects between substantially all metal layers. The process may support superconducting circuits with a single Josephson junction layer, for example. In embodiments, metal wiring layers (or metal layers) of the SFQ circuits are separated by a silica-based dielectric. Additionally, in embodiments microvias are used to interconnect the metal layers to form superconducting circuits.

As used here, the term "chemically activated surface" is used to describe a surface which is minimally etched and/or damaged. The hydrophilicity or hydrophobicity of the surface may be changed with appropriate plasma and/or chemical treatment by changing or modifying surface chemistry.

As used herein, the term "circuitized substrate" is used to describe a semiconductor structure including at least one dielectric layer, the at least one dielectric layer having at least one surface on which at least one circuit is disposed. Examples of dielectric materials suitable for the at least one dielectric layer include low temperature co-fired ceramic (LTCC), ceramic (alumina), fiberglass-reinforced or non-reinforced epoxy resins (sometimes referred to simply as FR4 material, meaning its Flame Retardant rating), polytetrafluoroethylene (Teflon), polyimides, polyamides, cyanate resins, photoimagable materials, and other like materials, or combinations thereof. Examples of electrically conductive materials suitable for the at least one circuit include copper and copper alloy. If the dielectric layer is provided from a photoimagable material, it is photoimaged or photopatterned, and developed to reveal the desired circuit pattern, including the desired opening(s) as defined herein, if required. The dielectric layer may be curtain coated or screen applied, or it may be supplied as a dry film or in other sheet form.

As used herein, the term "conductive fusible metal" is used to describe a metal including one or more of tin-lead, bismuth-tin, bismuth-tin-iron, tin, indium, tin-indium, indium-gold, tin-indium-gold, tin-silver, tin-gold, indium, tin-silver-zinc, tin-silver-zinc-copper, tin-bismuth-silver, tin-copper, tin-copper-silver, tin-indium-silver, tin-antimony, tin-zinc, tin-zinc-indium, copper-based solders, and alloys thereof. The metals may change forms (e.g., from a solid to a liquid) during a bonding or during post bonding annealing or reflow process.

As used herein, the term "conductive structure" is used to describe an interconnect structure for electrically coupling one or more interconnect pads, electrical connections, components, devices, modules, and semiconductor structures and devices. The conductive structure may include at least one of a micro via having a diameter which is between about one micrometer (μm) and about one-hundred fifty μm's and a sub-micron via having a diameter of less than about one μm.

As used herein, the term "via first" may be used to describe a micro via and/or a submicro via used to make at least one electrical connection between a first device layer and second device layer in a semiconductor structure including at least two device layers. Additionally, as described here, the term "via" first may also be used to describe a micro via and/or a submicro via passing through a dielectric material or layer (in some embodiments, only the dielectric material or layer) to make at least one electrical connection between a first device layer and a second device layer in a semiconductor structure including at least two device layers. For a via first process, the first device layer and the second device layer are completed separately. As one example, a partial via material is added on first and/or second opposing surfaces (i.e., top and/or bottom surfaces) of the first second device layers and subsequent bonding and/or post bonding process create a via first between the first and second device layers.

The via first may be filled with at least one metal or alloy having a high Coefficient of Thermal Expansion (CTE) to produce a rigid, robust, and conductive via first joint between the at least two device layers during the composite bonding process. High temperatures and/or high pressures may be applied and used to bond the two device layers and provide a three-dimensional (3D) interconnection (i.e., interconnect) among the device layers. The high CTE metal or alloy are expanded at relatively high temperatures and interdiffuse with each other to produce the 3D interconnect. Alternatively, the via first may be filled with a low temperature fusible metal which melts and interdiffuse during bonding or post bonding processes.

As used herein, the term "via last" is used to describe a micro via and/or a submicro via used to make at least one electrical connection between a first device layer and a second device layer in a semiconductor structure including at least two device layers. Fabrication of the first device layer is completed first, and the second device layer is deposited over the first device layer. The second device layer is completed with via last process. A pad layer which includes one or more interconnect pads may be added after via last process. In one embodiment, via last is filled. Additionally, in one embodiment, the via last can be unfilled or partially filled. Via last may pass through the device layers (e.g., second device layers) and, in some embodiments, one or more isolation layers or materials. A titanium (Ti) material having a thickness of about ten nanometers (nm), a metal organic chemical vapor deposition (MOCVD) Titanium Nitride (TiN) liner having a thickness of about five nm, and tungsten plugs may be used for via lasts. A MOCVD or chemical vapor deposition (CVD) TiNx, with X less than or equal to 1, is preferred for better conformal coating.

As used herein, the term "CMOS (Complementary Metal Oxide Semiconductor)" is used to describe a semiconductor technology for constructing integrated circuits (which are also sometimes referred to herein as "chips"). Examples CMOS circuits include microprocessors, microcontrollers, static random access memory (RAM) and other digital logic circuits. Example CMOS circuits also include image sensors (or CMOS sensors), data converters and highly integrated transceivers for many types of communication applications.

In one embodiment, CMOS circuits use complementary and symmetrical pairs of p-type and n-type metal oxide semiconductor field effect transistors (MOSFETs). CMOS circuits can include NMOS and/or PMOS transistors. The transistor can have a gate-source threshold voltage, below which the current (or sub threshold current) through the device drops exponentially, for example. In one embodiment, CMOS circuits may operate at supply voltages which are much larger than their threshold voltages. In another embodiment, a CMOS transistor can have a near zero threshold voltage (e.g., native transistor).

Operating temperatures of CMOS circuits and devices may be determined by a number of factors, including the properties of the basic semiconductor material (e.g., Si, gallium arsenide (GaAs), gallium nitride (GaN), silicon carbide (SiC), silicon germanium (SiGe), etc.) and the type of CMOS device (diode, bipolar transistor, field-effect transistor, etc.). Operating temperatures of CMOS circuits and devices may also be determined by circuit design of the device (e.g., materials, geometry and dimensions, interconnections), CMOS packaging and type of CMOS circuit (analog or digital). In one example, CMOS circuits and devices (e.g., Si MOSFETs, enhancement type MOSFETs, etc.) can operate at relatively low cryogenic temperatures because carriers needed for conduction in a channel of the devices can be ionized by an electric field from a gate terminal (or terminals) of the devices.

In embodiments, CMOS circuits (e.g., Si MOSFETs) can operate at deep (i.e., low) cryogenic temperatures, below the freeze-out of Si, for example. Additionally, in embodiments CMOS circuits may include various types of heterostructure FETs (HEMTs or MODFETs based on III-V semiconductors) which may not need thermal energy to ionize dopants of the FETs. In embodiments, the FETs can be used over substantially the entire cryogenic temperature range down to the lowest cryogenic temperatures. In one embodiment, CMOS circuits can include a Fin Field Effect Transistor (FinFET) and/or multiple-gate field-effect transistor (MuG-FET) and/or FlexFET and/or multiple-independent-gate field-effect transistor (MIGFET) and/or heterojunction bipolar transistors (HBTs) and/or insulated-gate bipolar transistor (IGBT). In another embodiment, a CMOS device including homojunction (e.g., Ge and GaAs) and/or heterojunction bipolar transistors can operate to relatively low cryogenic temperatures and show increased performance on cooling compared, for example, to conventional transistors.

As used herein, the term "photonic integrated circuit or integrated optical circuit" is used to describe a device that integrates multiple (i.e., at least two) photonic functions into a chip and provides functions for information signals imposed on optical wavelengths (e.g., visible spectrum or near infrared about 850 nm-about 1650 nm). In one example, photonic integrated circuits are based on an indium phosphide and/or a indium gallium arsenide (InGaAs) substrate having optically active and passive functions on a same chip. In one embodiment, a photonic integrated circuit uses silicon photonics where Si is used as an optical medium. It is further possible to use $SiN_x$ based waveguide in a photonic integrated circuit. In another example, a photonic integrated circuit uses silicon electro-photonic circuits. In one example, the circuits use a $SiN_x$ based waveguide in $SiO_2$. Examples of photonic integrated circuits include monolithic tunable lasers, widely tunable lasers, externally modulated lasers and transmitters, integrated receivers, optical transceivers, etc.

As used herein, the term "superconductive adhesive" is used to describe a composite material including a nonconductive organic binder and one or more superconductive filler particles. In embodiments, the adhesive layer may also include one or more conventional metal particles. Electrical connections may be achieved using the adhesive primarily by inter-particle conduction, for example. When superconductive filler content of the adhesive is sufficiently high, for example, the adhesive may be transformed into a relatively good superconducting conductor. For electrical conduction, particles of the adhesive should make intimate contact (e.g., physical and/or tunneling contact) and form a network or conductive chain, which may help in the transfer of electrons. A conductive path may be formed at a threshold volume fraction of the superconductive filler which can be calculated using percolation theory of spherical particles, for example. In embodiments, an anisotropic conductive adhesive (ASA) may be suitable, for example, when a relatively narrow distribution superconductive spherical filler is used is and filler concentration is substantially below the threshold volume fraction.

As used herein, the term "through silicon via" (TSV) is used to describe a vertical interconnect which passes substantially through one or more of a silicon wafer, a silicon die, a silicon interposer, silicon active circuits, silicon passive circuits, or other silicon circuits, components or layers. TSVs can be fabricated by different methods and approaches. In silicon (Si) via-first approaches, for example, TSVs are fabricated prior to fabrication of active devices (i.e. bipolar or MOSFET devices) to which the TSVs may be coupled. The approach includes patterning the TSVs, lining the TSVs with a high temperature dielectric (thermal oxide or chemical vapor deposition), filling the TSVs with doped polysilicon and using chemical mechanical polishing (CMP) techniques to remove excess polysilicon from one or more surfaces of the TSVs. Si via-first approaches allow for the use of high temperature processes to insulate and fill the TSVs.

In Si via-middle approaches, TSVs are fabricated after forming the active devices to which the TSVs may be coupled, but before back end of line (BEOL) stack fabrication. The approach includes patterning the TSVs after a contact process, lining the TSVs with a low temperature dielectric deposition, and then filling the TSVs with single/multiple barrier metals. Typically the TSVs are filled with Copper (Cu) and/or W. For TSVs filled with Cu, a Cu seed layer is disposed on top of a barrier layer and a subsequent Cu electroplating fills the TSVs. The TSVs are then planarized using CMP techniques. For W, chemical vapor depositing (CVD) processes are used to fill the TSVs, and CMP techniques are used to remove excess polysilicon from one or more surfaces of the TSV. W is preferred for filling high aspect ratio TSVs (e.g., TSVs with aspect ratio of height-to-width>10:1). In general, Cu is used to fill low aspect ratio TSVs (e.g., TSVs with aspect ratio<10:1). Si via-middle process are useful for fabricating TSVs with a small via pitch, TSVs having minimal blockage of wiring channels, and TSVs having a low via resistance, for example.

In front side Si via-last approaches, TSVs are fabricated at the end of the BEOL processing of the wafer. Si via-last approaches are similar to Si via middle approaches, but Si via-last approaches use low temperature dielectric depositions (<400 C) compared to higher temperature dielectric compositions (<600 C) in Si via middle approaches. Front side Si via-last approaches may be suitable for their coarse TSV feature size, which simplifies the process of integrating TSVs into semiconductor structures. The front side Si via-last approaches may also useful for wafer-to-wafer bonding.

In such approaches, TSVs can be formed at the end of the wafer-to-wafer bonding process, connecting multiple layers in the multi-layer (e.g., three-dimensional (3D)) stack of wafers or semiconductor structures.

Front side Si via-last approaches may use TSV etch as well as the entire BEOL dielectric stack. Backside Si via-last approaches also use wafer to wafer (or semiconductor structure to semiconductor structure) stacking. The wafers can be bonded together using oxide bonding or polymer adhesive bonding, either front-to-front or front-to-back. The wafers can be thinned by etching and/or polishing. Additionally, a TSV may be formed in the wafers by etching a via down to bond pads on a top wafer and a bottom wafer. The process includes patterning the TSVs after the contact process, lining the TSVs with a low temperature dielectric deposition, and then filling the TSVs with a single/multiple barrier metal (e.g., Cu and/or W). The TSVs are then planarized through a subsequent CMP process.

A number of inorganic and/organic dielectric materials having a thickness in a range of about one hundred nanometers (nm) to about one thousand nm can be used to insulate the TSVs. TSV dielectrics may be required to have good step coverage (at least 50% through the depth of the trench), good thickness uniformity (<3% variation across the wafer), high deposition rate (>100 nm/min), low stress (<200 MPa), low leakage current (<1 nA/cm2), and high breakdown voltage (>5 MV/cm).

Plasma-enhanced chemical vapor deposition (PECVD) of SiO2 or SiN, or sub-atmospheric chemical vapor depositions (SACVD) of SiO2, are some examples of insulator deposition. The most commonly used conductors to fill TSVs are doped polysilicon (180 1ohm-cm), tungsten (5.6 1ohm-cm), or copper (1.7 1ohm-cm). W deposited by CVD has a good fill of the TSV and can be integrated with the contacts to which the TSVs are to be coupled. A TiN liner is required to ensure that the WF6 precursor does not attack the Si substrate in the TSV. A disadvantage of W compared to Cu is that it has a high intrinsic stress (1400 MPa for W, 20 MPa for Cu). TSV can be superconducting during qubit operation. A superconducting TSV comprises a Titanium Nitride (TiN) and/or poly Si and/or Al and/or high Q metal. TSV can be provided as a combination of titanium-titanium nitride-tungsten and/or titanium-titanium nitride-high Q materials-tungsten and/or titanium-titanium nitride-high Q materials tungsten and/or titanium-high Q materials-tungsten and/or high Q materials-tungsten and/or high Q materials, etc.

Reactive-ion-etching (RIE) may be used to create high aspect ratio TSVs and deep trench structures in the Si (i.e., for capacitors or for isolation) in which the TSVs are provided. In one embodiment, a TSV RIE Bosch process may be used to fabricate the TSVs, with process alternating between deposition and etching steps to fabricate deep vias. SF6 isotropic etching of Si may not be suitable for forming TSVs (which require a highly anisotropic etch). Fluorocarbon chemistry (e.g., C4F8) may be used for anisotropic etching achieved through the deposition of a chemically inert passivation on the sidewall of the TSVs.

Chemical mechanical polishing (CMP) may be used for planarization of metal filled vias (e.g., micro vias), for example. Additionally, a metal contact (i.e. pad) in an upper device layer (e.g., the second device layer) may be an annulus with an about a one point five micrometer ($\mu$m) opening that also functions as a self-aligned mask (e.g., hard mask) during the plasma etch of the oxide beneath it to reach a corresponding metal contact in a lower device layer (e.g., the first device layer). In order to fully dispose and electrically couple the via, the size of the metal contacts, and thus the pitch of the vertical interconnect, is made proportional to about twice the wafer-wafer misalignment of the wafers including the first and second device layers.

As used herein, the term "superconducting organic circuitized substrate" is used to describe a substrate structure including one or more dielectric layers and one or more conductive layers (e.g., external conductive layer). The conductive layers may be positioned or otherwise disposed on the dielectric layer. Additionally, the conductive layers may include a plurality of conductor pads as part thereof. The dielectric layers may include one or more of the following dielectric materials: fiberglass-reinforced epoxy resin ("FR-4") and polytetrafluoroethylene (e.g., Teflon), including polytetrafluoroethylene filled with inorganic particles (e.g., silica), for example, as a means of controlling the coefficient of thermal expansion of the dielectric material. The dielectric layers may also include polyimide (e.g., Kapton); polyamide, cyanate resin, photo-imageable material and other like materials. One example suitable material for the dielectric layers is currently sold under the product name "RO2800" by Rogers Corporation, Rogers, Conn. ("RO2800" is a trademark of the Rogers Corporation.)

The conductive layers, which may be provided as superconductive layer(s), preferably serve to superconduct or conduct electrical signals in the circuitized substrate. In one embodiment, the conductive layers preferably include metals such as Pb, Pb plated Cu, Pb plated Al, tin-lead or tin-lead plated copper. The conductive layers may also include or comprise additional superconducting or conventional metals (e.g., niobium, aluminum, titanium, platinum, gold etc.) or alloys thereof, example. In embodiments in which the conductive layers include conventional metals (e.g., Cu, Ni, Pt, Au, etc.) and/or alloy layers but no superconducting metals or materials, for example, a circuitized substrate may be referred to as a "conventional metal circuitized substrate."

One example superconducting circuitized substrate includes multiple superconducting and/or partial signal and/or power paths separated by an organic dielectric. The paths may be interconnected with each other by superconducting and/or partially superconducting vias, for example. In embodiments, superconducting building blocks of superconducting circuitized substrates can be laminated to achieve an electrical interconnection between adjacent blocks. Each superconducting building block can have signal, voltage, and ground planes, for example. It is also possible to use signal, voltage, and ground features on a same plane of the circuitized substrate.

Two building blocks may be used to fabricate a superconducting circuitized substrate in one embodiment. One example building block (i.e., a first building block) is a signal core that is prepared by lamination and plating approaches. A lead (Pb) and/or tin-lead plated Cu based power plane (P) may be sandwiched or otherwise disposed between two (or more) layers of a relatively low dielectric constant (Dk) and relatively low loss (Df) dielectric. Alternatively the power plane can include a High Q metal or foil or High Q metal coated Cu plane. In embodiments, the dielectric is typically filled with low Dk particles to achieve a comparable coefficient of thermal expansion (CTE) with Cu. The low dielectric constant (Dk) and low loss (Df) dielectric may be favorable for electrical, mechanical, and thermal properties in some embodiments. Example low dielectric constant and low loss materials include: liquid crystal polymer (LCP), silica particle filled polytetrafluoroethylene (PTFE) and polyphenylene ether (PPE) superconducting circuitized substrate technology.

In one embodiment, signal (S) traces of the superconducting circuitized substrate are developed using a subtractive and/or additive and/or semi-additive (pattern plating) process. Such processes have been demonstrated to produce relatively fine lines (about 1-100 um) and spaces (about 2-100 um), along with laser or mechanical drilled or etched via in the range of about 1-200 µm, and an about 10-350 um plated capture pad around the via. A Pb and/or tin-lead plated Cu based signal trace is possible in some embodiments. Additionally, single or multiple high Q metal or high Q metal coated Cu based signal trace can be used in some embodiments. Dimensions of the signal trace may be selected, for example, to allow wiring designs to have one line per channel in densely populated areas of the chip site.

Another building block (i.e., a second building block) of the example superconducting circuitized substrate may include a so-called "joining layer," as defined below. In the second building block, a Pb and/or tin-lead plated Cu copper power plane may be sandwiched or otherwise disposed between layers of a dielectric. Examples of suitable dielectric materials for the dielectric can include resin coated conventional and/or superconducting material. In embodiments, laser or mechanical drilled through holes which may be formed in the dielectric, for example, may be filled with an electrically superconducting and/or partially superconducting paste. The paste may include conventional metals and/or superconducting metals and/or low melting point superconducting nano and/or micro size particles dispersed in a polymer matrix. The polymer matrix can include a mixture of a monomer and/or an oligomer which may become polymer during lamination. It is further possible to use at least one chemical cleaning agent or flowing agent or purifying agent which become part of polymer matrix during lamination. In embodiments, the paste may form one or more superconducting and/or partially superconducting connections between adjacent blocks (e.g., first and second blocks of the circuitized substrate) during lamination.

In embodiments, by alternating signal and joining portions in lays of the circuitized substrate prior to lamination, a superconducting adhesive formed from the paste may electrically connect pads of signal paths. The superconducting paste-filled interconnect technology may require the addition of a joining layer or core between each portion to be joined in some embodiments. For example, joining three structures or sub-composites (e.g., top, middle and bottom structures) together using interconnects may require at least two joining layers having superconducting paste-filled interconnects. The superconducting paste-filled interconnects may protrude above a surface of the circuitized substrate dielectric by about 5-10 µm in some embodiments. In one embodiment, lamination may be used to melt and attach or otherwise couple the protruding interconnects to circuitized sub-composites or portions adjacent to circuitized substrate joining layers.

One example advantage of this superconducting paste-filled interconnect approach is the ability to attach multiple, multilayer, substrates having different sizes. In embodiments, superconducting paste-filled interconnection methodology may be used to fabricate large area, high density rigid substrates for chips having a relatively tight pad pitch requirement. Different size rigid substrates may be laminated together with a superconducting paste-filled filled joining layer to achieve a superconducting and/or partially superconducting interconnection in a rigid structure or substrate. Electrical connections can be formed during lamination using superconducting paste-filled interconnects. As a result, one is able to fabricate structures with different sub-composites or portions of arbitrary size and shape. In embodiments, the interconnect technology offers many advantages over the more conventional structures, for example: a reduction in total processing steps, maximum possible metal layer counts, placement of multiple size rigid structures, opportunity for joining multiple rigid and/or flex layers, and the ability to grow individual 3-D structures from a same base substrate. Several different size rigid structures can be laminated with each other to produce a single packaging substrate working as one system.

As used herein, the term "miniaturized cryogenic packaging" is used to describe a package including multi-level assembly of a superconducting IC, a superconducting MCM (SMCM), interposer, dielectric interposer, circuitized circuit, etc. In embodiments, larger SMCMs and microbump technology favor convergence of chip carrier and board, and also eliminates multilevel assembly to provide unique miniaturized solutions for complex cryogenic packaging. Relatively large passive superconducting modules may horizontally connect multiple superconducting chips, for example, with IC-scale electrical routing between chips and MCM. Superconducting MCMs may be used to route power and signals from a multilayer superconducting MCM to chips through microbumps. In an example package, one or a few superconducting chips may be attached or otherwise coupled to an MCM and subsequently attached to a board or substrate through a BGA/wirebonding connection, for example.

In embodiments, a relatively high-density, finer pitch approach is capable of reducing connections and associated parasitic resistance and capacitance values between two given points on chips to enhance data throughput and functionality within a given footprint, for example. Cryogenic package miniaturization addresses multiple challenges including component footprint reduction, integration of active and passive components, I/O miniaturization, and high density (e.g., about 0.8-1 μm lines, about 2 μm spacing and about 2 μm via) superconducting interconnects. The advanced cryogenic packaging solution described herein may be found useful to achieve significant reductions in size and weight in cryogenic electronic packages.

In one embodiment, an example design feature enabling the most significant size and weight reduction is component footprint reduction. A typical backplane board assembly incorporates components such as actives, passives, and I/O components. Superconducting active components may be available in bare die flip-chip format, which provides the most leverage for size and weight reduction. However, the associated benefit can be severely limited without an enabling high-density superconducting module technology.

In some embodiments, superconducting modules are available in wirebond attached format. Wirebonding a high-density superconducting module directly to a high-density card may, for example, generally still require a footprint substantially larger than the die itself. Passive discrete components can be manipulated for miniaturization. A bill of materials review can identify surface mount capacitors, resistors, inductors, etc., where package size reduction and enhanced electrical performance is possible by replacing surface passive components with internally embedded components.

Connectors that are classified as I/O components can occupy significant volume and mass in an assembly in some embodiments. Replacing pin-in-hole connectors with relatively low-profile surface mount connectors may, for example, be used as a miniaturization technique for cryogenic packaging (e.g., to reduce the significant volume and mass associated with I/O component connectors).

An electronic component (also sometimes referred to herein as a "component") can include a discrete device or physical entity in an electronic system used to affect system operation. Components can be classified as passive, active, or electromechanical. Example components include a connector, a capacitor, a resistor, an inductor, a battery, integrated circuits, modules, bare and packaged die, etc.

As used herein, the term "electroplating" is used to describe a process by which a metal in its ionic form is supplied with electrons to form a non-ionic coating on a desired substrate. The process may use an electroplating system including a chemical solution which contains the ionic form of the metal, an anode (positively charged) which may consist of the metal being plated (a soluble anode) or an insoluble anode (usually carbon, platinum, titanium, lead, or steel). The electroplating system may also include a cathode (negatively charged) where electrons are supplied to produce a film of non-ionic metal.

As used herein, the term "electroless plating" (also known as chemical or auto-catalytic plating) is used to describe a non-galvanic type of plating method that involves several simultaneous reactions in an aqueous solution, which occur without the use of external electrical power. The reactions may be accomplished or otherwise occur when hydrogen is released by a reducing agent (e.g., sodium hypophosphite) and oxidized, producing a negative charge on a respective surface of a part or component on which the electroplating process is applied.

As used herein, the term "joining layer" is used to describe a structure capable of forming superconducting and partially superconducting contacts between devices (e.g., integrated circuits, MCM, interposers) and circuitized substrates such as PCBs. In embodiments, the joining layer may use extremely small superconductive or partially superconductive elements such as bump or microbumps, plated vias or superconductive conductive paste quantities. A joining layer may include at least one dielectric layer. Additionally, a joining layer may include at least one superconductive and/or conventional metal conductive circuit layer. The circuit layer may include a relatively high density array of contact locations, for example. Example suitable dielectric materials for the at least one dielectric layer include such materials as fiberglass-reinforced epoxy resins and polytetrafluoroethylene, including polytetrafluoroethylene filled with inorganic particles (e.g., silica), for example, as a means of controlling the coefficient of thermal expansion of the dielectric material. Example suitable dielectric materials also include polyimides, polyamides, cyanate resins, polyphenylene ether resins, liquid crystal polymers, photo-imageable materials, and other like materials.

In embodiments in which the dielectric material(s) for the at least one dielectric layer are photo-imageable, the material(s) may be photo-imaged (or photo-patterned) and developed to reveal a desired pattern of openings in the dielectric layer. The dielectric material(s) may be curtain-coated, spin-coated or screen-applied, or supplied as dry film, for example.

In one embodiment, the joining layer is fabricated through a process including drilling or otherwise forming openings or thru-holes in the dielectric layer(s). The joining layer may be capable of forming a containment structure between an interposer and a PCB or substrate as part of a larger multilayered circuitized substrate, for example. Thru-holes in the dielectric layer(s) (e.g., an organic insulator) may be positioned or formed such that a superconducting paste may be disposed therein. The paste may include a conventional metal and superconducting metal and/or alloy and be used to form respective superconducting and/or partially superconducting interconnects in the dielectric layer openings. In one embodiment, the interconnects each extend between conventional metal or conventional metal coated conductors in a cryogenic electronic package in which the joining layer is provided (e.g., to provide a conductor-superconductor-conductor coupling arrangement). In one embodiment, the superconducting paste is substantially constrained during lamination, for example, while the openings in the dielectric layer(s) surround the interconnects formed from the paste, without adversely affecting the superconducting and/or partially superconducting connection formed.

Referring to FIGS. 1-5, example cryogenic electronic packages according to the disclosure and example interconnect structures which may be used in the cryogenic electronic packages are shown. It should be appreciated that the example cryogenic electronic packages described below (e.g., 100, shown in FIG. 1) are but several of many potential configurations of cryogenic electronic packages in accordance with the concepts, systems, circuits and techniques described herein. Additionally, it should be appreciated that the example interconnect structures described below (e.g., 2170, shown in FIG. 1B) are but several of many representative interconnect structures which may be used in the cryogenic electronic packages.

Referring to FIG. 1, a first example cryogenic electronic package 100 according to the disclosure includes a first superconducting multi-chip module (SMCM) 110 and a superconducting interposer 120. The cryogenic electronic package 100 also includes a second SMCM 130 and a superconducting and/or conventional (i.e., non-superconducting) metal semiconductor structure 140. First SMCM 110, interposer 120, second SMCM 130 and superconducting and/or conventional metal semiconductor structure 140 each have first and second opposing surfaces and may include one or more electrical connections (not shown) disposed between the first and second surfaces.

Interposer 120 has a surface (e.g., a first surface) disposed over and coupled to a surface (e.g., a second surface) of the first SMCM 110. Additionally, second SMCM 130 has a surface (e.g., a first surface) disposed over and coupled to a surface (e.g., a second surface) of interposer 120. Further, superconducting semiconductor structure 140 has a surface (e.g., a first surface) disposed over and coupled to a surface (e.g., a second surface) of the second SMCM 130.

In the illustrated embodiment, interposer 120 is coupled to first SMCM 110 through interconnect structures 150, 150', 150'', 150''', 150''''. Additionally, in the illustrated embodiment, second SMCM 130 is coupled to interposer 120 through an adhesive layer (or rework) 160. Further, in the illustrated embodiment, superconducting semiconductor structure 140 is coupled to second SMCM 130 through interconnect structures 170, 170', 170'', 170''', 170''''.

In particular, interconnect structures 150, 150', 150'', 150''', 150'''' are disposed between respective surfaces of interposer 120 and first SMCM 110. The interconnect structures 150, 150', 150'', 150''', 150'''' may electrically couple one or more electrical connections in interposer 120 to one or more electrical connections in first SMCM 110. An adhesive layer 160 is disposed between respective surfaces of second SMCM and interposer 120. The adhesive layer 160 may electrically couple one or more electrical connections in second SMCM 130 to one or more electrical connections in interposer 120. Interconnect structures 170, 170', 170'', 170''', 170'''' are disposed between respective surfaces of superconducting semiconductor structure 140 and second SMCM 130. The interconnect structures 170, 170', 170'', 170''', 170'''' may electrically couple one or more electrical connections in superconducting semiconductor structure 140 to one or more electrical connections in second SMCM 130.

In embodiments, interconnect structures 150, 150', 150'', 150''', 150'''' used to couple interposer 120 to first SMCM 110 are superconducting and/or partially superconducting interconnect structures. The superconducting and/or partially superconducting interconnect structures may include one or more superconducting and/or partially superconducting materials (e.g., Indium (In) or Niobium (Nb)).

Additionally, in embodiments the interconnect structures 150, 150', 150'', 150''', 150'''' may form a ball grid array (BGA) assembly, a land grid array (LGA) assembly or another type of assembly on at least one of the first SMCM 110 and interposer 120. The interconnect structures 150, 150', 150'', 150''', 150'''' may also take the form of pillars (e.g., a solder coated copper (Cu) pillars), for example.

In one embodiment, first SMCM 110 and interposer 120 each have an associated semiconductor package pitch, and the interconnect structures 150, 150', 150'', 150''', 150'''' each have one or more characteristics (e.g., dimensions and/or materials) selected in accordance with the package pitch. For example, in one embodiment, the size and shape of the interconnect structures 150, 150', 150'', 150''', 150'''' may be selected to achieve a desired pitch (e.g., a pitch requirement of first SMCM 110 and/or interposer 120). Additionally, the size and shape of the interconnect structures 150, 150', 150'', 150''', 150'''' may be selected to achieve a first predetermined spacing or gap G1 between first SMCM 110 and interposer 120. The gap G1 may be selected, for example, to achieve a predetermined resistance and/or a predetermined inductive coupling (e.g., a relatively "low" resistance) between first SMCM 110 and interposer 120.

The interconnect structures 170, 170', 170'', 170''', 170'''' used to couple superconducting semiconductor structure 140 to second SMCM 130, similar to interconnect structures 150, 150', 150'', 150''', 150'''', may be superconducting and/or partially superconducting interconnect structures. Additionally, the interconnect structures 170, 170', 170'', 170''', 170'''', similar to interconnect structures 150, 150', 150'', 150''', 150'''', may form a BGA assembly, a LGA assembly or another type of assembly on at least one of the second SMCM 130 and superconducting semiconductor structure 140. In one embodiment, second SMCM 130 and superconducting semiconductor structure 140 each have an associated semiconductor package pitch, and the interconnect structures 170, 170', 170'', 170''', 170'''' each have one or more characteristics selected in accordance with the package pitch. The size and shape of the interconnect structures 170, 170', 170'', 170''', 170'''' may, for example, be selected to achieve a second predetermined spacing or gap G2 between second SMCM 130 and superconducting semiconductor structure 140. The gap G2 may be the same as or similar to gap G1 in some embodiments. Additionally, the gap G2 may be different from gap G1 in other embodiments.

For example, interconnect structures 150, 150', 150'', 150''', 150'''' may have first dimensions and a first pad pitch to achieve the gap G1 between first SMCM 110 and interposer 120. Additionally, interconnect structures 170, 170', 170'', 170''', 170'''' may have second dimensions and a second pad pitch to achieve the gap G2 between second SMCM 130 and superconducting semiconductor structure 140. The second dimensions of interconnect structures 170, 170', 170'', 170''', 170'''' may be substantially less than the first dimensions of interconnect structures 150, 150', 150'', 150''', 150''''. Additionally, the second pad pitch of interconnect structures 170, 170', 170", 170''', 170'''' may be substantially less than the first pad pitch of interconnect structures 150, 150', 150", 150''', 150''''. Further aspects of interconnect structures which may be used in cryogenic electronic packages according to the disclosure (e.g., 1150, shown in FIG. 1A) are discussed further in connection with FIGS. 1A-1C below.

In embodiments, the adhesive layer 160 used to couple second SMCM 130 to interposer 120 is a superconducting and/or partially superconducting adhesive layer. The superconducting and/or partially superconducting adhesive layer (e.g., an electrically superconducting adhesive layer and/or an anisotropic superconducting adhesive layer) may include one or more superconducting and/or partially superconducting glues, pastes, epoxies and adhesive tapes. In one embodiment, second SMCM 130 has one or more conventional and/or superconducting metal based through silicon vias (TSVs) and uses an anisotropic adhesive (e.g., 160) to electrically interconnect second SMCM 130 to interposer 120. In another embodiment, second SMCM 130 has one or more through vias and/or micro vias and/or blind vias and uses conventional and/or superconducting metal based adhesives (e.g., 160) to electrically interconnect second SMCM 130 to interposer 120.

In one embodiment, at least one of the first SMCM 110 and the second SMCM 130 is a silicon (Si) based SMCM. For example, the first SMCM 110 may fabricated on a Si wafer (e.g., a 4-layer niobium (Nb) based superconducting substrate) through a Nb based integrated circuit (IC) fabrication process appropriate for integrating superconducting semiconductor structures or chips. The Nb based IC fabrication process may include fabricating a plurality of vias (e.g., superconducting vias), with the vias including a plurality (e.g., four) of metal (e.g., Nb) layers. The Nb based IC fabrication process may also include fabricating a plurality of superconducting lines, and coupling the superconducting lines together through one or more of the vias. In one embodiment, the superconducting lines and interconnect structures (and interconnect pads and TSV structures described in figures below) include Nb. In another embodiment, the superconducting lines (and interconnect pads and TSV structures) include Nb and the interconnect structures include one or more nitride materials and/or Nb. The superconducting lines may, for example, be spaced apart from each other by a superconducting line space (e.g., a silicon oxide dielectric fabricated by a plasma-enhanced chemical vapor deposition (PECVD) process). In one embodiment, the superconducting lines have a minimum diameter or length of between about 0.6 μm and about 1 μm, the superconducting line space is between about 1 μm and about 2 μm, and the vias have a minimum diameter or length of between about 1.5 μm and about 2.5 μm.

Additionally, in one embodiment at least one of the first SMCM 110 and the second SMCM 130 is an organic SMCM (or a superconducting circuitized substrate). In embodiments in which the second SMCM 130 is an organic SMCM, for example, the second SMCM 130 may be coupled to the interposer 120 using flip-chip bonding techniques. Additionally, in embodiments in which the second SMCM 130 is an organic SMCM, it may be possible to eliminate interposer 120 and adhesive layer 160 and to couple (e.g., directly couple) the second SMCM 130 to the first SMCM 110 through one or more interconnect structures (e.g., 150).

Further, in one embodiment first SMCM 110, second SMCM 130 and interposer 120 each include Nb and/or NbTiN and/or TiN (or other superconducting material) based lines, pads and interconnects. In embodiments, such may provide for the SMCMs and interposer functioning as superconducting semiconductor structures (i.e., SMCMs and a superconducting interposer) when operating at or below a temperature of about 4.2 Kelvin (K), for example.

In embodiments, the superconducting semiconductor structure 140 is or includes a single flux quantum (SFQ) IC or chip, for example, a rapid single flux quantum (RSFQ) chip or an efficient rapid single flux quantum (ERSFQ) chip. The SFQ IC may be or include a multi-layer (e.g., an 8-layer) Nb based SFQ IC. Additionally, in embodiments, the superconducting semiconductor structure 140 may be or include a reciprocal quantum logic (RQL) chip, a adiabatic quantum flux parametron (AQFP) chip or a complementary metal-oxide-semiconductor (CMOS) chip or a qubit chip.

In one embodiment, the superconducting semiconductor structure 140 includes one or more superconducting components. The superconducting components can include shunted or unshunted Josephson junctions (JJs) and resistors. The superconducting components can also include multiple different sized JJs, capacitors, inductors, for example, as may be used for fabricating superconducting resonators and/or parts of one or more superconducting resonators. In embodiments, the JJs are oxide coated JJs which are fabricated using a same oxide layer (or at least part of an oxide layer) as is used, for example, to create capacitors (e.g., embedded and/or integrated capacitors) of the superconducting components.

In embodiments, first SMCM 110, interposer 120, second SMCM 130 and superconducting semiconductor structure 140 include one or more interconnect pads or under bump metal (UBM) pads (not shown). The pads (e.g., 1111, shown in FIG. 1A, as will be discussed) may be disposed over at least one of the first and second surfaces of the first SMCM 110, interposer 120, second SMCM 130 and superconducting semiconductor structure 140 (e.g., for coupling to the interconnect structures).

Additionally, in embodiments first SMCM 110, interposer 120, second SMCM 130 and superconducting semiconductor structure 140 of cryogenic electronic package 100 are bonded or otherwise coupled using chip-scale and/or wafer-scale bonding techniques. For example, in embodiments in which chip-scale bonding techniques are used, the first SMCM 110, interposer 120, second SMCM 130 and superconducting semiconductor structure 140 may be individually coupled together, for example, in a series of processes. For example, interposer 120 may be coupled to first SMCM 110 in a first process, second SMCM 130 may be coupled to interposer 120 in a second process, and superconducting semiconductor structure 140 may be coupled to second SMCM 130 in a third process.

In embodiments, the first, second and third processes may be performed sequentially. Additionally, in embodiments one or more of the first, second and third processes may be performed in parallel (i.e., at substantially the same time). Further, in embodiments the processes may enable repair and/or replacement of one or more portions (e.g., superconducting semiconductor structure 140) of the cryogenic electronic package 100. An example method 600 for fabricating a cryogenic electronic package (e.g., cryogenic electronic package 100, shown in FIG. 1) is described further below in connection with FIG. 6.

With the above-described coupling arrangement of cryogenic electronic package 100, the superconducting semiconductor structure 140 and second SMCM 130 are electrically coupled to the first SMCM 110 through the interposer 120 (e.g., a "fan-out" layer). The interposer 120 may, for example, provide for increased connectivity complexity (e.g., compared to cryogenic packages not including an interposer) by distributing electrical signals to/from the first SMCM 110 and the second SMCM 130 and the superconducting semiconductor structure 140. The electrical signals, which may contain information or data, for example, may be distributed through conductive structures (not shown) or impedance lines (not shown) in the interposer 120.

The interposer 120 may also route and/or redistribute power and ground connections of the first SMCM 110 to the second SMCM 130 and the superconducting semiconductor structure 140. Such may, for example, enable interposer 120 to maximize use of the surface of the first SMCM 110 over which the interposer 120 is disposed (e.g., due to interposer 120 reducing a need for circuitry and connections for routing, distributing and/or redistributing signals and connections). This way it is possible to miniaturize first SMCM 110 (i.e., provide a first SMCM with a reduced surface area). The interposer 120 may also provide electrical isolation between first SMCM 110 and second SMCM 130. For example, in one embodiment first SMCM 110 and second SMCM 130 each have active circuits and interposer 120 provides electrical isolation between the active circuits on the first SMCM 110 and second SMCM 130.

Additionally, in one aspect of the disclosure, by providing interposer 120 between first SMCM 110 and other semiconductor structures of cryogenic electronic package 100 (e.g., second SMCM 130), an increased number of SMCMs and superconducting semiconductor structures (e.g., superconducting ICs) may be coupled to first SMCM 110 than would otherwise be possible without the interposer 120. The foregoing may, for example, lead to the cryogenic electronic package 100 having an increased density of SMCMs and superconducting ICs (e.g., within a given surface area of first SMCM 110) in comparison to conventional cryogenic electronic packages. Such may also result in cryogenic systems including the cryogenic electronic package 100 occupying less space (i.e., physical space) than cryogenic systems including conventional cryogenic electronic packages which have a reduced density of superconducting ICs and SMCMs.

Further, such may result in cryogenic systems including the cryogenic electronic package 100 requiring a reduced amount of cryogenic cooling than cryogenic systems including conventional cryogenic electronic packages (e.g., due to the cryogenic electronic package 100 occupying less space than conventional cryogenic electronic packages). For example, in embodiments in which cryogenic systems including the cryogenic electronic package 100 (or other cryogenic electronic packages according to the disclosure) operate in cryogenic refrigerants (e.g., liquid Helium) and use liquid cooling, the cryogenic systems may not need separate thermal management systems, as may be required for cryogenic systems including conventional cryogenic electronic packages.

While cryogenic electronic package 100 is shown as including two SMCMs (here, first and second SMCMs 110, 130) and one superconducting semiconductor structure (here superconducting semiconductor structure 140) in the illustrated embodiment, it should be appreciated that the cryogenic electronic package 100 may include more than two SMCMs and one superconducting semiconductor structure in some embodiments. For example, cryogenic electronic package 100 may include more than two SMCMs and more than one superconducting semiconductor structure in some embodiments by disposing or otherwise providing additional interposers (e.g., 1220, shown in FIG. 2A) on first SMCM 110 of cryogenic electronic package 100. Additionally, the cryogenic electronic package 100 may include more than two SMCMs and more than one superconducting semiconductor structure in some embodiments by having an interposer and/or an SMCM (e.g., a first SMCM) that is capable of supporting more than two SMCMs and one superconducting semiconductor structure. The interposer (e.g., 2220, shown in FIG. 2B) may, for example, have a larger surface area than that which is shown for interposer 120.

Further aspects of the concepts, systems, circuits and techniques sought to be protected herein, with particular emphasis on cryogenic electronic packages and the interconnect structures used in cryogenic electronic packages, are described in connection with the figures below.

Figure 1A:
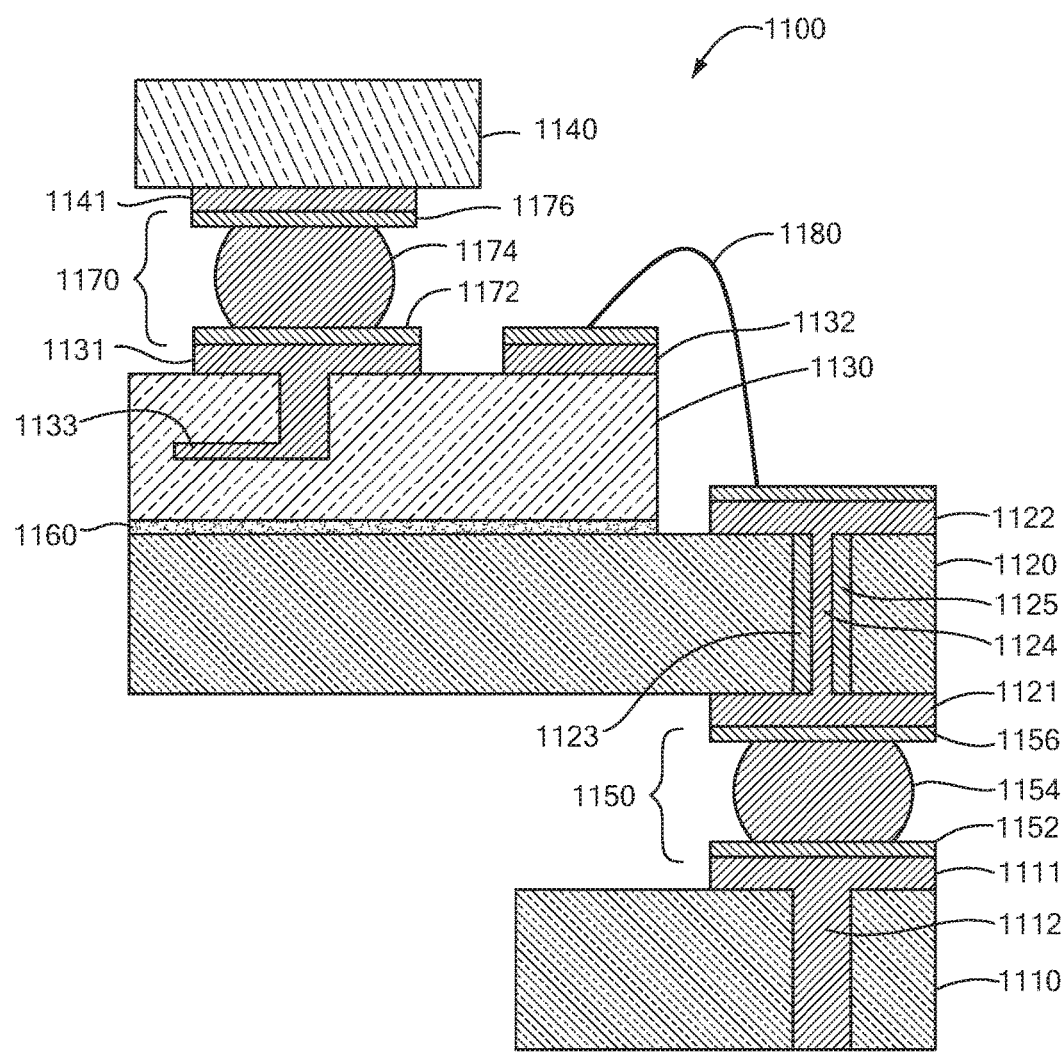
FIG. 1A shows a cross-section of an example cryogenic electronic package in accordance with an embodiment of the disclosure.

Referring to FIG. 1A, a cross-section of an example cryogenic electronic package 1100 according to the disclosure is shown. Cryogenic electronic package 1100 includes a first SMCM 1110, a superconducting interposer 1120, a second SMCM 1130 and a superconducting semiconductor structure 1140. Cryogenic electronic package 1100 also includes a first interconnect structure 1150 (e.g., a superconducting or partially superconducting interconnect) for electrically and mechanically coupling the interposer 1120 to the first SMCM 1110. Cryogenic electronic package 1100 additionally includes a second interconnect structure 1170 (e.g., a superconducting or partially superconducting interconnect) for electrically and mechanically coupling the superconducting semiconductor structure 1140 to the second SMCM 1130.

First SMCM 1110, which may be the same as or similar to first SMCM 110 of FIG. 1, has first and second opposing surfaces and includes an interconnect pad 1111 (e.g., a niobium (Nb) pad) which also has first and second opposing surfaces. Interconnect pad 1111 has a surface (e.g., a first surface) disposed over a selected portion of the second surface of first MCM 1110. First SMCM 1110 also includes a through silicon via (TSV) 1112 (e.g., a superconducting and/or partially superconducting TSV) which is disposed in a cavity formed between the surface (e.g., the first surface) of interconnect pad 1111 and the first surface of first MCM 1110. TSV structure 1112 includes one or more superconducting and/or partially superconducting materials (e.g., Nb) and is electrically coupled to the surface of interconnect pad 1111.

Interposer 1120, which may be the same as or similar to interposer 120 of FIG. 1, has first and second opposing surfaces and includes interconnect pads 1121, 1122 (e.g., Niobium (Nb) pads) which also have first and second opposing surfaces. Interconnect pad 1121 has a surface (e.g., a first surface) disposed over a selected portion of the first surface of interposer 1120. Additionally, interconnect pad 1122 has a surface (e.g., a first surface) disposed over selected portions of the second surface of interposer 1120.

Interposer 1120 also includes a TSV structure (e.g., a superconducting and/or a partially superconducting TSV structure) including a first pad interconnect 1123, a through via 1124 and a second pad interconnect 1125. The first pad interconnect 1123 extends from a first selected portion of the surface (e.g., the first surface) of interconnect pad 1121 to a first selected portion of the surface (e.g., the first surface) interconnect pad 1122. Additionally, the second pad interconnect 1125 extends from a second selected portion of the surface of interconnect pad 1121 to a second selected portion of the surface of interconnect pad 1122. TSV 1124 is disposed in a cavity formed between the first and second pad interconnects 1123, 1125. Additionally, TSV 1124 is electrically coupled to the surfaces (e.g., the first surfaces) of each of interconnect pads 1121, 1122.

The first pad interconnect 1123, through via 1124 and second pad interconnect 1125 may include one or more superconducting and/or partially superconducting materials. For example, first pad interconnect 1123, through via 1124 and second pad interconnect 1125 may include single and/or multiple superconducting materials or multiple layers of superconducting materials. Additionally, the first pad interconnect 1123, through via 1124 and second pad interconnect 1125 may include a combination of titanium-titanium nitride-tungsten materials, titanium-titanium nitride-high Q materials-tungsten, titanium-titanium nitride-high Q materials and/or titanium-high Q materials-tungsten, high Q materials-tungsten and/or high Q materials. Examples of high Q materials include TiN, NbTiN, Nb and Al. The first pad interconnect 1123, through via 1124 and second pad interconnect 1125 may also include single and/or multiple superconducting materials or multiple layers of high Q materials. The superconducting and high Q materials may exist in single material phase and/or in a composition of material phases such that the materials react with each other (e.g., during fabrication of the TSV structure) to create a new lattice and/or modify lattice parameters.

Second SMCM 1130, which may be the same as or similar to second SMCM 130 of FIG. 1 in embodiments, has first and second opposing surfaces and includes interconnect pads 1131, 1132 (e.g., Niobium (Nb) pads) which also have first and second opposing surfaces. Interconnect pad 1131 has a surface (e.g., a first surface) disposed over a first selected portion of the second surface of second MCM 1130. Additionally, interconnect pad 1132 has a surface (e.g., a first surface) is disposed over a second selected portion of the second surface of second MCM 1130.

Second SMCM 1130 also includes a conductive structure 1133 (e.g., a via) disposed between selected portions of the first and second surfaces of the second MCM 1130. In the illustrated embodiment, conductive structure 1133 is electrically coupled to interconnect pad 1131. The conductive structure 1133 may also be coupled to one or more electrical connections or components (not shown) of second SMCM 1130 in embodiments.

Superconducting semiconductor structure 1140, which may be the same as or similar to superconducting semiconductor structure 140 of FIG. 1 in embodiments, has first and second opposing surfaces and includes an interconnect pad 1141 which also has first and second opposing surfaces. Interconnect pad 1141 has a surface (e.g., a first surface) disposed over a selected portion of the first surface of superconducting semiconductor structure 1140. Additionally, interconnect pad 1141 may be electrically coupled to one or more electrical connections or components of superconducting semiconductor structure 1140 in embodiments.

In the illustrated embodiment, superconducting semiconductor structure 1140 and second SMCM 1130 are coupled to first SMCM 1110 through interposer 1120. In particular, first MCM 1110 is coupled to interposer 1120 through interconnect structure 1150. Additionally, the interposer 1120 is coupled to second MCM 1130 through an adhesive layer 1160 (e.g., an insulating or a conducting insulating layer). The interposer 1120 is also coupled to second MCM 1130 through a wire bonding structure 1180 (e.g., a superconducting and/or a partially superconducting wire bonding structure). Further, second MCM 1130 is coupled to superconducting semiconductor structure 1140 through interconnect structure 1170.

Wire bonding structure 1180 has a first portion coupled to a surface (e.g., a second surface) of interconnect pad 1122 of interposer 1120. Additionally, wire bonding structure 1180 has a second opposing portion coupled to a surface (e.g., a second surface) of interconnect pad 1132 of second SMCM 1130. In embodiments, wire bonding structure 1180 is a conventional wire bonding structure including one or more non-superconducting materials (e.g., Copper (Cu)). Additionally, in embodiments wire bonding structure 1180 may be a superconducting or partially superconducting wire bonding structure including one or more superconducting or partially superconducting materials (e.g., Nb).

Interconnect structures 1150, 1170 each have first and second opposing surfaces and include a plurality of interconnect sections (here, three sections (e.g., 1152, 1154, 1156)). Interconnect structures 1150, 1170 may also include one or more superconducting or partially superconducting materials. Example materials and material compositions of the interconnect structures 1150, 1170 include: (40-400) nm Al-(5-20) nm Ti-(10-50) nm Pt-(40-200) nm Au-(1-5)μm In-(40-400) nm Au-(10-50) nm Pt-(5-20) nm Ti-(40-400) nm Al, (40-400) nm Al-(5-20) nm Ti-(10-50) nm Pt-(40-200) nm Au-(1-3)μm In-(1-3)μm Sn-(40-400) nm Au-(10-50) nm Pt-(5-20) nm Ti-(40-400) nm Al, (40-400) nm Al-(5-20) nm Ti-(100-1000) nm Sn-(1-5)μm In-(100-1000) nm Sn-(5-20) nm Ti-(40-400) nm Al.

Interconnect structure 1150 has a surface (e.g., a first surface) coupled to a respective surface (e.g., a second surface) of interconnect pad 1111 of first SMCM 1110. Additionally, interconnect structure 1150 has an opposing surface (e.g., a second surface) coupled to a respective surface (e.g., a second surface) of interconnect pad 1121 of interposer 1120. Interconnect structure 1150 includes a first section 1152 (e.g., a pillar) having first and second opposing surfaces, with the first surface of first section 1152 corresponding to the first surface of interconnect structure 1150. Interconnect structure 1150 also includes a second section 1544 (e.g., a solder ball, sphere, or micro-bump) having first and second opposing portions. The first portion of interconnect structure 1150 disposed over the second surface of first section 1152. Interconnect structure 1150 further includes a third section 1546 (e.g., a pillar) having first and second opposing surfaces. The first surface of third section 1546 is disposed over the second portion of second section 1154. Additionally, the second surface of third section 1546 corresponds to the second surface of interconnect structure 1540 in the illustrated embodiment.

In one embodiment, before coupling or bonding of interconnect structure 1150 to first SMCM 1110 and interposer 1120, first section 1152 and third section 1156 of interconnect structure 1150 each have a substantially larger surface area than second section 1154 (e.g., such that first and second sections 1152, 1156 may coat the second section 1154 during coupling). Additionally, in one embodiment, first section 1152 and third section 1156 are under bump metal (UBM) structures or conductive structures coupled to interconnect pads 1111 and 1121, respectively.

Referring now to second interconnect structure 1170, interconnect structure 1170 has a surface (e.g., a first surface) coupled to a respective surface (e.g., a second surface) of interconnect pad 1131 of second SMCM 1130. Additionally, interconnect structure 1170 has an opposing surface (e.g., a second surface) coupled to a respective surface (e.g., a second surface) of interconnect pad 1141 of superconducting semiconductor structure 1140.

Interconnect structure 1170 includes a first section 1172 (e.g., a pillar) having first and second opposing surfaces, with the first surface of first section 1172 corresponding to the first surface of interconnect structure 1170. Interconnect structure 1170 also includes a second section 1554 (e.g., a solder ball, sphere, or micro-bump) having first and second opposing portions. The first portion of second section 1554 is disposed over the second surface of first section 1172. Interconnect structure 1170 further includes a third section 1546 (e.g., a pillar) having first and second opposing surfaces. The first surface of third section 1546 is disposed over the second portion of second section 1174. Additionally, the second surface of third section 1546 corresponds to the second surface of interconnect structure 1170 in the illustrated embodiment.

First SMCM 1110, interposer 1120, second SMCM 1130 and superconducting semiconductor structure 1140 may be coupled together through a coupling (i.e., bonding) process to form cryogenic electronic package 1100. In particular, during the coupling process, interconnect structure 1150 may melt and form an electrical connection between interconnect pads 1111, 1121 of SMCM 1110 and interposer 1120, respectively. Additionally, during the coupling process, interconnect structure 1170 may melt and form an electrical connection between interconnect pads 1131, 1141 of second SMCM 1130 and superconducting semiconductor structure 1140, respectively.

In one embodiment, at least one of interconnect structures 1150 and 1170 includes an UBM and/or a superconducting bump and/or a conventional bump. For example, first section 1152 and/or third section 1156 of interconnect structure 1150 are UBM structures, as discussed above. Further, in one embodiment, at least one of interconnect structures 1150 and 1170 includes a superconducting UBM-superconducting bump-superconducting UBM structure and/or a conventional UBM-superconducting bump-conventional UBM structure and/or a superconducting UBM-conventional bump-superconducting UBM structure, or a combination thereof.

Further, in one embodiment, the size, shape and/or materials of at least one of the interconnect structures 1150, 1170 is selected to achieve a desired pitch (e.g., a pitch requirement of first SMCM 1110 or interposer 1120).

In embodiments, FIG. 1A illustrates an example fan-out approach in which two SMCMs (here, 1110 and 1130) are coupled with each other using an interposer (here, 1120). In embodiments, both or at-least one of the SMCMs (e.g., 1130) do not have a TSV. In the illustrated embodiment, interposer 1120 redistributes wirebonding connections in such a way that it uses real estate underneath of second SMCM 1130 to form an electrical connection with first SMCM 1110. Interposer 1120 has one or more dimensions which are larger than like dimensions of the SMCM 1130 in the illustrated embodiment. SMCM 1110 can be smaller and/or larger and/or a same size as interposer 1120 in embodiments.

Additional aspects of interconnect structures according to the disclosure are described in connection with FIGS. 1B and 1C below.

Figure 1B:
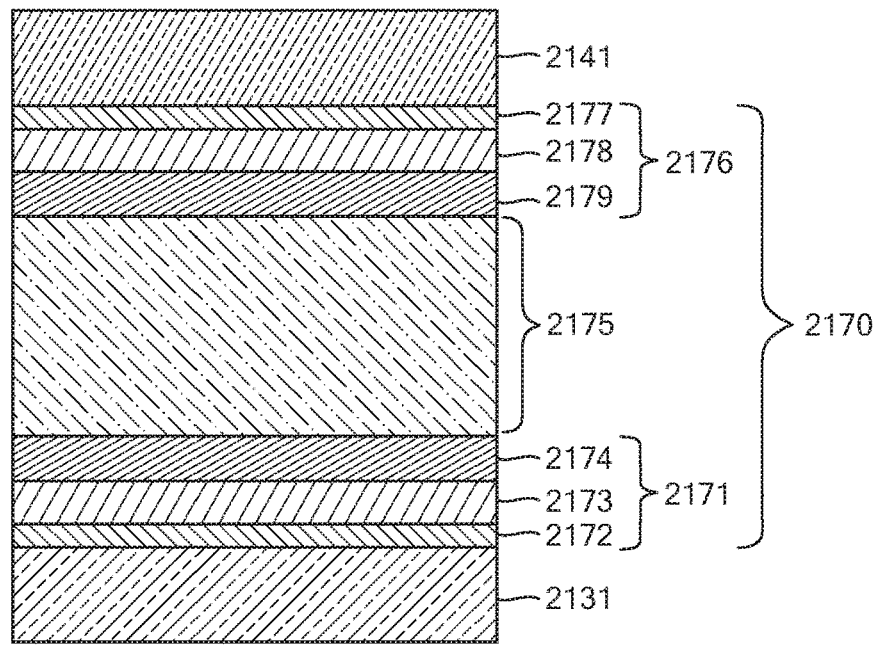
FIGS. 1B and 1C show cross-sections of example interconnect structures as may be used in the cryogenic electronic package of FIG. 1A, for example.

Referring to FIG. 1B, a cross-section of an example interconnect structure 2170 (e.g., a superconducting or partially superconducting interconnect structure) according to the disclosure is shown. The interconnect structure 2170 is coupled interconnect pads 2131, 2141. In embodiments, the interconnect pads 2131, 2141 may be interconnect pads of respective semiconductor structures (e.g., second SMCM 1130 and superconducting semiconductor structure 1140) in a cryogenic electronic package (e.g., 1100, shown in FIG. 1A). Additionally, in embodiments interconnect structure 2170 may be used to couple (e.g., electrically and/or mechanically couple) the respective semiconductor structures together.

Referring in closer detail to FIG. 1B, interconnect pads 2131, 2141 each have first and second opposing surfaces and include one or more superconducting materials (e.g., Niobium (Nb)). Interconnect pad 2131 may have a surface (e.g., a first surface) disposed over a selected portion or surface of a first respective semiconductor structure (e.g., second SMCM 1130, shown in FIG. 1A). Additionally, interconnect pad 2141 may have a surface (e.g., a second surface) disposed over a selected portion or surface of a second respective semiconductor structure (e.g., first superconducting semiconductor structure 1140, shown in FIG. 1A). Interconnect pads 2131, 2141 may each be coupled to one or more electrical connections or components (i.e., circuitry) of the respective semiconductor structures.

Interconnect structure 2170, which is shown as disposed between interconnect pads 2131, 2141 in the illustrated embodiment, has a first surface coupled to interconnect pad 2131 and a second, opposing surface coupled to interconnect pad 2141. The interconnect structure 2170 also includes a plurality of sections (here, three sections 2171, 2175, 2176). Selected ones of the sections (here, sections 2171 and 2176) include a plurality of layers (e.g., metal or alloy layers, as will be discussed).

In the example embodiment shown, a first one of the sections (also sometimes referred to herein as a "first section") 2171, which may be the same as or similar to first section 1172 of interconnect structure 1170 of FIG. 1A, has first and second opposing surfaces. The first section 2171 includes a first conductive layer 2172, a second conductive layer 2173 and a third conductive layer 2174. The first conductive layer 2172 has first and second opposing surfaces, with the first surface corresponding to the first surface of the first section 2171. Additionally, the second conductive layer 2173 has first and second opposing surfaces, with the first surface disposed over the second surface of the first conductive layer 2172. Further, the third conductive layer 2174 has first and second opposing surfaces, with the first surface disposed over the second surface of the second conductive layer 2173 and the second surface of third conductive layer 2174 corresponding to the second surface of the first section 2171. The first surface of the first section 2171 corresponds to the first surface of interconnect structure 2170 in the illustrated embodiment.

The first conductive layer 2172 is provided from one or more first electrically conductive materials (e.g., Titanium (Ti)). Additionally, the second conductive layer 2173 is provided from one or more second electrically conductive materials (e.g., Platinum (Pt)). Further, the third conductive layer 2174 is provided from one or more third electrically conductive materials (e.g., Gold (Au)).

In one embodiment, the first, second and third electrically conductive materials each include a different, respective metal or alloy material or combination of materials (i.e., first section 2171 has a multiple melt composition). As one example, the first conductive material may include a material (e.g., Ti, Pb) having a first melting point, the second conductive material may include a material (e.g., Pt, Sn) having a second melting point, and the third conductive material may include a material (e.g., Au, In) having a third melting point. It is possible that interfaces of the conductive materials react with each other during a bonding and or a post bonding process.

A second one of the sections (also sometimes referred to herein as a "second section") 2175, which may be the same as or similar to second section 1174 of interconnect structure 1170 of FIG. 1A, has first and second opposing portions. The first portion of second section 2175 is disposed over the second surface of first section 2171. The second section 2175 includes one or more fourth electrically conductive materials (e.g., Indium (In)). In embodiments, the second section 2175 may be provided as a solder ball, sphere, pillar, or micro-bump.

A third one of the sections (also sometimes referred to herein as a "third section") 2176, which may be the same as or similar to third section 1776 of interconnect structure 1170 of FIG. 1A, has first and second opposing surfaces. The third section 2176 includes a first conductive layer 2177, a second conductive layer 2178 and a third conductive layer 2179. The first conductive layer 2177, which may be the same as or similar to first conductive layer 2172 of first section 2171, has a first surface disposed over the first surface of interconnect pad 2141 and a second opposing surface. Additionally, the second conductive layer 2178, which may be the same as or similar to second conductive layer 2173 of first section 2171, has a first surface disposed over the second surface of first layer 2177 and a second opposing surface. Further, the third conductive layer 2179, which may be the same as or similar to third conductive layer 2174 of first section 2171, has a first surface disposed over the second surface of second layer 2178 and a second opposing surface. The first surface of the first layer 2177 corresponds to the first surface of third section 2176 and the second surface of third layer 2179 corresponds to the second surface of third section 2176. The second surface of the third section 2176 corresponds to the second surface of the interconnect structure 2170 in the illustrated embodiment.

In embodiments, interconnect pads 2131, 2141 are coupled together via interconnect structure 2170 through a coupling process. During the coupling process, the interconnect structure 2170 may, for example, melt and/or soften and/or deform to form an electrical connection (e.g., a "low" resistance electrical connection) between interconnect pad 2131 and interconnect pad 2141. In particular, during the coupling process, a plurality of melt interfaces or surfaces may form between first and second sections 2171, 2175 of interconnect structure 2170 and interconnect pad 2131 to produce an electrical connection between interconnect structure 2170 and interconnect pad 2131. Additionally, during the coupling process, a plurality of melt interfaces may form between second and third sections 2175, 2176 of interconnect structure 2170 and interconnect pad 2141 to produce an electrical connection between interconnect structure 2170 and interconnect pad 2141.

In one embodiment, the melt interfaces form due to the interconnect structure sections 2171, 2175, 2176, and portions thereof (e.g., conductive layers 2172, 2173, 2174), melting at plurality of different temperatures. For example, conductive layers 2172, 2173, 2174 of first section 2171 and the second section 2175 may each melt at respective, different temperatures during the coupling process due to the layers and sections including materials having different melting points. Such multi-melt interface may, for example, provide for a more robust electrical connection than conventional electrical connections. Additionally, such multi-melt interface may provide for the ability to decouple and recouple the interconnect structure 2170 to interconnect pad 2131 if rework is required during assembly of a cryogenic electronic package including interconnect structure 2170 and interconnect pad 2131. In some embodiments, conductive layer 2179 may react with second section 2175 and conductive layer 2174 may react with second section 2175 at the interface and create a lower melt interface than the individual metal(s) and/or alloys of conductive layer 2179, second section 2175, and conductive layer 2174. Such may provide for a more robust interconnect at lower bonding temperature(s) than individual element melt temperature(s).

While first section 2171 and third section 2176 of interconnect structure 2170 are shown and described as having a same number of layers in the illustrated embodiment (e.g., in which these sections act as under bump metals (UBMs)), it should be appreciated that first section 2171 and third section 2176 may include a different number of layers in some embodiments.

Additionally, while certain layers (e.g., 2172) of first section 2171 are shown and described as being substantially the same as certain layers (e.g., 2177) of third section 2176 in the illustrated embodiment, it should be appreciated that these layers of the first section 2171 may have one or more different characteristics (e.g., dimensions, materials, etc.) from the layers of the third section 2176 in some embodiments. Third section 2176 can, for example, act as an under bump metal with many different possible thickness as needed.

It should be appreciated that interconnect structure 2170 may be considered a superconducting interconnect structure or a partially superconducting interconnect structure based upon the materials from which the first, second and third sections 2171, 2175, 2176 are provided. First section 2171 and third section 2176 can, for example, include Aluminum (Al) pads, and include first layers 2172, 2177 with Titanium (Ti), second layers 2173, 2178 with Lead (Pb), and third layers 2174, 2179 with Tin (Sn). Additionally, second section 2175 can include Indium (In). In another embodiment first section 2171, layer 2179 and second section 2175 each include Indium (In). In another embodiment, first section 2171 and layer 2179 each include Sn and second section 2175 includes In or Pb.

Figure 1C:
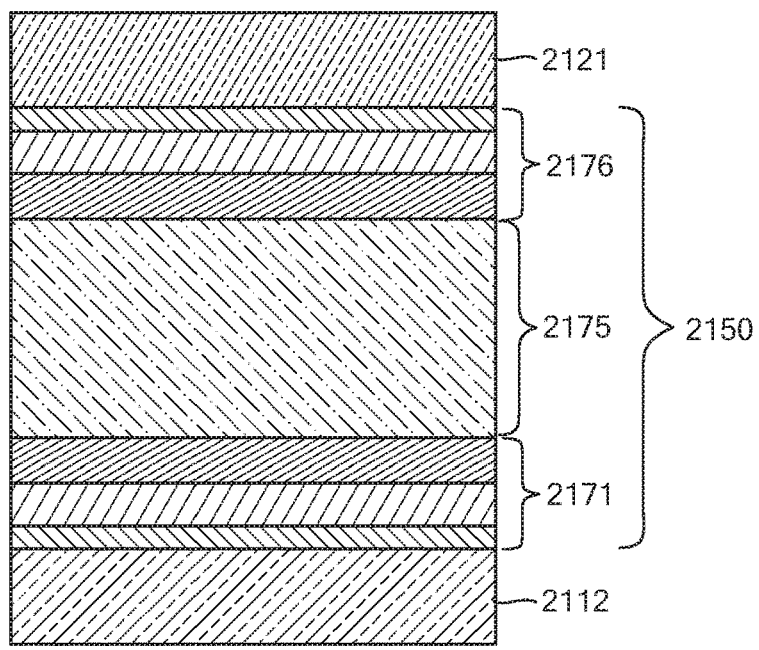

Referring now to FIG. 1C, in which like elements of FIG. 1B are shown having like reference designations, a cross-section of an example interconnect structure 2150 (e.g., a superconducting or partially superconducting interconnect structure) similar to interconnect structure 2170 of FIG. 1B is shown. Additionally, cross-sections of example interconnect pads 2112, 2121 similar to interconnect pads 2131, 2141 of FIG. 1B are shown.

Interconnect structure 2150 has first and second opposing surfaces and includes a first section 2171, a second section 2175 and a third section 2176. The first surface of interconnect structure 2150 is coupled to a respective surface (e.g., a second surface) of interconnect pad 2112. Additionally, the second surface of interconnect structure 2150 is coupled to a respective surface (e.g., a second surface) of interconnect pad 2121.

In embodiments, interconnect pad 2112 corresponds to interconnect pad 1111 of first MCM 1110 shown in FIG. 1A. Additionally, in embodiments interconnect pad 2121 corresponds to interconnect pad 1121 of interposer 1120 shown in FIG. 1A. Further, in embodiments interconnect structure 2150 corresponds to interconnect structure 1150 of cryogenic electronic package 1100 shown in FIG. 1A.

Those of ordinary skill in the art will understand how to select the size, shape and electrically conductive materials of interconnect structures 2150, 2170 for a particular application (e.g., based on pitch and assembly risk sites). For example, interconnect structures 2150, 2170 may have at least one characteristic (e.g., dimensions) selected based upon a package pitch of a semiconductor structure (or semiconductor structures) to which the interconnect structures 2150, 2170 are coupled or otherwise provided.

Figure 2:
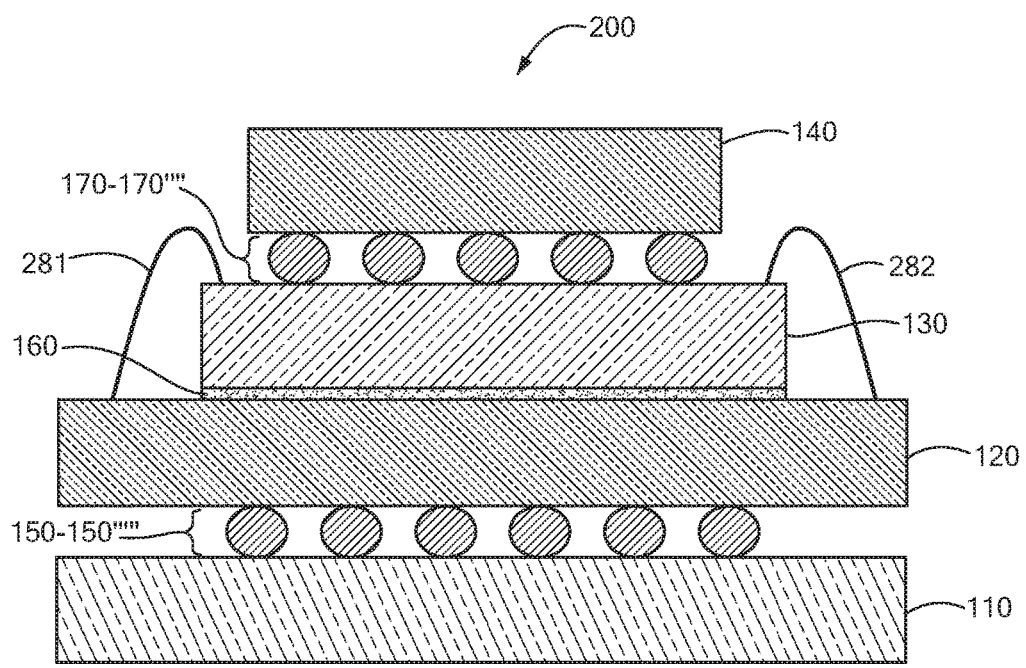
FIGS. 2-2C are block diagrams of example cryogenic electronic packages in accordance with an embodiment of the disclosure.

Referring now to FIG. 2, in which like elements of FIG. 1 are shown having like reference designations, another example cryogenic electronic package 200 is shown. The cryogenic electronic package 200 includes first SMCM 110, interposer 120, second SMCM 130 and superconducting semiconductor structure 140.

Interposer 120 is disposed over and coupled (e.g., electrically and mechanically coupled) to first MCM 110 through interconnect structures 150, 150', 150'', 150''', 150'''', 150'''''. Additionally, second MCM 130 disposed over and coupled to interposer 120 through adhesive layer 160 and through wire bonding structures 281, 282. Further, superconducting semiconductor structure 140 is disposed over and coupled to the second MCM 130 through interconnect structures 170, 170', 170'', 170''', 170''''.

Wire bonding structures 281, 282 each have a first portion coupled to interposer 120. Additionally, wire bonding structures 281, 282 each have a second opposing portion coupled to second SMCM 130. In some embodiments, wire bonding structures 281, 282 are conventional wire bonding structures including one or more non-superconducting materials (e.g., Copper (Cu)). Additionally, in some embodiments wire bonding structures 281, 282 are superconducting or partially superconducting wire bonding structures including one or more superconducting or partially superconducting materials (e.g., Niobium (Nb)).

In cryogenic electronic package 200, adhesive layer 160 may be an electrically conductive adhesive layer in some embodiments and an electrically insulating layer in other embodiments. In embodiments in which adhesive layer 160 is an electrically conductive adhesive layer, for example, superconducting semiconductor structure 140 may be electrically coupled to interposer 120 through interconnect structures 170, 170', 170'', 170''', 170'''', second MCM 130 and at least one of adhesive layer 160 and wire bonding structures 281, 282. Additionally, in embodiments in which adhesive layer 160 is an electrically insulating adhesive layer, superconducting semiconductor structure 140 may be electrically coupled to interposer 120 through interconnect structures 170, 170', 170'', 170''', 170'''', second MCM 130 and wire bonding structures 281, 282.

In embodiments, cryogenic electronic package 200 is fabricated using chip-scale and/or wafer-scale bonding techniques in which interposer 120, second MCM 130 and superconducting semiconductor structure 140 are selectively coupled to first MCM 110. In one aspect of the disclosure, there are multiple possible bonding schemes for fabricating the cryogenic electronic package 200. One example bonding scheme includes: coupling second SMCM 130 to interposer 120 and interposer 120 to first SMCM in a first process, and coupling superconducting semiconductor structure 140 to second SMCM 130 in a second process that occurs after the first process. Another example bonding scheme includes: coupling second SMCM 130 to interposer 120 in a first process, coupling superconducting semiconductor structure 140 to second MCM 130 in a second process, and then coupling the interposer 120 to the first SMCM 110 in a third process. The first and second processes of the second example bonding scheme may occurs sequentially (i.e., one after the other) in some embodiments. Additionally, the first and second processes may occur substantially in parallel (i.e., at the same time) in other embodiments.

While cryogenic electronic package 200 is shown and described as including wire bonding structures 281, 282 for coupling second MCM 130 to interposer 120 in the illustrated embodiment, it should be appreciated that the at least one of wire bonding structures 281, 282 may be replaced with a ribbon and/or a spring bonding structure in some embodiments. The ribbon and/or spring bonding structure may, for example, be a gold and/or aluminum ribbon and/or spring bonding structure.

In one embodiment, interposer 120 has a redistribution layer to redistribute wirebonding I/Os in such a way that it can utilize the real estate underneath of second SMCM 130. Additionally, in one embodiment, interconnects structures 170, 170', 170'', 170''', 170'''' have a pitch which is smaller than a pitch of interconnect structures 150, 150', 150'', 150''', 150'''', 150'''''. For example, in one embodiment interconnect structures 170, 170', 170'', 170''', 170'''' (e.g., bumps) have a diameter of between about 10 micron and about 15 micron and a corresponding pitch of between about 15 micron and about 35 micron, while interconnect structures 150, 150', 150'', 150''', 150'''', 150''''' have a diameter of between about 30 micron and about 100 micron and a corresponding pitch of between about 150 micron and about 250 micron. In one embodiment, interposer 120 includes one or more vias, and the vias have a diameter in the range of about 4 micron to about 50 micron. In one embodiment, the vias in interposer 120 are filled or partially filled with conventional and/or superconducting materials.

Figure 2A:
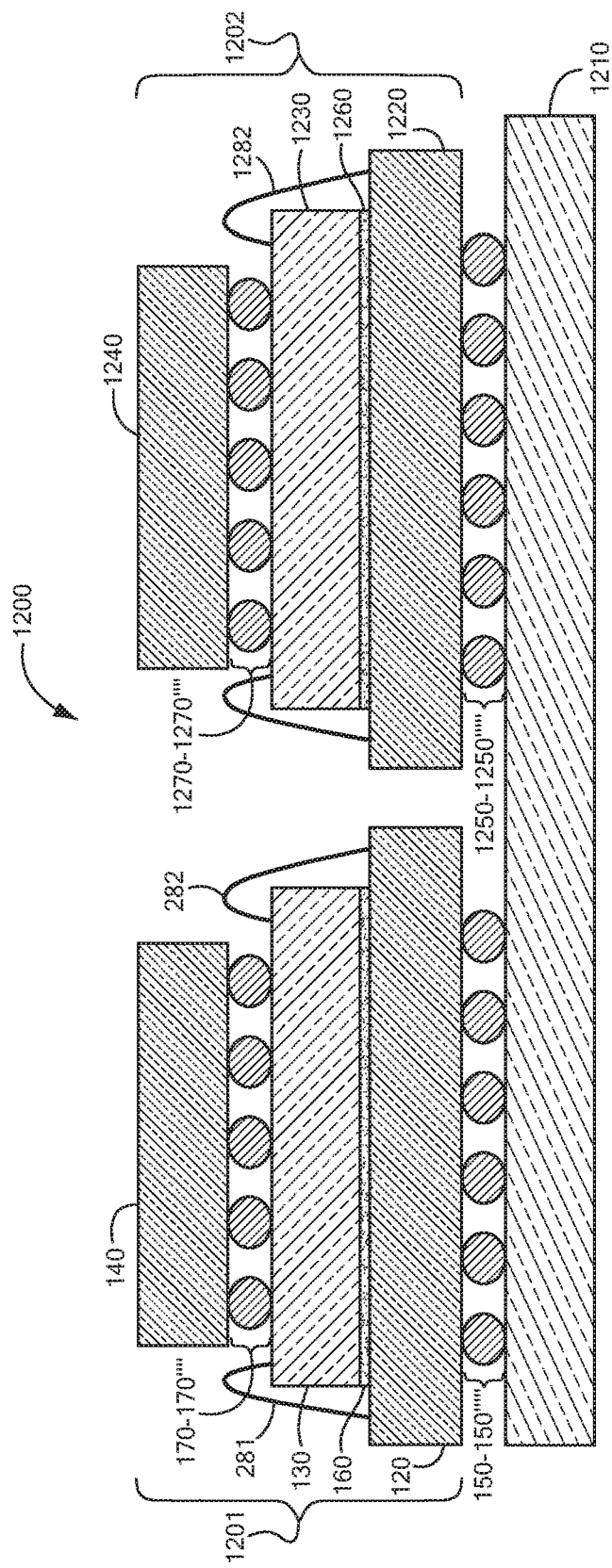

Referring now to FIG. 2A, in which like elements of FIG. 2 are provided having like reference designations, another example cryogenic electronic package 1200 includes a first cryogenic electronic package portion 1201 and a second cryogenic electronic package portion 1202. Cryogenic electronic package 1200 also includes an SMCM 1210 (here, a first SMCM 1210). First SMCM 1210 may couple (e.g., electrically and/or capacitively and/or inductively couple) one or more semiconductor structures of the first cryogenic electronic package portion 1201 to one or more semiconductor structures of the second cryogenic electronic package portion 1202, as will be discussed further below.

First cryogenic electronic package portion 1201 includes superconducting interposer 120 (here, a first superconducting interposer 120), second SMCM 130 and superconducting semiconductor structure 140 (here, a first superconducting semiconductor structure 140). In the illustrated embodiment, second MCM 130 is disposed over and coupled to first interposer 120 through adhesive layer 160 and wire bonding structures 281, 282. Additionally, first superconducting semiconductor structure 140 is disposed over and coupled to second MCM 130 through interconnect structures 170, 170', 170'', 170''', 170''''.

Second cryogenic electronic package portion 1202, which is similar to the first cryogenic electronic package portion 1201 in the illustrated embodiment, includes a second superconducting interposer 1220, a third SMCM 1230 and a second superconducting semiconductor structure 1240.

In embodiments, second interposer 1220 is the same as or similar to first interposer 120. Additionally, third SMCM 1230 may be the same as or similar to second SMCM 230. Further, second superconducting semiconductor structure 1240 may be the same as or similar to first superconducting semiconductor structure 1240.

In the illustrated embodiment, third MCM 1230 is disposed over and coupled to second interposer 1220 through adhesive layer 1260 and wire bonding structures 1281, 1282. Additionally, superconducting semiconductor structure 1240 is disposed over and coupled to third MCM 1230 through interconnect structures 1270, 1270', 1270'', 1270''', 1270''''.

Adhesive layer 1260 may be the same as or similar to adhesive layer 160 (e.g., an electrically conductive adhesive layer or an electrically insulating adhesive layer).

Additionally, wire bonding structures 1281, 1282 may be the same as or similar to wire bonding structures 281, 282. Further, interconnect structures 1270, 1270', 1270", 1270'", 1270"" may be the same as or similar to interconnect structures 270, 270', 270", 270'", 270"".

First SMCM 1210, which may be similar to SMCM 120 of FIG. 2, for example, has first and second opposing surfaces. First cryogenic electronic package portion 1201 is disposed over and coupled (e.g., electrically and mechanically coupled) to a first selected portion of the second surface of first SMCM 1210. Additionally, second cryogenic electronic package portion 1202 is disposed over and coupled to a second selected portion of the second surface of first SMCM 1210. More particularly, in the illustrated embodiment first interposer 120 of first cryogenic electronic package portion 1201 is disposed over and coupled to the first selected portion of the second surface of first MCM 1210 through interconnect structures 150, 150', 150", 150'", 150"", 150'"". Additionally, second interposer 1220 of second cryogenic electronic package portion 1202 is disposed over and coupled to the second selected portion of the second surface of first MCM 1210 through interconnect structures 1250, 1250', 1250", 1250'", 1250"", 1250'"".

With the above-described arrangement, second SMCM 130 and first superconducting semiconductor structure 140 of first cryogenic electronic package portion 1201 are coupled to first SMCM 1210 through first interposer 120 of first cryogenic electronic package portion 1201. Additionally, third SMCM 1230 and second superconducting semiconductor structure 1240 of second cryogenic electronic package portion 1202 are coupled to first SMCM 1210 through second interposer 1220 of second cryogenic electronic package portion 1202. Further, first superconducting semiconductor structure 140 of first cryogenic electronic package portion 1201 may be coupled to second superconducting semiconductor structure 1240 of second cryogenic electronic package portion 1202 through a coupling path including third SMCM 130 and first interposer 120 of first cryogenic electronic package portion 1201, first SMCM 1210, and second interposer 1220 and third SMCM 1230 of second cryogenic electronic package portion 1202. In one embodiment, superconducting semiconductor structure 140 includes a first resonator, superconducting semiconductor structure 1240 includes a second resonator, and the coupling path includes and/or forms a feedline for coupling the first resonator to the second resonator.

Additionally, with the above-described arrangement, first SMCM 1210 of cryogenic electronic package 1200 may be capable of supporting a larger number of semiconductor structures (e.g., SMCMs) than first SMCM 120 of cryogenic electronic package 1200. The foregoing may, for example, be due to the surface (or surfaces) of first SMCM 1210 on which the semiconductor structures are disposed having a larger respective surface area than a like surface (or surfaces) of first SMCM 120.

In embodiments cryogenic electronic package 1200 is fabricated using chip-scale and/or wafer-scale bonding techniques similar to those which were described above in connection with cryogenic electronic package 200 of FIG. 2 in which semiconductor structures are selectively coupled to each other. For example, in embodiments first interposer 120 and second SMCM 130 of first cryogenic electronic package portion 1201 are coupled to first SMCM 1210 prior to superconducting semiconductor structure 140 being coupled to second SMCM 130. Similarly, in embodiments second interposer 1220 and third SMCM 1230 of second cryogenic electronic package portion 1202 are coupled to first SMCM 1210 prior to superconducting semiconductor structure 1240 being coupled to third SMCM 1230.

Additionally, in embodiments first cryogenic electronic package portion 1201 takes the form of a first multi-die system on chip (SOC), second cryogenic electronic package portion 1202 takes the form of a second multi-die SOC, and first SMCM 1210 is used for integrating the first and second multi-die SOCs into a single cryogenic electronic package (i.e., cryogenic electronic package 1200).

In one embodiment, interposer 120 has a redistribution layer to redistribute wirebonding I/Os in such a way that it can utilize the real estate underneath of second SMCM 130. Additionally, in one embodiment, SMCMs 1210, 130, 1230 are bonded (e.g., using wafer level bonding) first with interposers 120 and 1220, and superconducting semiconductor structures 140 and 1240 are subsequently bonded with SMCM 130 and SMCM 1230 to create cryogenic electronic package 1200. In one embodiment, all (or substantially all) of the bonded structures are reflowed and underfilled. For example, an underfill material (e.g., a cryogenically stable underfill material) (not shown) may be disposed between the second surface of second SMCM 130 and the first surface of superconducting semiconductor structure 140. In embodiments, the underfill material is a low temperature heat cured epoxy material suitable for cryogenic applications, such as Master Bond Polymer System EP29LPSP. The underfill material may, for example, increase reliability of and reduce stress on interconnect structures (e.g., 170) in cryogenic electronic package 1200. For example, in embodiments in which the underfill material substantially surrounds the interconnect structures (e.g., 170), the underfill material may substantially reduce, or ideally eliminate, deformation of (i.e., increase stability of) the interconnect structures by curing and/or freezing one or more portions of the interconnect structures.

In embodiments, a bonded structure including second SMCM 130 and superconducting semiconductor structure 140 is coupled to the interposer 120 using adhesive layer 160. Similarly, in embodiments a bonded structure including third SMCM 1230 and superconducting semiconductor structure 1240 is coupled to the interposer 1220 using adhesive layer 1260.

In one embodiment, adhesives layers 160, 1260 include one or more thermally conducting and/or electrically conducting and/or insulating materials. The adhesive layers 160, 1260 can be pre-applied and B-staged before attachment and final cure after attachment. In another embodiment, the adhesive layers 160, 1260 can be highly filled (>50 wt %) with a dispensable adhesive which can dispense adhesive dots for attachment. Such adhesive dots can create one or more openings between interposer 120 and SMCM 130 and allow liquid He or an exchange gas, for example, to flow in the bulk of SMCM 130 to maintain a low operating temperature for the cryogenic electronic package 1200 (a superconducting system in which the cryogenic electronic package 1200 may be provided). In one embodiment, adhesives layers 160, 1260 are based on ceramics and/or metal filled cycloaliphatic epoxy-anhydride chemistry. Additionally, in one embodiment, superconducting semiconductor structure 140 (e.g., a first SFQ chip) and superconducting semiconductor structure 1240 (e.g., a second SFQ chip) are electrically and/or capacitively and/or inductively coupled with each other through a coupling path including SMCM 1210. For example, in one embodiment the superconducting semiconductor structures 140, 1240 are electrical coupled with each other through a coupling path including interconnect structures 170-170"", SMCM 130, wirebonds 281, 282, interposer 120, interconnect structures 150-150'''', SMCM 1210, interconnect structures 1250-1250'''', interposers 1220, wirebond 1281, 1282, SMCM 1230, and interconnect structures 1270-1270''''.

Figure 2B:
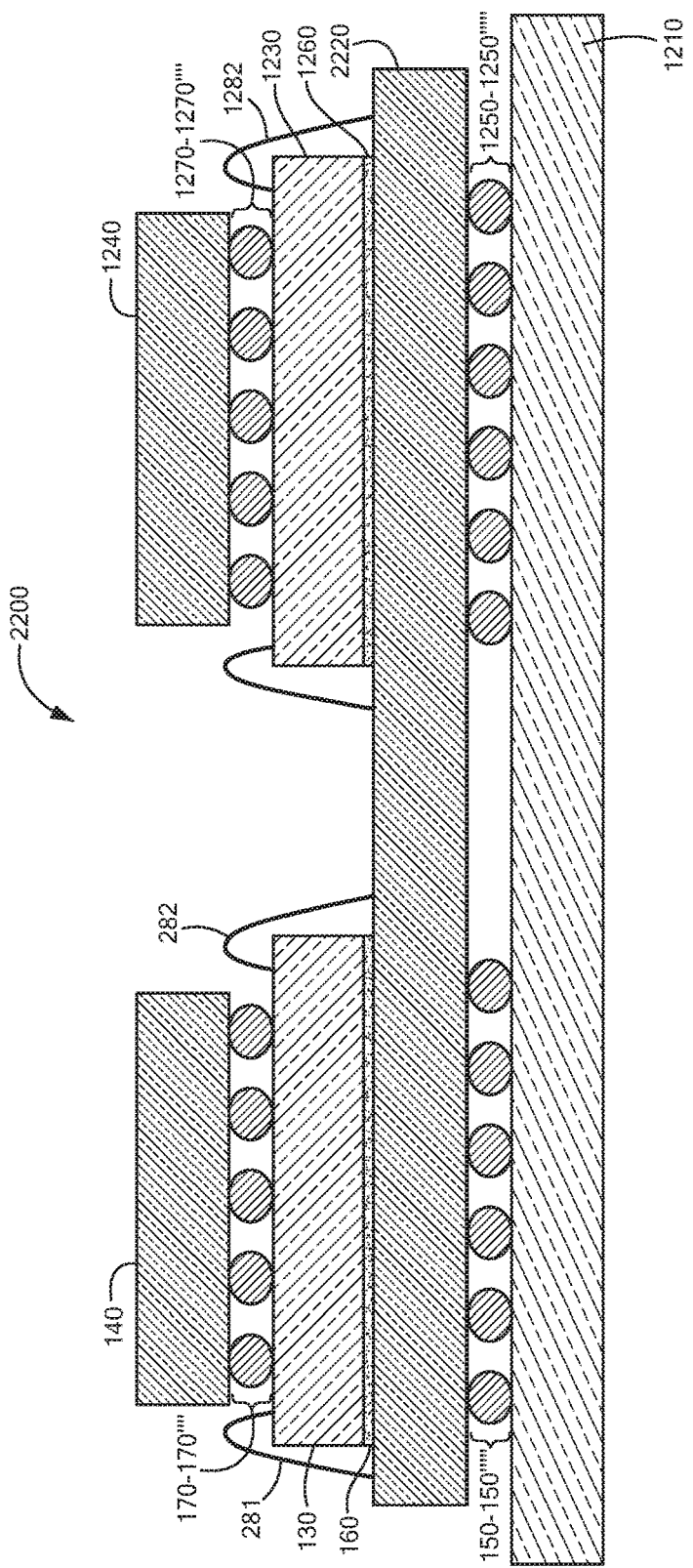

Referring now to FIG. 2B, another example cryogenic electronic package 2200 includes a first SMCM 1210, a superconducting interposer 2220, second SMCM 130 and first superconducting semiconductor structure 140. Cryogenic electronic package 2200 also includes third MCM 1230 and second superconducting semiconductor structure 1240.

Interposer 2220, which may be similar to interposer 120 of FIG. 2A (e.g., but with interposer 2220 having a larger surface area than interposer 120), is disposed over and coupled to first SMCM 1210 through interconnect structures 150, 150', 150'', 150''', 150'''', 150''''' and through interconnect structures 1250, 1250', 1250'', 1250''', 1250'''', 1250'''''. In particular, a first selected portion of interposer 2220 (e.g., on a first surface of interposer 2220) is coupled to a first selected portion of first SMCM 1210 through interconnect structures 150, 150', 150'', 150''', 150'''', 150'''''. Additionally, a second selected portion of interposer 2220 (e.g., on a first surface of interposer 2220) is coupled to a second selected portion of first SMCM 1210 through interconnect structures 1250, 1250', 1250'', 1250''', 1250'''', 1250'''''.

Second SMCM 130 is disposed over and coupled to a third selected portion of interposer 2220 (e.g., on a second surface of interposer 2220) through adhesive layer 160 and wire bonding structures 281, 282. Additionally, first superconducting semiconductor structure 140 is disposed over and coupled to second SMCM 130 through interconnect structures 170, 170', 170'', 170''', 170''''.

Third SMCM 1230 is disposed over and coupled to a fourth selected portion of interposer 2220 (e.g., on a second surface of interposer 2220) through adhesive layer 1260 and wire bonding structures 1281, 1282. Additionally, second superconducting semiconductor structure 1240 is disposed over and coupled to third MCM 1230 through interconnect structures 1270, 1270', 1270'', 1270''', 1270''''.

In one embodiment, SMCM structures 1210, 130, 1230 are bonded (e.g., using wafer level bonding) first with interposer 2220, and superconducting semiconductor structures 140 and 1240) are subsequently bonded with SMCM 130 and SMCM 1230 to create cryogenic electronic package 2200. In one embodiment, all (or substantially all) of the bonded structures are reflowed and underfilled.

Similar to cryogenic electronic package 1200 of FIG. 2A, in embodiments, a bonded structure including second SMCM 130 and superconducting semiconductor structure 140 is coupled to the interposer 120 using adhesive layer 160. Additionally, similar to cryogenic electronic package 1200, in embodiments a bonded structure including third SMCM 1230 and superconducting semiconductor structure 1240 is coupled to the interposer 1220 using adhesive layer 1260.

In one embodiment, first SMCM 1210 has one or more dimensions which are the same as or similar to interposer 2220. For example, the first SMCM 1210 and interposer 2220 may each have a thickness (here, a distance between first and second opposing surfaces) of about 200 mm or about 300 mm. The thickness may be a predetermined thickness. The first SMCM 1210 and the interposer 2220 may have all (or substantially all) dimensions which are the same as or similar to each other in embodiments.

In embodiments, the bonded wafers (e.g., first SMCM 1210 and interposer 2220) are reflowed and underfilled prior to cutting or "dicing" the wafers into a plurality of semiconductor die.

With the above-described arrangement of cryogenic electronic package 2200, first superconducting semiconductor structure 140 (e.g., a first SFQ chip) and second superconducting semiconductor structure 1240 (e.g., a second SFQ chip) may be coupled with each other through a coupling path including second SMCM 130, interposer 2220 (i.e., a single interposer) and third SMCM 1230. In embodiments, the coupling path may also include first SMCM 1210. In one embodiment, the coupling path includes interconnect structures 170-170'', SMCM 130, wirebonds 281, 282, interposer 2200, interconnect structures 150-150'''', SMCM 1210, interconnect structures 1250-1250'''', interposer 2220, wirebonds 1281, 1282, SMCM 1230, and interconnect structures 1270-1270''''. In embodiments, by replacing interposer 120 and interposer 1220 of cryogenic electronic package 1200 of FIG. 2A with interposer 2220 in FIG. 2B (i.e., a single interposer), the coupling path for coupling superconducting semiconductor structure 140 and superconducting semiconductor structure 1240 with each other may be reduced (i.e., include a reduced number of electrical connections). Such may, for example, reduce signal loss which may occur between the superconducting semiconductor structure 140 and superconducting semiconductor structure 1240.

Figure 2C:
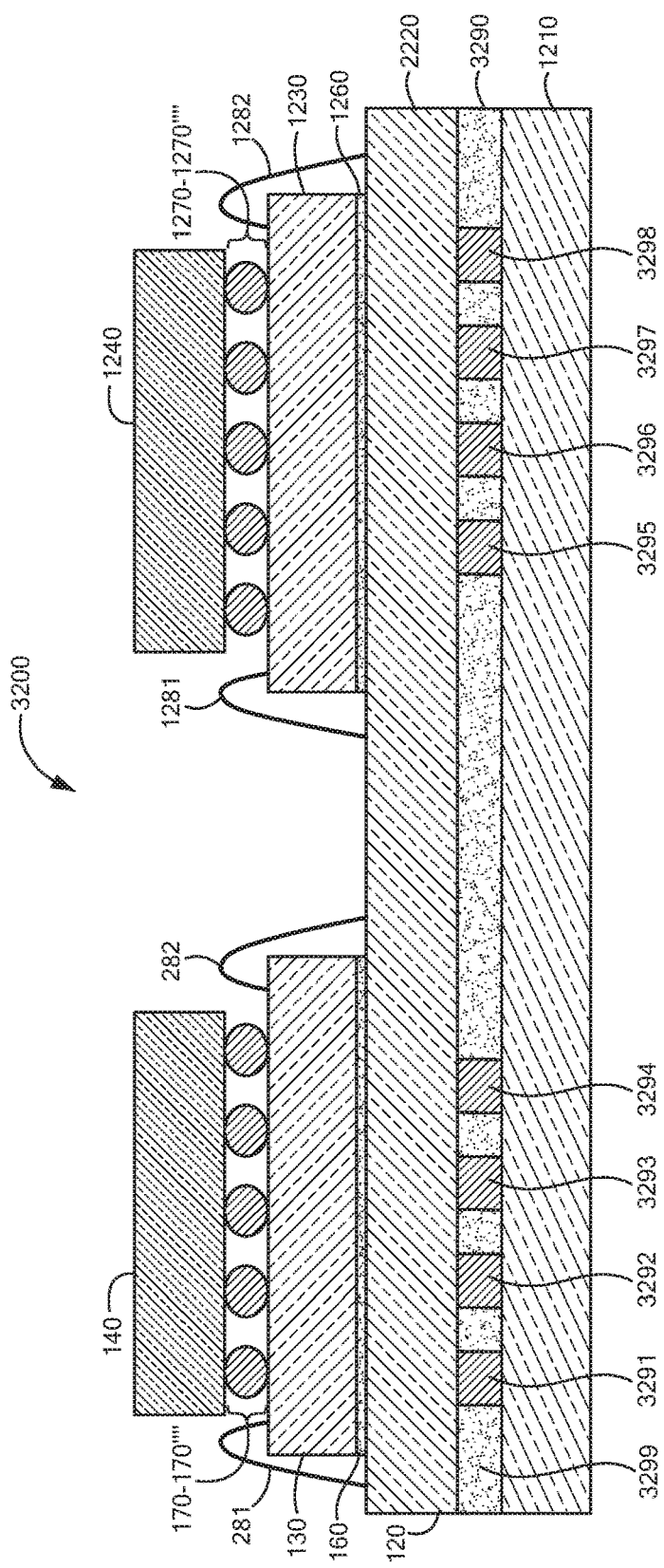

Referring now to FIG. 2C, another example cryogenic electronic package 3200 includes first SMCM 1210, interposer 2220, second SMCM 130 and first superconducting semiconductor structure 140. Cryogenic electronic package 3200 also includes third MCM 1230 and second superconducting semiconductor structure 1240. Cryogenic electronic package 3200 additionally includes a so called "via joining layer" 3290 disposed between and coupled to respective surfaces (e.g., first and/or second surfaces) of first SMCM 1210 and interposer 2220.

Via joining layer 3290 (e.g., an oxide bonding layer) has first and second opposing surfaces and includes a plurality of conductive structures (here, eight conductive structures 3291, 3292, 3293, 3294, 3295, 3296, 3297, 3298) extending between select portions of the first and second surfaces. The conductive structures 3291, 3292, 3293, 3294, 3295, 3296, 3297, 3298 (e.g., TSVs) include one or more superconducting and/or partially superconducting materials (e.g., Nb).

Via joining layer 3290 also includes an oxide bonding material 3299 disposed between select portions of the first and second surfaces of via joining layer 3290. In embodiments, the via joining layer 3290 may be fabricated using via first and/or via last oxide bonding approaches. In one embodiment, via first oxide bonding techniques are preferred. In the illustrated embodiment, the oxide bonding material 3299 surrounds the conductive structures 3291, 3292, 3293, 3294, 3295, 3296, 3297, 3298. The oxide bonding material 3299 may, for example, electrically isolate the conductive structures 3291, 3292, 3293, 3294, 3295, 3296, 3297, 3298 from each other.

In one example embodiment, the conductive structures 3291, 3292, 3293, 3294, 3295, 3296, 3297, 3298 each have a diameter (e.g., a diameter of about 1-2 µm) and are prepared using a 3D-Via lithography process. The 3D-Via lithography process may include an oxide etch using CF4 plasma, dry and/or wet resist strip, resist clean using Aleg-380, IMP+CVD Ti/TiN liner deposition, CVD W and or Ni and or low temperature melt metal and/or alloy fill and CMP planarization and chemical activation for bonding.

In the illustrated embodiment, interposer 2220 of cryogenic electronic package 3200 is disposed over and coupled to first SMCM 1210 through via joining layer 3290. The conductive structures 3291, 3292, 3293, 3294, 3295, 3296, 3297, 3298 in via joining layer 3290 may, for example, couple one or more electrical connections (not shown) in interposer 2220 to one or more electrical connections in first SMCM 1210.

Second SMCM 130 of cryogenic electronic package 3200 is disposed over and coupled to a first selected portion of a surface (e.g., a second surface) of interposer 2220 through adhesive layer 160 and wire bonding structures 281, 282. Additionally, superconducting semiconductor structure 140 is disposed over and coupled to second SMCM 130 through interconnect structures 170, 170', 170", 170''', 170''''.

Third SMCM 1230 is disposed over and coupled to a second selected portion of the surface (e.g., the second surface) of interposer 2220 through adhesive layer 1260 and wire bonding structures 1281, 1282. Additionally, superconducting semiconductor structure 1240 is disposed over and coupled to third SMCM 1230 through interconnect structures 1270, 1270', 1270", 1270''', 1270''''.

With the above-described arrangement, first superconducting semiconductor structure 140 may be coupled to second superconducting semiconductor structure 1240 through a coupling path including second SMCM 130, interposer 2220 and third SMCM 1230. In embodiments, the coupling path may also include via joining layer 3290 and first SMCM 1210.

Figure 3:
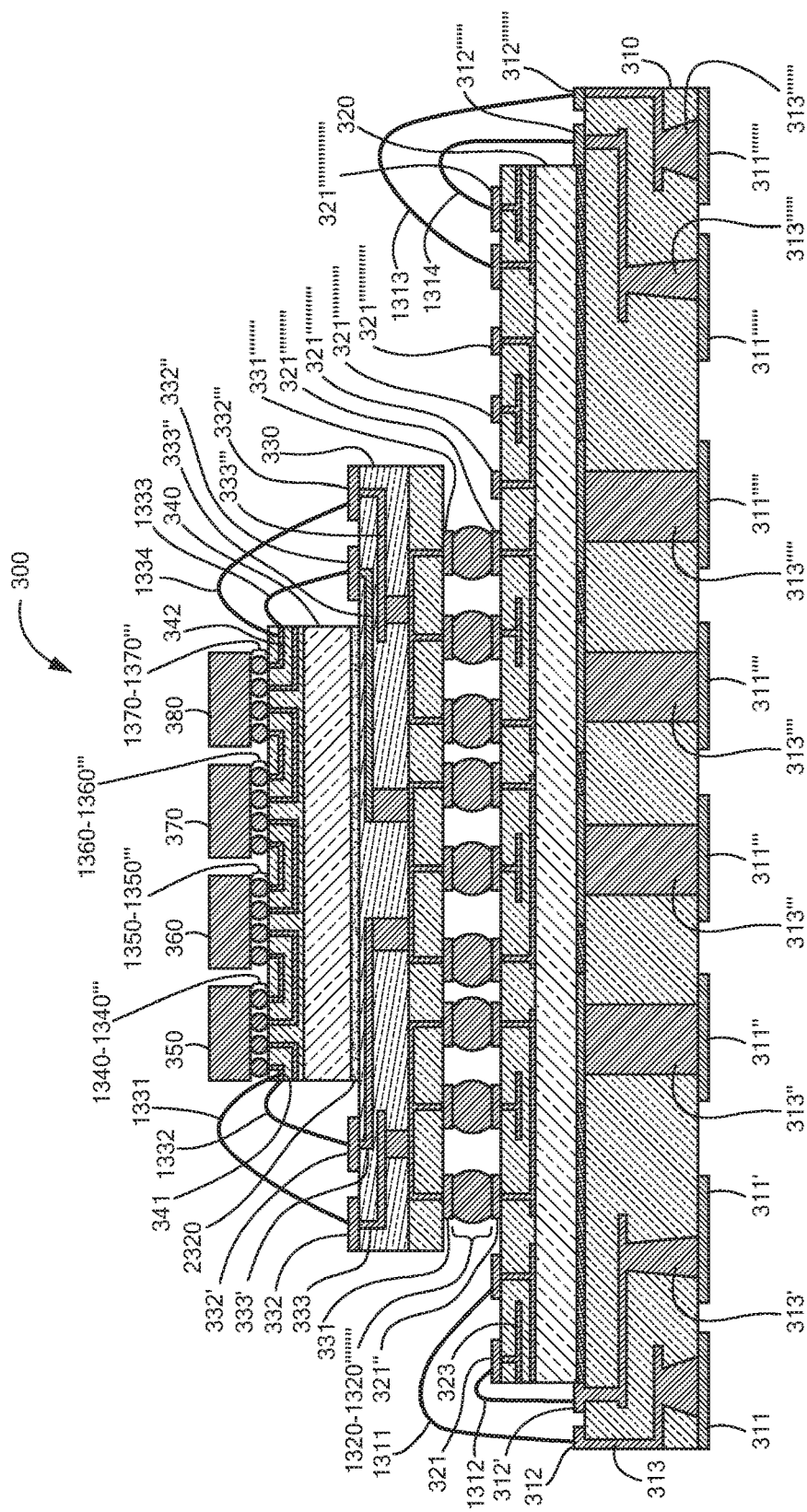
FIG. 3 is a block diagram of another example cryogenic electronic package in accordance with an embodiment of the disclosure.

Referring to FIG. 3, another example cryogenic electronic package 300 includes a substrate 310, a first SMCM 320 and a superconducting interposer 330. Cryogenic electronic package 300 also includes a second SMCM 340 and a plurality of superconducting semiconductor structures (here, superconducting semiconductor structures 350, 360, 370, 380).

Substrate 310 (e.g., a superconducting substrate) has first and second opposing surfaces and includes a first plurality of interconnect pads (here, interconnect pads 311, 311', 311", 311''', 311'''', 311''''', 311'''''', 311''''''') and a second plurality of interconnect pads (here, interconnect pads 312, 312', 312", 312''', 312'''', 312''''', 312'''''', 312'''''''). Substrate 310 also includes a plurality of conductive structures (here, conductive structures 313, 313', 313", 313''', 313'''', 313''''', 313'''''', 313''''''').

The first plurality of interconnect pads 311, 311', 311", 311''', 311'''', 311''''', 311'''''', 311''''''' each have a surface disposed over or otherwise coupled to selected portions of the first surface of substrate 310. Additionally, the second plurality of interconnect pads 312, 312', 312", 312''', 312'''', 312''''', 312'''''', 312''''''' each have a surface disposed over or otherwise coupled to selected portions of the second surface of substrate 310.

In the illustrated embodiment, each of the first plurality of interconnect pads 311, 311', 311", 311''', 311'''', 311''''', 311'''''', 311''''''' is coupled to a respective one of the second plurality of interconnect pads 312, 312', 312", 312''', 312'''', 312''''', 312'''''', 312''''''' through a respective one of the conductive structures 313, 313', 313", 313''', 313'''', 313''''', 313'''''', 313'''''''. For example, interconnect pad 311 is coupled to interconnect pad 312 through conductive structure 313. Each of the conductive structures 313, 313', 313", 313''', 313'''', 313''''', 313'''''', 313''''''' is disposed between the first and second surfaces of substrate 310.

The interconnect pads (e.g., 121) and conductive structures (e.g., 123) of substrate 310 each include one or more electrically conductive materials. In embodiments in which the substrate 310 is a conventional substrate (i.e., a non-superconducting substrate), for example, the electrically conductive materials of the interconnect pads and conductive structures may be conventional conductive materials (e.g., Au). Additionally, in embodiments in which the substrate 310 is a superconducting and/or a partially superconducting substrate, the electrically conductive materials of the interconnect pads and conductive structures may be superconducting and/or partially superconducting conductive materials (e.g., Indium (In) or Niobium (Nb)).

First SMCM 320 has first and second opposing surfaces and includes a plurality of interconnect pads (here, interconnect pads 321, 321', 321", 321''', 321'''', 321''''', 321'''''', 321''''''', 321'''''''', 321''''''''', 321'''''''''', 321''''''''''', 321'''''''''''', 321''''''''''''', 321'''''''''''''', 321'''''''''''''''). Additionally, first SMCM 320 includes a plurality of electrical connections (e.g., 323) extending between selected portions of the first and second surfaces.

The interconnect pads (e.g., 321) each have a surface disposed over or otherwise coupled to selected portions of the second surface of first SMCM 320. Additionally, each of the interconnect pads (e.g., 321) may be coupled to one or more of the electrical connections (e.g., 323). The electrical connections in first SMCM 320 may have a first trace width. Additionally, the first SMCM 320 may have a first associated package pitch.

Interposer 330 has first and second opposing surfaces and includes a first plurality of interconnect pads (here, interconnect pads 331, 331', 331", 331''', 331'''', 331''''', 331'''''', 331''''''') and a second plurality of interconnect pads (here, interconnect pads 332, 332', 332", 332'''). Interposer 330 also includes a plurality of conductive structures (here, conductive structures 333, 333', 333", 333''').

The first plurality of interconnect pads 331, 331', 331", 331''', 331'''', 331''''', 331'''''', 331''''''' each have a surface disposed over or otherwise coupled to selected portions of the first surface of interposer 330. Additionally, the second plurality of interconnect pads 332, 332', 332", 332''' each have a surface disposed over or otherwise coupled to selected portions of the second surface of interposer 330.

In the illustrated embodiment, each of the second plurality of interconnect pads 332, 332', 332", 332''' is coupled to a respective one of the conductive structures 333, 333', 333", 333'''. For example, interconnect pad 332 is coupled to conductive structure 333. Each of the conductive structures 333, 333', 333", 333''' is disposed between the first and second surfaces of interposer 330. In one embodiment, interposer 330 has a redistribution layer (e.g., with conductive structures 333, 333', 333", 333''', etc.). Additionally, in one embodiment, interposer 330 includes a superconducting and/or conventional metal based TSV and/or a through oxide via.

Second SMCM 340 has first and second opposing surfaces and includes a plurality of electrical connections (e.g., 341, 342) extending between selected portions of the first and second surfaces. The electrical connections in second SMCM 340 may have a second trace width. Additionally, the second SMCM 340 may have a second associated package pitch. In embodiments, the second trace width of the electrical connections in second SMCM 340 is less than the first trace width of the electrical connections in first SMCM 320. Additionally, in embodiments the second package pitch of second SMCM 340 is less than the first package pitch of first SMCM 320.

Superconducting semiconductor structures 350, 360, 370, 380 (e.g., SFQ ICs) each have first and second opposing surfaces. In embodiments, the superconducting semiconductor structures 350, 360, 370, 380 are the same as or similar to superconducting semiconductor structures shown and described in connection with figures above (e.g., 140, shown FIG. 1).

First SMCM 320 of cryogenic electronic package 300 is coupled (e.g., electrically and mechanically coupled) to substrate 310 through wire bonding structures 1311, 1312, 1313, 1314. In particular, the wire bonding structures 1311, 1312, 1313, 1314 each have a first portion coupled to a respective interconnect pad (e.g., 312) of substrate 310. Additionally, the wire bonding structures 1311, 1312, 1313, 1314 each have a second opposing portion coupled to a respective interconnect pad (e.g., 321) of first SMCM 320.

Interposer 330 of cryogenic electronic package 300 is coupled to first SMCM 320 through interconnect structures 1320, 1320', 1320'', 1320''', 1320'''', 1320''''', 1320'''''', 1320''''''', 1320''''''''. In particular, the interconnect structures (e.g., 1320) are disposed between selected surfaces (e.g., first and second surfaces) of first SMCM 320 and interposer 330. Additionally, the interconnect structures are coupled to respective ones of the interconnect pads provided on first SMCM 320 and interposer 330 to form one or more electrical connections between first SMCM 320 and interposer 330. In one embodiment, the interconnect structures are the same as or similar to interconnect structures 2170, 2150 described above in connection with FIGS. 1B and 1C, for example.

Second SMCM 340 of cryogenic electronic package 300 is coupled to interposer 330 through an adhesive layer 2320 and through wire bonding structures 1331, 1332, 1333, 1334. In particular, adhesive layer 2320 is disposed between selected surfaces (e.g., first and second surfaces) of the interposer 330 and second SMCM 340. Additionally, the wire bonding structures 1331, 1332, 1333, 1334 each have a first portion coupled to a respective one of the interconnect pads (e.g., 332) of interposer 330. The wire bonding structures 1331, 1332, 1333, 1334 also have a second opposing portion coupled to one or more of the electrical connections (e.g., 341, 342) provided in second SMCM 340.

Superconducting semiconductor structure 350 of cryogenic electronic package 300 is coupled to second SMCM 340 through interconnect structures 1340, 1340', 1340'', 1340'''. Additionally, superconducting semiconductor structure 360 is coupled to second SMCM 340 through interconnect structures 1350, 1350', 1350'', 1350''', and superconducting semiconductor structure 370 is coupled to second SMCM 340 through interconnect structures 1360, 1360', 1360'', 1360'''. Further, superconducting semiconductor structure 380 is coupled to second SMCM 340 through interconnect structures 1370, 1370', 1370'', 1370'''.

In embodiments, one or more of the interconnect structures (e.g., 1340) in cryogenic electronic package 300 may be the same as or similar to interconnect structure 1150 of FIG. 1A, for example. Additionally, in embodiments one or more of the interconnect structures (e.g., 1340) may be the same as or similar to interconnect structure 2150 of FIG. 1C.

With the above-described arrangement, superconducting semiconductor structures 350, 360, 370, 380 may be coupled to each other through second SMCM 340. Additionally, with the above-described arrangement interposer 330 may electrically couple superconducting semiconductor structures 350, 360, 370, 380 and second SMCM 340 to first SMCM 320 and/or substrate 310.

In one aspect of the disclosure, substrate 310 is provided as a first portion (or level) of the cryogenic electronic package 300, first SMCM 320 is provided as a second portion (or level) of the cryogenic electronic package 300 and interposer 330 is provided as a third portion (or level) of the cryogenic electronic package 300. Additionally, second SMCM 340 is provided as a fourth portion (or level) of the cryogenic electronic package 300 and superconducting semiconductor structures 350, 360, 370, 380 is provided as a fifth portion (or level) of the cryogenic electronic package 300. In embodiments, the first, second, third, fourth and fifth portions (or levels) of the cryogenic electronic package 300 are fabricated or built in parallel.

Additionally, in one aspect of the disclosure up to four levels of the cryogenic electronic package 300 may have one or more superconducting paths or connections. For example, the second, third, fourth and fifth levels may include one or more superconducting connections.

Further, in one aspect of the disclosure the cryogenic electronic package 300 may have up to three (or four) levels of reworkability. For example, the third, fourth and fifth levels of cryogenic electronic package 300 may be decoupled and recoupled to respective portions of cryogenic electronic package 300 for rework and/or replacement of one or more portions of cryogenic electronic package 300.

In embodiments, interconnect structures 1320-1320''''''' (e.g., large bumps) used to couple semiconductor structure 320 to semiconductor structure 330 can be replaced with interconnect structures having smaller or reduced dimensions (e.g., smaller bumps) compared to interconnect structures 1320-1320'''''''. For example, in one embodiment interconnect structures 1320-1320''''''' can be replaced with a plurality of interconnect structures that may be the same as or similar to interconnect structures 1370-1370'''. In one embodiment, interconnect structures 1370-1370''' have an about 15 micron and semiconductor structure 320 uses multiple 15 micron diameter interconnect structures (e.g., bumps) for an interconnect. In embodiments, the addition of multiple bumps enhances electrical yield of the cryogenic electronic package 300.

In embodiments, FIG. 3 illustrates an example hardware architecture having four assembly levels with five levels of circuits built in parallel. A first one of the assembly levels may include superconducting semiconductor structures 350, 360, 370, 380 and second SMCM 340. Additionally, a second one of the assembly levels may include second SMCM 340 and interposer 330. A third one of the assembly levels may include interposer 330 and first SMCM 320. Further, a fourth one of the assembly levels may include first SMCM 320 and substrate 310.

In one embodiment, the example hardware architecture includes a superconducting path with up to four levels of circuits when using a conventional metal substrate or PCB (e.g., substrate 310). Additionally, in one embodiment, interposer 330 and/or first SMCM 320 can be fabricated on a full (or a substantially full) wafer (e.g., an about 200 mm or 300 mm wafer).

Figure 4:
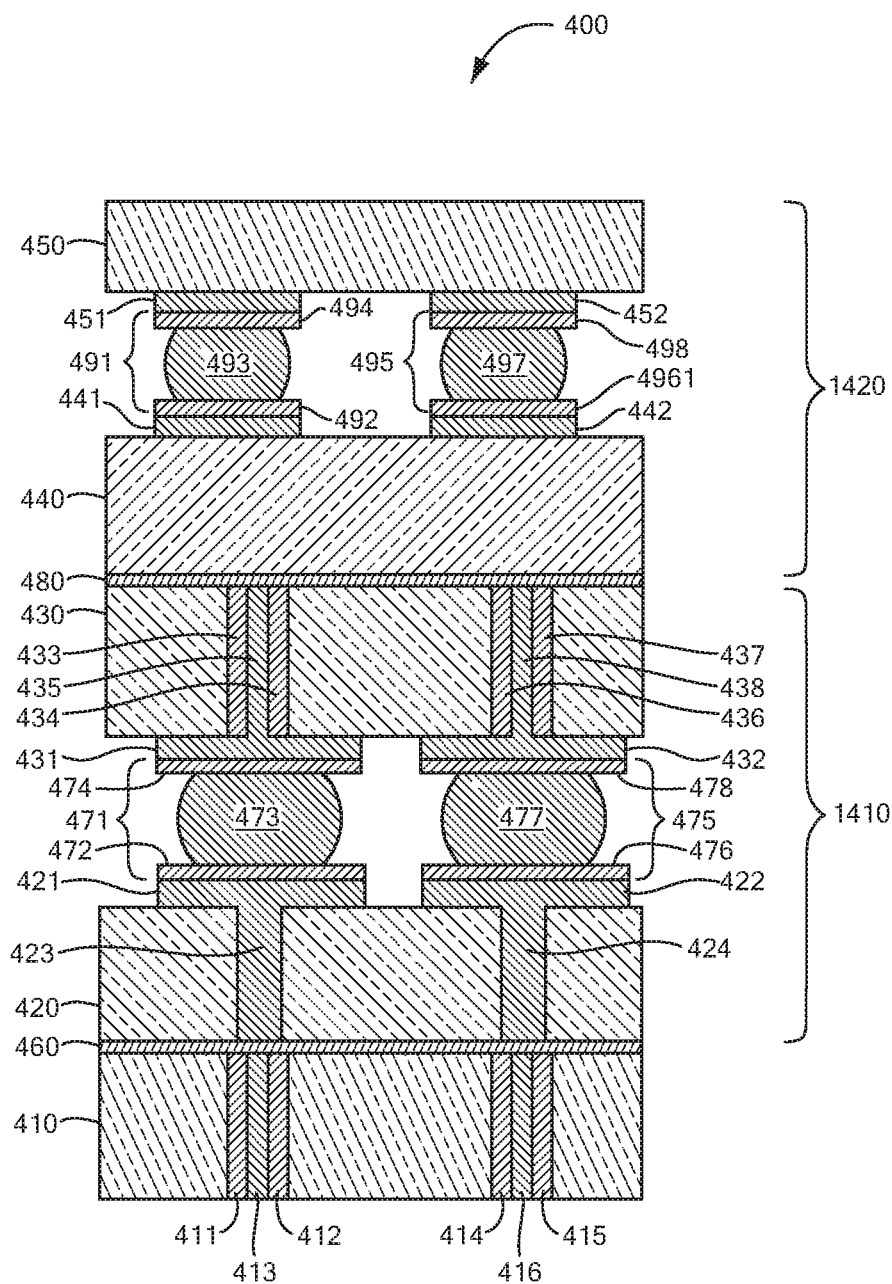
FIG. 4 shows a cross-section of an example cryogenic electronic package in accordance with an embodiment of the disclosure.

Referring to FIG. 4, a cross-section of an example cryogenic electronic package 400 according to the disclosure is shown. Cryogenic electronic package 400 includes a substrate 410, a first SMCM 420 and a superconducting interposer 430. The cryogenic electronic package 400 also includes a second SMCM 440 and a superconducting semiconductor structure 450.

Substrate 410 (e.g., a TSV substrate) has first and second opposing surfaces and includes first and second TSV structures. The first TSV structure, which may be the same as or similar to the TSV structure described above in connection with FIG. 1A in embodiments, includes a first pad interconnect 411, a second pad interconnect 412 and a through via 413. Additionally, the second TSV structure, which may be the same as or similar to the first TSV structure in embodiments, includes a first pad interconnect 414, a second pad interconnect 415 and a through via 416.

First pad interconnect 411 of the first TSV structure extends from a first selected portion of the first surface of substrate 410 to a first selected portion of the second surface of the substrate 410. Additionally, second pad interconnect 412 of the first TSV structure extends from a second selected portion of the first surface of substrate 410 to a second selected portion of the second surface of the substrate 410. Further, through via 413 of the first TSV structure is disposed in a cavity formed between the first and second pad interconnects 411, 412 of the first TSV structure.

First pad interconnect 414 of the second TSV structure extends from a third selected portion of the first surface of substrate 410 to a third selected portion of the second surface of the substrate 410. Additionally, second pad interconnect 415 of the second TSV structure extends from a fourth selected portion of the first surface of substrate 410 to a fourth selected portion of the second surface of the substrate 410. Further, through via 416 of the second TSV structure is disposed in a cavity formed between the first and second pad interconnects 414, 415 of the second TSV structure.

First SMCM 420 has first and second opposing surfaces and includes interconnect pads 421, 422 (e.g., Nb pads) which also have first and second opposing surfaces. Interconnect pad 421 has a surface (e.g., a first surface) disposed over a first selected portion of the second surface of first SMCM 420. Additionally, interconnect pad 422 has a surface (e.g., a first surface) disposed over a second selected portion of the second surface of first SMCM 420.

First SMCM 420 additionally includes TSVs 423, 424 (e.g., a conducting and/or superconducting TSVs). TSV 423 extends from a first selected portion of the first surface of first MCM 420 to a surface (e.g., a first surface) of the interconnect pad 421 (and the second surface of the first SMCM 420). Additionally, TSV 424 extends from a second selected portion of the first surface of first SMCM 420 to a surface (e.g., a first surface) of the interconnect pad 422 (and the second surface of the first SMCM 420).

Interposer 430 has first and second opposing surfaces and includes interconnect pads 431, 432 (e.g., Nb pads) which also have first and second opposing surfaces. Interconnect pad 431 has a surface (e.g., a first surface) disposed over a first selected portion of the first surface of interposer 430. Additionally, interconnect pad 432 has a surface (e.g., a first surface) disposed over a second selected portion of the first surface of interposer 430.

Interposer 430 also includes first and second TSV structures. The first TSV structure of interposer 430 includes a first pad interconnect 433 which extends from a first selected portion of a surface (e.g., a first surface) of interconnect pad 431 (and the first surface of the interposer 430) to the second surface of interposer 430. Additionally, the first TSV structure includes a second pad interconnect 434 which extends from a second selected portion of the surface (e.g., the first surface) of interconnect pad 431 to the second surface of interposer 430. The first TSV structure also includes a TSV 435 (e.g., a superconducting TSV) which is disposed in a cavity formed between the first and second pad interconnects 433, 434. TSV 435 is electrically coupled to the surface (e.g., the first surface) of interconnect pad 431.

The second TSV structure of interposer 430 includes a first pad interconnect 436 which extends from a first selected portion of a surface (e.g., a first surface) of interconnect pad 432 (and the first surface of the interposer 430) to the second surface of interposer 430. Additionally, the second TSV structure includes a second pad interconnect 437 which extends from a second selected portion of the surface (e.g., the first surface) of interconnect pad 432 to the second surface of interposer 430. The second TSV structure also includes a TSV 438 (e.g., a superconducting TSV) which is disposed in a cavity formed between the first and second pad interconnects 436, 437. TSV 438 is electrically coupled to the surface (e.g., the first surface) of interconnect pad 432. In some embodiments, interconnect pads 431, 432 are provided as superconducting traces, include superconducting traces or are coupled to superconducting traces. In such embodiments, the pad interconnects 433, 434, 436, 437 may be referred to as trace interconnects.

Second SMCM 440, which may be the same as or similar to first SMCM 420 in embodiments, has first and second opposing surfaces and includes interconnect pads 441, 442 which also have first and second opposing surfaces. Interconnect pad 441 has a surface (e.g., a first surface) disposed over a first selected portion of the second surface of second SMCM 440. Additionally, interconnect pad 442 has a surface (e.g., a first surface) disposed over a second selected portion of the second surface of second SMCM 440.

Superconducting semiconductor structure 450 (e.g., a single-flux-quantum (SFQ) integrated circuit (IC)) has first and second opposing surfaces and includes interconnect pads 451, 452 which also have first and second opposing surfaces. Interconnect pad 451 has a surface (e.g., a first surface) disposed over a first selected portion of the first surface of superconducting semiconductor structure 450. Additionally, interconnect pad 452 has a surface (e.g., a first surface) disposed over a second selected portion of the first surface of superconducting semiconductor structure 450.

In the illustrated embodiment, first SMCM 420 is disposed over and coupled to substrate 410 through an adhesive layer (or rework) 460. Additionally, interposer 430 is disposed over and coupled to first SMCM 420 through interconnect structures 471, 475. Additionally, second SMCM 440 is disposed over and coupled to interposer 430 through an adhesive layer (or rework) 480. Further, superconducting semiconductor structure 450 is disposed over and coupled to second SMCM 440 through interconnect structures 491, 495.

Interconnect structures 471, 475, 491, 495 are substantially the same as interconnect structure 1150 of cryogenic electronic package 110 of FIG. 1A and, thus, will not be described in detail again. Briefly, similar to interconnect structure 1150, interconnect structure 471 includes a first section 472, a second section 473 and a third section 474. Additionally, interconnect structure 475 includes a first section 476, a second section 477 and a third section 478. Additionally, interconnect structure 491 includes a first section 492, a second section 493 and a third section 494. Further, interconnect structure 495 includes a first section 496, a second section 497 and a third section 498.

In embodiments, cryogenic electronic package 400 is fabricated in a plurality of processes. For example, a first portion of cryogenic electronic package 400 including first SMCM 420 and interposer 430 may be fabricated in a first process. Additionally, a second portion of cryogenic electronic package 400 including second SMCM 440 and superconducting semiconductor structure 450 may be fabricated in a second process. Further, a third portion of cryogenic electronic package 400 (here, substrate 410) may be fabricated in a third process. In some embodiments, the first process and the second process may be performed (i.e., occur) substantially simultaneously (i.e., in parallel). Additionally, in some embodiments the first process, the second process and the third process may be performed substantially simultaneously.

Although the adhesive layers 460, 480 may lose their function (i.e., ability to adhere the semiconductor structures together) after wave soldering, for example, the adhesives 460, 480 should not degrade the reliability of the cryogenic electronic package 400 during subsequent manufacturing processes such as cleaning and repair/rework. In embodiments, to ensure reworkability of cryogenic electronic package 400, the adhesives 460, 480 should have a relatively low glass transition temperature Tg. Cured adhesives 460, 480 may soften (i.e., reach their Tg), for example, as they are heated during rework. For fully cured adhesives, a Tg in a range of about seventy five degrees C. to about ninety five degrees C. may, for example, be considered to accommodate reworkability.

In embodiments, temperatures to which the semiconductor structures of the cryogenic electronic package may be exposed may, for example, exceed about one hundred degrees C. during rework. The foregoing may be due to the materials from which the adhesive layers 460, 480 are provided (e.g., eutectic tin-lead solder) having a relatively high melt temperature. As long as the Tg of the cured adhesive is below about one hundred degrees C., for example, and the amount of adhesive layers 460, 480 is not excessive, reworkability of cryogenic electronic package 400 may be within acceptable limits and/or tolerances.

In one embodiment, at least one of first SMCM 420, interposer 430, second SMCM 440 and superconducting semiconductor structure 450 includes one or more superconducting resonators and/or superconducting couplers and/or superconducting qubits and/or capacitors and/or inductors. The resonators, couplers, qubits, capacitors and inductors may be electrically and or inductively and capacitively coupled with each other.

Additionally, in one embodiment, superconducting semiconductor structure 450 includes a center conductor of a superconducting resonator, interposer 430 includes one or more superconducting resonators, and the superconducting semiconductor structure 450 and interposer 430 are capacitively coupled with each other during resonator operation.

In one example configuration of cryogenic electronic package 400, SMCM 440 has same or similar pad pitch as superconducting semiconductor structure 450 and interposer 430 has larger pad pitch than second SMCM 440. Additionally, interposer 430 may have a same or similar pad pitch as the first SMCM 420 and first SMCM 420 may have a larger pad pitch than second SMCM 440. Further, substrate 410 (e.g., an organic interposer) may have a larger pad pitch than first SMCM 420 and substrate 410 (e.g., an interposer) may have a larger pad pitch than interposer 430. In other words, the example configuration of cryogenic electronic package 400 discussed above includes a plurality of semiconductor structures with a plurality of package pitches (here, package pitches in ascending size; i.e., smallest to largest package pitch).

Additionally, in one example configuration of cryogenic electronic package 400, the first and second TSV structures in interposer 430 include superconducting and/or partially superconducting and/or or conventional (i.e., non-superconducting) interconnect materials. For example, in embodiments TSVs 435, 438 in the first and second TSV structures may include one or more superconducting materials, and be provided as superconducting TSVs. Additionally, in embodiments pad interconnects 433, 434, 436, 437 in the first and second TSV structures may include one or more conventional materials.

In embodiments, the superconducting TSVs may include a low stress Titanium Nitride (TiN) superconducting or non-superconducting layer. In one embodiment, the superconducting TSV layer may consist of or includes single and/or multiple superconducting materials or multiple layers of single superconducting materials. It is further possible that at least one material and/or at least one composition of materials of the superconducting TSV layer may be superconducting. In one embodiment, the non-superconducting layer may consist of or include conventional and superconducting materials. It is also possible that the superconducting layer may consist of or include a superconducting and/or non-superconducting titanium nitride composition.

In one embodiment, the superconducting layer includes a combination of titanium-titanium nitride-tungsten and/or titanium-titanium nitride-high Q materials-tungsten and/or titanium-titanium nitride-high Q materials and/or titanium-high Q materials-tungsten and/or high Q materials-tungsten and/or high Q materials, etc. In another embodiment, the superconducting TSV layer consists of or includes single and/or multiple superconducting materials or multiple layers of high Q materials. Such materials may exist in single material phase and/or a composition of materials phases or react with each other to create a new lattice and/or modify lattice parameters.

In embodiments, the TSVs structures in interposer 430 (here, a first TSV structure including 433, 434, 435 and a second TSV structure including 436, 437, 438) and the TSV structures in substrate 410 (here, a first TSV structure including 411, 412, 413 and a second TSV structure including 414, 415, 416) are each filled with multiple metal and/or alloy layers. At least one of the multiple metal and/or alloy layers may have a low temperature melt composition and/or a conductive fusible metal which melts and flows to substantially reduce (or ideally eliminate) any possible electrical opens within the TSV structures. The low temperature melt metal and/or alloy layer may react with at least another metal within the TSV and/or via structures to create a high melt composition. It is possible to create a high melt composition with a melt temperature which can be higher than operational and/or processing temperatures. It is further possible that the low temperature melt composition melts and reacts with at least another metal composition within the TSV structures to create a high melt composition having a higher CTE than individual metal compositions.

It is further possible to use multiple metal or alloy layers having a low temperature melt composition within the TSV structures which melts and reacts with at least another metal and/or alloy within the TSV structures to create multiple high melt composition. It is further possible to create a melt gradient. It is also possible to use a multiple metal or alloy layer having a low temperature melt composition within the TSV structures which melts and reacts with at least another metal/and or alloy within the TSV structures to create a multiple high melt composition and a residual low melt metal which helps to heal any defects in the TSV structures which may arise during operation and/or processing.

Low Nitrogen percentages in a Ta/TaN barrier layer and/or high bias power conditions during PVD seed layer depositions in the TSV structures may, for example, help to grow more Cu seed with more Cu (111) than Cu (200) orientation. In one embodiment, Cu (111) favored Cu electroplating to fill the TSV structures a. Alternate seed layers for filling the TSV structures include CVD-Cu, CVD-W, sputtered TiW/Cu, CVD-tungsten (W) and sputtered TiW/Cu. It is also possible to use single and multiple Cu seed layers, plated Cu and low melt metals and/or alloy layers within the TSV structures where low melt metals and/or alloys will melt flow to the TSV structures and repair opens (if any) within the TSV structures. Low melt metals and/or alloys (e.g. Sn) may react with Cu and/or Au and/or Ag to create at least one high melt solid solution. It is further possible that at least part of the remaining metals in the TSV structures are unreacted and can act as healing agent. It is further possible that at least part of the Cu plated layer can be replace by another metal such as Ag, Au, and/or Ni.

It is also possible to use single and/or multiple low temperature melt layers which melt and form a multiple high melt composition. It is further possible to use low temperature melt metals and/or alloys (e.g., Tin and Indium) which react with each other and create a lower melt (e.g., 48 weight % Tin and 52 weight % Tin Indium) composition. It is further possible that a lower melt composition exposed to further heat-treatment will react with each other as well as other metals present in the TSV structures to create a higher melt composition than that of individual metals (e.g., Tin and Indium). It is further possible to create a composition gradient as well as melt temperature gradient. It is further possible to create multi metal layer TSV structures with at least one low temperature melt composition which melt and flow to repair any defects which may be present in the TSV structures.

Additionally, in some embodiments, one or more of the TSV structures can be filled with a nanoparticle conductive paste. For example, the TSV structures can be filled with a nanoparticle conductive paste through a process in which the TSV structures are filled with the paste at around 60 C under vacuum. At around 60 C the paste will have a lower viscosity than at room temperature. Low viscosity paste under vacuum will fill the TSV structures by capillary action. This process can be used multiple times to do complete the fill. After the fill, the paste will be cured and through a subsequent CMP process the cured paste will be removed from one or more surfaces of the TSV structures. It is also possible to form the TSV structures before final curing and to final cure the paste after the CMP. This process also favors to add a thin insulating layer around a wall of the TSV structures which will insulate/passivate a side wall of the TSV structures and provide a z-direction electrical connection after curing.

Further, in some embodiments, one or more of the TSV structures can be filled with a metal based nanoparticle which has a particle size less than or equal to one micron, preferably less or equal to between about two hundred nm and about five hundred nm in embodiments. The metal based nanoparticle can be a pure metal particle (e.g., Au, Ag, Cu), a low temperature melt metal and/or alloy (e.g., In), a low temperature melt metal and/or an alloy coated metal or a combination thereof. It is possible to have single and multiple metal seed based TSV structures filled with a conductive paste. Conductive paste filling may, for example, improve electrical conductivity of the TSV structures. It is further possible to use nanoparticle slurry instead of paste to fill the TSV structures.

In one example configuration, the TSV structures include a conventional metal pad and a conventional metal via with a surface (e.g., a top surface) of the conventional metal pad and/or via having at least one solder wettable metal (e.g. Au). The addition of a superconducting metal in the via and subsequent reflow will wet the conventional metal surface including the via and pad area and convert a conventional metal TSV to a superconducting TSV. It is further possible to use a cap plated and/or deposited superconducting metal (Al, Nb, TiN, NbN, Nb, TiN or combinations thereof) on a surface (e.g., a top surface) of a superconducting TSV. In one example, the cap plated superconducting metal has a single opening or multiple openings to access superconducting reflowable metals during interconnect formation.

In embodiments, cryogenic electronic package 400 can additionally or alternatively include one or more of the semiconductor structures and/or interconnect structures described in figures above or below. For example, in one embodiment interconnect structure 471 in cryogenic electronic package 400 can be replaced by or include one or more portions of interconnect structure 2150 shown in FIG. 1C, for example. Additionally, in one embodiment superconducting semiconductor structure 450 in cryogenic electronic package 400 can be replaced by a superconducting interposer (e.g., 1120, shown in FIG. 1A), for example, in embodiments in which the cryogenic electronic package 400 includes a plurality of superconducting interposers. In such embodiments, an SMCM and/or a superconducting semiconductor structure (or another semiconductor structure) may be coupled to the superconducting interposer that replaced superconducting semiconductor structure 450. It is understood that other configurations of cryogenic electronic package 400 are, of course, possible.

Figure 5:
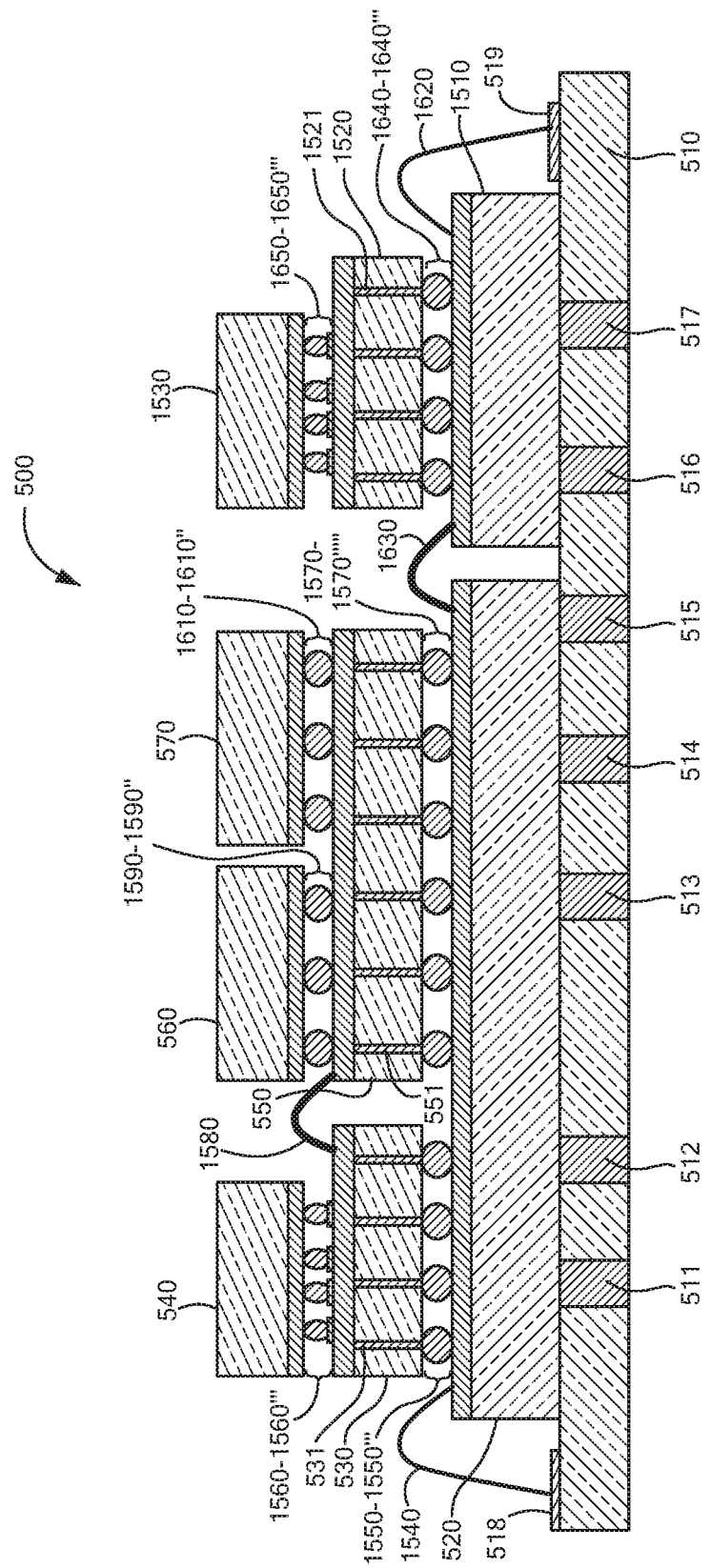
FIG. 5 is a block diagram of another example cryogenic electronic package in accordance with an embodiment of the disclosure.

Referring now to FIG. 5, another example cryogenic electronic package 500 (e.g., a multi-die SFQ-Qubit-CMOS cryogenic electronic package) is shown. Cryogenic electronic package 500 includes a substrate 510, a first SMCM 520, a first superconducting interposer 530 and a first superconducting semiconductor structure 540. Cryogenic electronic package 500 also includes a second superconducting interposer 550, a second superconducting semiconductor structure 560 and a third superconducting semiconductor structure 570. Cryogenic electronic package 500 additionally includes a second SMCM 1510, a third superconducting interposer 1520 and a fourth superconducting semiconductor structure 1530. In one aspect of the disclosure, cryogenic electronic package 500 illustrates assembly capabilities of cryogenic electronic packages including semiconductor structures of various sizes, shapes, types and package pitches on a same package level.

Substrate 510 (e.g., an organic and/or ceramic and/or glass substrate) has first and second opposing surfaces and includes a plurality of via structures 511, 512, 513, 514, 515, 516, 517 (e.g., thermal vias) extending between select portions of the first and second surfaces. The via structures 511, 512, 513, 514, 515, 516, 517 may be filled, plated through hole vias, or cap plated, filled plated through hole vias, for example. Substrate 510 also includes a plurality of interconnect pads (here, two interconnect pads 518, 519), each of the interconnect pads 518, 519 having first and second opposing surfaces. A first surface of interconnect pad 518 is disposed over a first select portion of the second surface of substrate 510 and may be electrically coupled to one or more first electrical connections (e.g., via structures 511, 512) in substrate 510. Additionally, a first surface of interconnect pad 519 is disposed over a second select portion of the second surface of substrate 510 and may be electrically coupled to one or more second electrical connections in substrate 510.

First SMCM 520 has first and second opposing surfaces and is electrically coupled to first selected electrical connections in substrate 510 through a wire bond structure 1540. In particular, a first portion of wire bond structure 1540 is coupled to electrical connections on a second surface of first SMCM 520, and a second opposing portion of wire bond structure 1540 is coupled to a second surface of interconnect pad 518 of substrate 510. In embodiments, first SMCM 520 may also be coupled to substrate 510 through an array of microbumps (not shown) which may be disposed between the first surface of the first SMCM 520 and the second surface of the substrate 510. The array of microbumps may, for example, substantially directly couple the second surface of the substrate 510 to the first surface of first SMCM 520 for electrically coupling the first SMCM 820 to electrical connections (e.g., 511) in the substrate 510.

First interposer 530 has first and second opposing surfaces and includes a plurality of electrical connections (e.g., via or conductive path 531) extending between select portions of the first and second surfaces. In one embodiment, the electrical connections are provided as TSV structures. First interposer 530 is electrically coupled to second semiconductor structure 820 through interconnect structures 1550, 1550', 1550", 1550'''.

First superconducting semiconductor structure 540 (e.g., a single flux quantum (SFQ) chip) has first and second opposing surfaces and is electrically coupled to first interposer 530 through interconnect structures 1560, 1560', 1560", 1560'''. Second interposer 550 has first and second opposing surfaces and includes a plurality of electrical connections (e.g., via or conductive path 551) extending between select portions of the first and second surfaces. Second interposer 550 is electrically coupled to first SMCM 520 through interconnect structures 1570, 1570', 1570", 1570''', 1570'''', 1570'''''. Second interposer 550 is also electrically coupled to the first interposer 530 through a superconducting wire bond 1580. Superconducting wire bond 1580 includes one or more superconducting materials (e.g., Nb).

Second superconducting semiconductor structure 560 (e.g., a complementary metal-oxide-semiconductor (CMOS) structure) has first and second opposing surfaces and is electrically coupled to a first portion of second interposer 550 through interconnect structures 1590, 1590', 1590". Additionally, third superconducting semiconductor structure 570 (e.g., a complementary metal-oxide-semiconductor (CMOS) structure) has first and second opposing surfaces and is electrically coupled to a second portion of second interposer 550 through interconnect structures 1610, 1610', 1610".

Second SMCM 1510 has first and second opposing surfaces and is electrically coupled to second selected electrical connections in substrate 510 through a wire bond structure 1620. In particular, a first portion of wire bond structure 1620 is coupled to electrical connections on a second surface of second SMCM 1510, and a second opposing portion of wire bond structure 1620 is coupled to a second surface of interconnect pad 519 of substrate 510.

In embodiments, an array of microbumps (not shown) may also be disposed between the second surface of the substrate 510 and the first surface of second SMCM 1510 for electrically coupling the second SMCM 1510 to the one or more electrical connections (e.g., via structure 517) in the substrate 510. The array of microbumps may, for example, substantially directly couple the second surface of the substrate 510 to the first surface of second SMCM 1510 for electrically coupling the second SMCM 1510 to the electrical connections (e.g., 517) in the substrate 510.

The second SMCM 1510 may also be electrically coupled to first SMCM 520 through a superconducting wire bond 1630 which may be the same as or similar to superconducting wire bond 1580. In one aspect of the disclosure, with the superconducting wire bonds 1580, 1630, for example, it is possible to increase SMCM size without affecting SMCM yield. More particularly, the superconducting wire bonds 1580, 1630 between high density SMCMs 520, 1510 and/or interposers (or TSV substrates) 530, 550) will produce respective superconducting paths between the SMCMs and/or interposers for electrical coupling between chips. The addition of superconducting wire bonds between the SMCMs and/or interposers will extend superconducting, lossless (or substantially lossless) paths for the electrical coupling (or connection(s)).

In embodiments, the superconducting wirebonded SMCM 520, 1510 in the illustrated embodiment will function in a same or similar manner as a single large SMCM (i.e., 520+1510)). Thus, it is possible to replace a large SMCM with multiple small SMCMs by using superconducting wire bonds such as wire bonds 1580, 1630. As is known, the manufacturing yield of larger SMCMs is typically more difficult compared to smaller SMCMs having same line width, line space, pad pitch, etc. In the illustrated embodiment, superconducting wire bonds 1580, 1630 (which may be provided as ribbon bonds in some embodiments) are able to coupled multiple small SMCMs (here, 520, 1510), for example, to create a large SMCM. This is a 3D design approach to minimize the use of physical space, and increase functionality in cryogenic electronic packages (e.g., 500). Such approach may increase integration density, maximize superconducting paths and other considerations of cryogenic electronic packages, including improved yield, while still providing for the cryogenic electronic packages to have the functional components to be considered a cryogenic electronic package.

Returning now to a discussion of the various components of cryogenic electronic package 500, third interposer 1520 of cryogenic electronic package 500 has first and second opposing surfaces and includes a plurality of electrical connections (e.g., via or conductive path 1521) extending between select portions of the first and second surfaces. In one embodiment, the electrical connections are provided as TSV structures. Third interposer 1520 is electrically coupled to second SMCM 1510 through interconnect structures 1640, 1640', 1640", 1640'''.

Fourth superconducting semiconductor structure 1530 (e.g., a Qubit chip) has first and second opposing surfaces and is electrically coupled to third interposer 1520 through interconnect structures 1650, 1650', 1650", 1650'''.

In embodiments, each of the semiconductor structures (e.g., 530, 540) of cryogenic electronic package 500 has an associated package pitch and the interconnect structures (e.g., 1550, 1560) used to couple the semiconductor structures together have one or more characteristics (e.g., dimensions) selected based upon the package pitches. It follows that in embodiments in which the semiconductor structures of cryogenic electronic package 500 have a plurality of different package pitches, the cryogenic electronic package 500 may include a plurality of different interconnect structures. For example, third interposer 1520 may have a first package pitch and fourth superconducting semiconductor structure 1530 may have a second package pitch that is different from the first package pitch. The foregoing may, for example, result in the interconnect structures 1640, 1640', 1640", 1640''' used to couple third interposer 1520 to second SMCM 1510 have dimensions which are different from dimensions of the interconnect structures 1650, 1650', 1650", 1650''' used to couple fourth superconducting semiconductor structure to third interposer 1520.

Additionally, in embodiments cryogenic electronic package 500 includes a plurality of multi-die SOCs integrated into a single package (i.e., cryogenic electronic package 500). For example, first interposer 530 and first superconducting semiconductor structure 540 may take the form of a first multi-die SOC. Additionally, second interposer 550, second superconducting semiconductor structure 560 and third superconducting semiconductor structures 570 may take the form of a second multi-die SOC. Further, in third interposer 1520 and fourth superconducting semiconductor structure 1530 may take the form of a third multi-die SOC. The first multi-die SOC may be couple to the second multi-die SOC through superconducting wire bond 1580 and/or a first coupling path include first SMCM 520. Additionally, the second multi-die SOC may be coupled to the third multi-die SOC through a second coupling path including first SMCM 520, superconducting wire bond 1630 and second SMCM 1510.

In embodiments, superconducting wire bonds similar to superconducting wire bonds 1580, 1630 may be desirable for large scale integration of semiconductor structures into cryogenic electronic packages according to the disclosure. Superconducting wire bonds may, for example, increase a number of superconducting paths in cryogenic electronic packages according to the disclosure.

The addition or inclusion of superconducting wire bonds (or ribbons) (e.g., 1580, 1630) in cryogenic electronic packages according to the disclosure may provide for several advantages. For example, referring briefly back to cryogenic electronic package 1200 shown in FIG. 2A, in one embodiment superconducting semiconductor structure 140 and superconducting semiconductor structure 1240 are electrically coupled with each other through a coupling path including first SMCM 1210. More particularly, the coupling path may include interconnect structures 170-170", second SMCM 130, wire bonds 281, 282, first interposer 120, interconnect structures 150-150"", first SMCM 1210, interconnect structures 1250-1250"", second interposer 1220, wire bonds 1270-1270"", third SMCM 1230, and interconnect structures 1270-1270"" Now if we add one or more superconducting wire and/or ribbon bonds to electrically couple first interposer 120 and second interposer 1220, a new, reduced coupling path may be formed between superconducting semiconductor structure 140 and superconducting semiconductor structure 1240. In particular, the new coupling path may include interconnect structures 170-170"", second SMCM 130, wire bonds 281, 282, first interposer 120, the superconducting wire and/or ribbon bonds, second interposer 1220, wire bonds 1281, 1282, third SMCM 1230, and interconnect structures 1270-1270"". The new, reduced coupling path may, for example, reduce signal losses which may occur between superconducting semiconductor structure 140 and superconducting semiconductor structure 1240.

In order to accommodate large number of superconducting chips or semiconductor structures, a large scale integration approach (such as that shown in FIG. 5) was developed to enable circuit functionalities and complexities required for quantum computing. An example advantage of the interconnect structures (e.g., microbumps) used in cryogenic electronic package 500, for example, is the ability to attach multiple, multilayer, superconducting chip having different sizes on large SMCMs (e.g., 520 and/or 1510).

Figure 6:
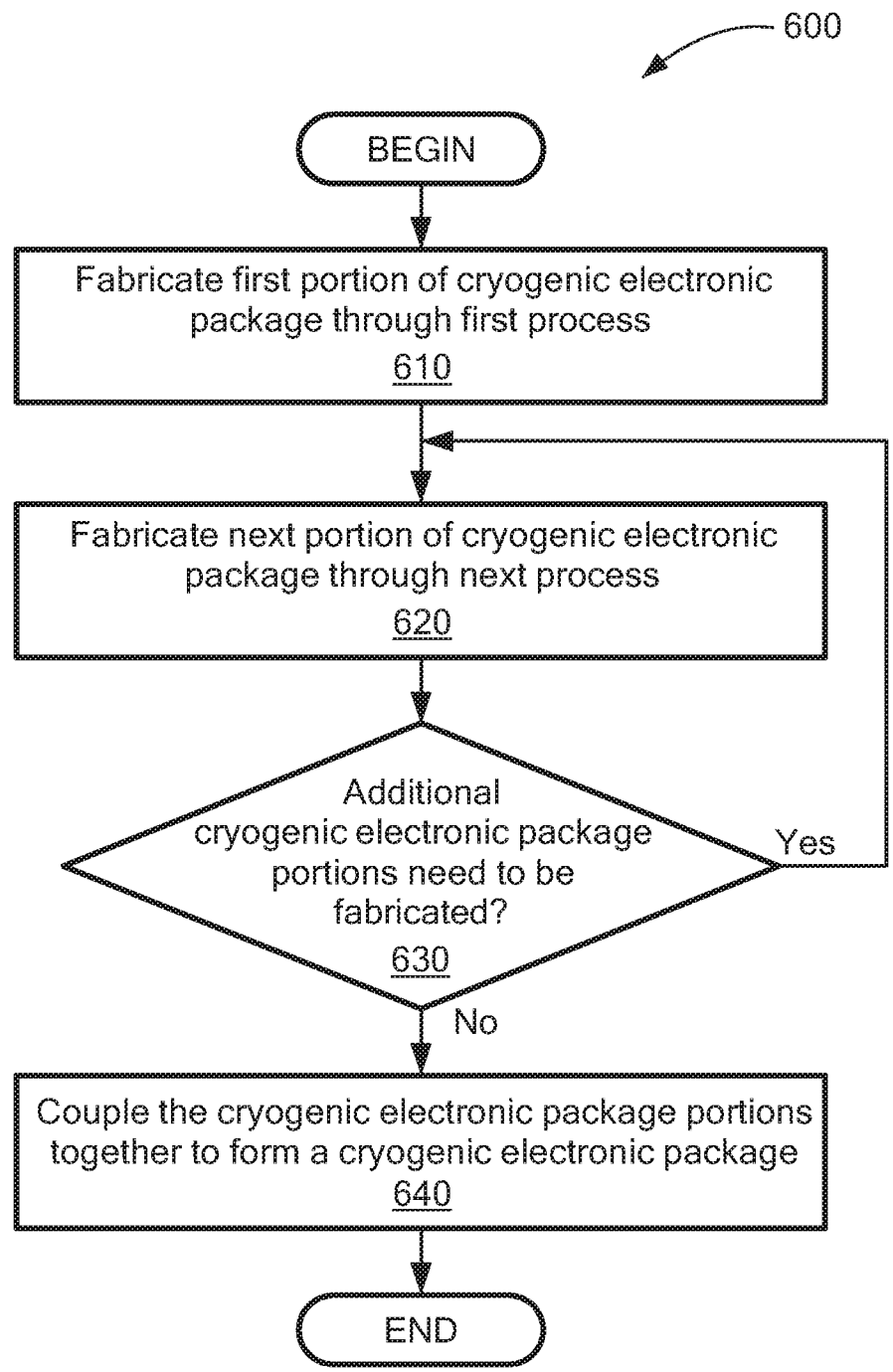
FIG. 6 is a flowchart illustrating an example method for fabricating a cryogenic electronic package in accordance with an embodiment of the disclosure.

Referring to FIG. 6, a flowchart (or flow diagram) illustrating an example method 600 for fabricating a cryogenic electronic package (e.g., cryogenic electronic package 400, shown in FIG. 4) according to the concepts, systems, circuits and techniques sought to be protected herein is shown. The method 600 may, for example, be implemented in semiconductor manufacturing equipment used for fabricating cryogenic electronic packages.

Rectangular elements (typified by element 610 in FIG. 6), as may be referred to herein as "processing blocks," may represent computer software instructions or groups of instructions (e.g., as may be executed by a processor of semiconductor manufacturing equipment). Diamond shaped elements (typified by element 630 in FIG. 6), as may be referred to herein as "decision blocks," represent computer software instructions, or groups of instructions, which affect the execution of the computer software instructions represented by the processing blocks. The processing blocks and decision blocks can represent steps performed by functionally equivalent circuits such as a digital signal processor circuit or an application specific integrated circuit (ASIC).

The flow diagram does not depict the syntax of any particular programming language. Rather, the flow diagram illustrates the functional information one of ordinary skill in the art requires to fabricate interconnect structures or to generate computer software to perform the processing required to fabricate the interconnect structures. It should be noted that many routine program elements, such as initialization of loops and variables and the use of temporary variables are not shown. It will be appreciated by those of ordinary skill in the art that unless otherwise indicated herein, the particular sequence of blocks described is illustrative only and can be varied. Thus, unless otherwise stated, the blocks described below are unordered; meaning that, when possible, the blocks can be performed in any convenient or desirable order including that sequential blocks can be performed simultaneously and vice versa.

As will become apparent from the description herein below, an example result of the method 600 may be a cryogenic electronic package fabricated in a reduced number of steps compared to a cryogenic electronic package fabricated using conventional techniques. Additionally, an example result of the method 600 may be the capability to replace and/or repair one or more portions (e.g., semiconductor structures) of cryogenic electronic packages according to the disclosure. In embodiments, method 600 is a method in which one or more sections or portions of a cryogenic electronic package are assembled substantially simultaneously (i.e., in parallel) and then joined together.

As illustrated in FIG. 6, an example method 600 for fabricating a cryogenic electronic package (e.g., 400, shown in FIG. 4) according to an embodiment of the disclosure begins at block 610. At block 610, a first portion of the cryogenic electronic package (e.g., 1410, shown in FIG. 4) is fabricated through a first process.

The first process may include providing a first SMCM (e.g., 420, shown in FIG. 4) having first and second opposing surfaces. Additionally, the first process may include providing a superconducting interposer (e.g., 430, shown in FIG. 4) having first and second opposing surfaces. Further, the first process may include coupling a surface (e.g., the first surface) of the interposer to a surface (e.g., the second surface) of the first SMCM.

At block 620, a next portion of the cryogenic electronic package (e.g., 1420, shown in FIG. 4) is fabricated through a next process.

The next process (e.g., a second process) may include providing a second SMCM (e.g., 440, shown in FIG. 4) having first and second opposing surfaces. Additionally, the next process may include providing a superconducting semiconductor structure (e.g., 450, shown in FIG. 4) having first and second opposing surfaces. Further, the next process may include coupling a selected surface (e.g., the first surface) of the superconducting semiconductor structure to a selected surface (e.g., the second surface) of the second SMCM.

At block 630, it is determined whether any additional cryogenic package portions need to be fabricated. If it is determined that no additional cryogenic package portions need to be fabricated, the method 600 proceeds to a block 640. Alternatively, if it is determined that additional cryogenic package portions need to be fabricated, the method 600 returns to block 620 and blocks 620 and 630 are repeated until it is determined that no additional cryogenic package portions need to be fabricated. For example, if it is determined that additional cryogenic package portions need to be fabricated, a next portion (e.g., a third portion) of the cryogenic electronic package may be fabricated through a next process (e.g., a third process). The next process may include providing a substrate (e.g., 410, shown in FIG. 4) having first and second opposing surfaces.

A number of next processes performed in method 600 may, for example, be selected based upon a number cryogenic electronic package portions (e.g., two or more portions) to be provided in the cryogenic electronic package.

In embodiments, the first process and selected ones of the next processes (e.g., the second process) are performed substantially simultaneously. In other words, the first cryogenic electronic package portion may be fabricated at a substantially same time as selected ones of the next cryogenic electronic package portions. Additionally, in embodiments the first process and each of the next processes (e.g., second, third, etc. processes) are performed substantially simultaneously.

Referring now to block 640, at block 640 the cryogenic electronic package portions are coupled together to form a cryogenic electronic package (e.g., 400, shown in FIG. 4). In embodiments in which the cryogenic electronic package includes two portions, for example, at block 640 a second portion of the cryogenic electronic package may be coupled to a first portion of the cryogenic electronic package to form the cryogenic electronic package.

Additionally, in embodiments in which the cryogenic electronic package includes three portions, at block 640 a third portion of cryogenic electronic package may be further coupled to at least one of the first and second portions of the cryogenic electronic package to form the cryogenic electronic package. For example, the third portion of cryogenic electronic package may be coupled to the first portion of the cryogenic electronic package.

In embodiments, coupling the second portion of the cryogenic electronic package to the first portion of the cryogenic electronic package may include: disposing an adhesive layer (e.g., 480, shown in FIG. 4) between the first surface of the second SMCM (e.g., 440, shown in FIG. 4) and the second surface of the interposer (e.g., 430, shown in FIG. 4). Coupling the second portion of the cryogenic electronic package to the first portion of the cryogenic electronic package may also include: coupling the first surface of the second SMCM to the second surface of the interposer using the adhesive layer.

Additionally, in embodiments coupling the third portion of the cryogenic electronic package to the first portion of the cryogenic electronic package may include: disposing an adhesive layer (e.g., 460, shown in FIG. 4) between the first surface of the first SMCM (e.g., 420, shown in FIG. 4) and the second surface of the substrate (e.g., 410, shown in FIG. 4). Coupling the third portion of the cryogenic electronic package to the first portion of the cryogenic electronic package may also include: coupling the first surface of the first SMCM to the second surface of the substrate using the adhesive layer.

Upon completion of block 640, the method 600 may end. The method 600 ending may, for example, be indicative of completion of the fabrication process of the cryogenic electronic package (e.g., 400, shown in FIG. 4). The method 600 may be repeated (e.g., in response to a processor in the semiconductor manufacturing equipment receiving or generating a control signal) for fabricating additional cryogenic electronic packages, for example, in embodiments in which a cryogenic assembly including a plurality of cryogenic electronic packages is being fabricated. Additionally, in embodiments one or more portions of the method 600 may be repeated for adding additional cryogenic electronic package portions (e.g., fourth, fifth, sixth, etc. portions) to the cryogenic electronic package (e.g., 400, shown in FIG. 4) fabricated using method 600.

In one aspect of the disclosure, method 600 provides for a cryogenic electronic package fabricated in a reduced number of steps compared to conventional cryogenic electronic packages.

As described above and as will be appreciated by those of ordinary skill in the art, embodiments of the disclosure herein may be configured as a system, method, or combination thereof. Accordingly, embodiments of the present disclosure may be comprised of various means including hardware, software, firmware or any combination thereof.

Having described preferred embodiments, which serve to illustrate various concepts, structures and techniques, which are the subject of this patent, it will now become apparent to those of ordinary skill in the art that other embodiments incorporating these concepts, structures and techniques may be used. Additionally, elements of different embodiments described herein may be combined to form other embodiments not specifically set forth above.

Accordingly, it is submitted that that scope of the patent should not be limited to the described embodiments but rather should be limited only by the spirit and scope of the following claims.

What is claimed is:

1. A cryogenic electronic package, comprising:
a first superconducting multi-chip module (SMCM) having first and second opposing surfaces;
a first superconducting interposer having first and second opposing surfaces, wherein the first surface of the first superconducting interposer is disposed over and coupled to the second surface of the first SMCM;
a second SMCM having first and second opposing surfaces, wherein the first surface of the second SMCM is disposed over and coupled to the second surface of the first superconducting interposer; and
a first superconducting semiconductor structure having first and second opposing surfaces, wherein the first surface of the first superconducting semiconductor structure is disposed over and coupled to the second surface of the second SMCM, and the second SMCM and the first superconducting semiconductor structure are electrically coupled to the first SMCM through the first superconducting interposer.

2. The cryogenic electronic package of claim 1 further comprising:
a second superconducting interposer having first and second opposing surfaces, wherein the first surface of the second superconducting interposer is disposed over and coupled to the second surface of the first SMCM;

a third SMCM having first and second opposing surfaces, wherein the first surface of the third SMCM is disposed over and coupled to the second surface of the second superconducting interposer; and a second superconducting semiconductor structure having first and second opposing surfaces, wherein the first surface of the second superconducting semiconductor structure is disposed over and coupled to the second surface of the third SMCM, and the third SMCM and the second superconducting semiconductor are electrically coupled to the first SMCM through the second superconducting interposer, wherein the cryogenic electronic package creates a maximum possible superconducting path between the first and second superconducting semiconductor structures when the first and second superconducting semiconductor structures are electrically coupled with each other through the second SMCM, the first superconducting interposer, the first SMCM, the second superconducting interposer and the third SMCM.

3. The cryogenic electronic package of claim 2 further comprising:

one or more first interconnect structures disposed between the second surface of the first SMCM and the first surface of the first superconducting interposer and coupled to form one or more electrical connections between the first superconducting interposer and the first SMCM; and one or more second interconnect structures disposed between the second surface of the second SMCM and the first surface of the first superconducting semiconductor structure and coupled to form one or more electrical connections between the first superconducting semiconductor structure and the second SMCM, wherein the first interconnect structures have first dimensions and a first pad pitch, and the second interconnect structures have second dimensions and a second pad pitch, wherein the second dimensions are substantially less than the first dimensions, and the second pad pitch is substantially less than the first pad pitch.

4. The cryogenic electronic package of claim 3 wherein each of the first and second interconnect structures includes a plurality of interconnect sections, and at least one of the interconnect sections includes a superconducting and/or a partially superconducting material.

5. The cryogenic electronic package of claim 4 wherein the plurality of interconnect sections includes three interconnect sections, and at least two of the interconnect sections include a plurality of conductive layers, each of the plurality of conductive layers including a respective metal or alloy material or combination of materials that is different from other ones of the plurality of conductive layers, and each of the plurality of conductive layers having a respective melting point that is different from other ones of the plurality of conductive layers.

6. The cryogenic electronic package of claim 3 wherein the first SMCM includes one or more interconnect pads disposed or otherwise provided on at least the second surface of the first SMCM, and the first superconducting interposer includes one or more interconnect pads disposed or otherwise provide on at least the first surface of the first superconducting interposer, wherein the first interconnect structures are electrically coupled to respective ones of the interconnect pads of the first SMCM and the first superconducting interposer.

7. The cryogenic electronic package of claim 6 wherein at least one of the interconnect pads of the first SMCM and the first superconducting interposer includes a superconducting and/or a partially superconducting material.

8. The cryogenic electronic package of claim 6 wherein the first superconducting interposer further includes one or more conventional and/or superconducting and/or partially superconducting metal through via structures, each of the through via structures including a first pad interconnect, a second pad interconnect and a through via, wherein the first and second pad interconnects each extend from selected portions of the first surface of the first superconducting interposer to selected portions of the second surface of the first superconducting interposer, and the through via is disposed or otherwise provided in a cavity formed between the first and second pad interconnects, wherein the through via structures are electrically coupled to respective ones of the interconnect pads of the first superconducting interposer.

9. The cryogenic electronic package of claim 3 wherein the second MCM includes one or more interconnect pads disposed on at least the second surface of the second SMCM, and the first superconducting semiconductor structure includes one or more interconnect pads disposed on at least the first surface of the first superconducting semiconductor structure, wherein the second interconnect structures are electrically coupled to respective ones of the interconnect pads of the second SMCM and the first superconducting semiconductor structure.

10. The cryogenic electronic package of claim 9 wherein at least one of the interconnect pads of the second SMCM and the first superconducting semiconductor structure includes a superconducting and/or a partially superconducting material.

11. The cryogenic electronic package of claim 3 further comprising:

a first adhesive layer disposed between the second surface of the first superconducting interposer and the first surface of the second SMCM and coupled to form one or more electrical connections between the second SMCM and the first superconducting interposer.

12. The cryogenic electronic package of claim 11 further comprising:

one or more wire and/or ribbon and/or spring bonding structures, wherein at least one of the bonding structures has a first portion electrically coupled to the second surface of the first superconducting interposer, and a second opposing portion electrically coupled to the second surface of the second SMCM to form one or more electrical connections between the second SMCM and the first superconducting interposer.

13. The cryogenic electronic package of claim 2 further comprising:

a via joining layer disposed between the second surface of the first SMCM and the first surface of the first superconducting interposer, the via joining layer having first and second opposing surfaces and including a plurality of conductive structures extending between selected portions of the first and second surfaces, wherein the plurality of conductive structures are coupled to form one or more electrical connections between the first SMCM and the first superconducting interposer, and the conductive structures include one or more thermally conductive vias.

14. The cryogenic electronic package of claim 2 wherein the second SMCM further includes a complementary metal-oxide-semiconductor (CMOS) and/or optical and/or photonics chip.

15. The cryogenic electronic package of claim 2, further comprising:
 a substrate having first and second opposing surfaces; and
 an adhesive material or layer disposed between the second surface of the substrate and the first surface of the first SMCM, the adhesive layer coupled to form one or more electrical connections between the substrate and the first SMCM.

16. A method of fabricating a cryogenic electronic package, the method comprising:
 fabricating a first portion of the cryogenic electronic package through a first process, comprising:
  providing a first superconducting multi-chip module (SMCM) having first and second opposing surfaces;
  providing a superconducting interposer having first and second opposing surfaces; and
  coupling the first surface of the superconducting interposer to the second surface of the first SMCM;
 fabricating a second portion of the cryogenic electronic package through a second process, comprising:
  providing a second SMCM having first and second opposing surfaces;
  providing a superconducting semiconductor structure having first and second opposing surfaces; and
  coupling the first surface of the superconducting semiconductor structure to the second surface of the second SMCM; and
 coupling the second portion of the cryogenic electronic package to the first portion of the cryogenic electronic package.

17. The method of claim 16 wherein coupling the second portion of the cryogenic electronic package to the first portion of the cryogenic electronic package comprises:
 disposing an adhesive layer between the first surface of the second SMCM and the second surface of the superconducting interposer; and
 coupling the first surface of the second SMCM to the second surface of the superconducting interposer using the adhesive layer, wherein the first and second processes are performed substantially simultaneously.

18. The method of claim 16 further comprising:
 fabricating a third portion of the cryogenic electronic package through a third process, comprising:
  providing a substrate having first and second opposing surfaces; and
 coupling the third portion of the cryogenic electronic package to the first portion of the cryogenic electronic package.

19. The method of claim 18 wherein coupling the third portion of the cryogenic electronic package to the first portion of the cryogenic electronic package comprises:
 disposing an adhesive layer between the first surface of the first SMCM and the second surface of the substrate; and
 coupling the first surface of the first SMCM to the second surface of the substrate using the adhesive layer, wherein the first, second and third processes are performed substantially simultaneously.

* * * * *